US012167599B2

(12) United States Patent
Clampitt et al.

(10) Patent No.: US 12,167,599 B2
(45) Date of Patent: Dec. 10, 2024

(54) MEMORY DEVICE INCLUDING MULTIPLE DECKS OF MEMORY CELLS AND PILLARS EXTENDING THROUGH THE DECKS

(71) Applicant: Lodestar Licensing Group, LLC, Evanston, IL (US)

(72) Inventors: Darwin A. Clampitt, Wilder, ID (US); Shawn D. Lyonsmith, Boise, ID (US); Matthew J. King, Boise, ID (US); Lisa M. Clampitt, Boise, ID (US); John Hopkins, Meridian, ID (US); Kevin Y. Titus, Meridian, ID (US); Indra V. Chary, Boise, ID (US); Martin Jared Barclay, Middleton, ID (US); Anilkumar Chandolu, Boise, ID (US); Pavithra Natarajan, Santa Clara, CA (US); Roger W. Lindsay, Boise, ID (US)

( * ) Notice: Subject to any disclaimer, the term of this patent is extended or adjusted under 35 U.S.C. 154(b) by 0 days.

(21) Appl. No.: 18/083,991

(22) Filed: Dec. 19, 2022

(65) Prior Publication Data
US 2023/0117100 A1      Apr. 20, 2023

Related U.S. Application Data

(62) Division of application No. 17/008,130, filed on Aug. 31, 2020, now Pat. No. 11,532,638.

(51) Int. Cl.
*H10B 43/27* (2023.01)
*G11C 16/04* (2006.01)
(Continued)

(52) U.S. Cl.
CPC ....... *H10B 43/27* (2023.02); *H01L 21/02617* (2013.01); *H01L 21/67063* (2013.01);
(Continued)

(58) Field of Classification Search
CPC ......... H01L 21/02617; H01L 21/67063; H01L 23/5226; H10L 23/528; G11C 16/0483;
(Continued)

(56) References Cited

U.S. PATENT DOCUMENTS 9,691,781 B1 *   6/2017  Nishikawa ............ H10B 43/50
10,103,169 B1 * 10/2018  Ge ........................ H10B 43/10
(Continued)

FOREIGN PATENT DOCUMENTS

WO    WO-2022047331 A1    3/2022

OTHER PUBLICATIONS

"International Application Serial No. PCT/US2021/048281, International Search Report mailed Dec. 10, 2021", 3 pgs.
(Continued)

*Primary Examiner* — Galina G Yushina
(74) *Attorney, Agent, or Firm* — Fletcher Yoder, P.C.

(57) ABSTRACT

Some embodiments include apparatuses and methods of forming the apparatuses. One of the apparatuses includes a first deck located over a substrate, and a second deck located over the first deck, and pillars extending through the first and second decks. The first deck includes first memory cells, first control gates associated with the first memory cells, and first conductive paths coupled to the first control gates. The second conductive paths include second conductive pads located on a first level of the apparatus over the substrate. The second deck includes second memory cells, second control gates associated with the second memory cells, and second conductive paths coupled to the second control gates. The second conductive paths include second conductive pads located on a second level of the apparatus. The first and second conductive pads having lengths in a direction perpendicular to a direction from the first deck to the second deck.

17 Claims, 72 Drawing Sheets

(51) Int. Cl.
  *H01L 21/02* (2006.01)
  *H01L 21/67* (2006.01)
  *H01L 23/522* (2006.01)
  *H01L 23/528* (2006.01)
  *H10B 43/10* (2023.01)
  *H10B 51/20* (2023.01)

(52) U.S. Cl.
  CPC ........ *H01L 23/5226* (2013.01); *H01L 23/528* (2013.01); *H10B 43/10* (2023.02); *H10B 51/20* (2023.02); *G11C 16/0483* (2013.01)

(58) Field of Classification Search
  CPC ........ H10B 43/27; H10B 43/10; H10B 51/20; H10B 41/27; H10B 43/50; H10B 41/50

See application file for complete search history.

(56) References Cited

U.S. PATENT DOCUMENTS

| | | | |
|---|---|---|---|
| 10,181,442 B1* | 1/2019 | Watanabe | H01L 23/5283 |
| 2011/0284943 A1* | 11/2011 | Hwang | H10B 43/27 |
| | | | 257/314 |
| 2016/0133644 A1* | 5/2016 | Lee | H10B 41/27 |
| | | | 257/314 |
| 2017/0365298 A1 | 12/2017 | Tanzawa | |
| 2019/0189632 A1* | 6/2019 | Lee | H10B 43/35 |
| 2019/0326218 A1 | 10/2019 | Chen | |
| 2019/0393240 A1 | 12/2019 | Kim et al. | |
| 2020/0295033 A1 | 9/2020 | Sakamoto et al. | |
| 2022/0068956 A1 | 3/2022 | Clampitt et al. | |

OTHER PUBLICATIONS

"International Application Serial No. PCT/US2021/048281, Written Opinion mailed Dec. 10, 2021", 7 pgs.

* cited by examiner

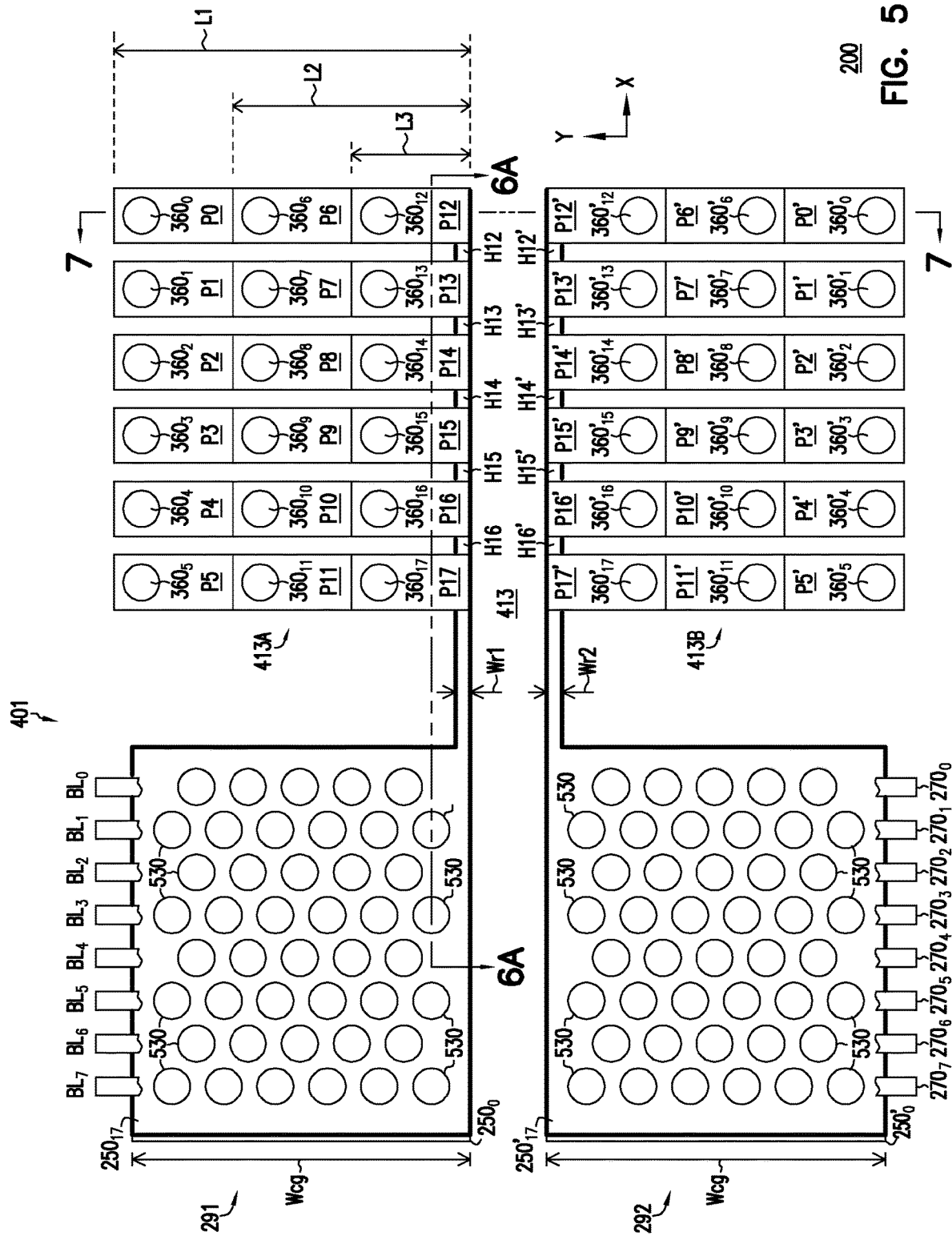

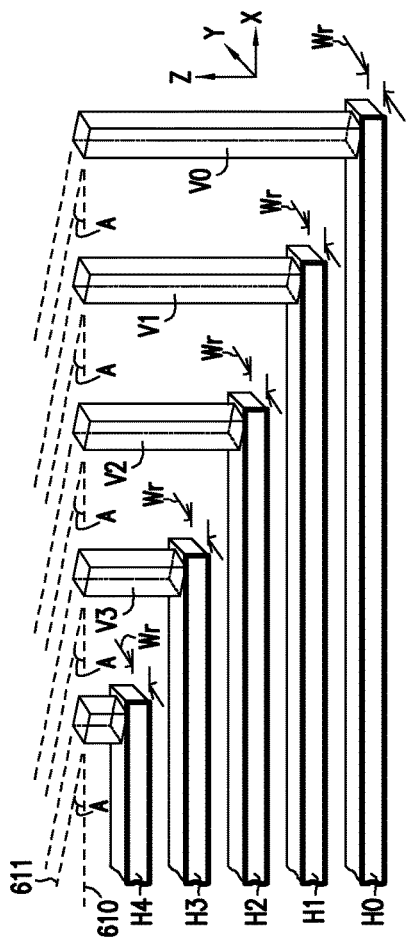
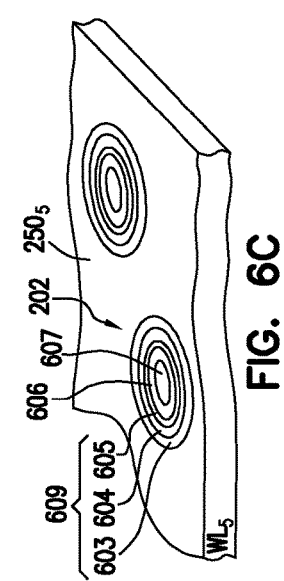
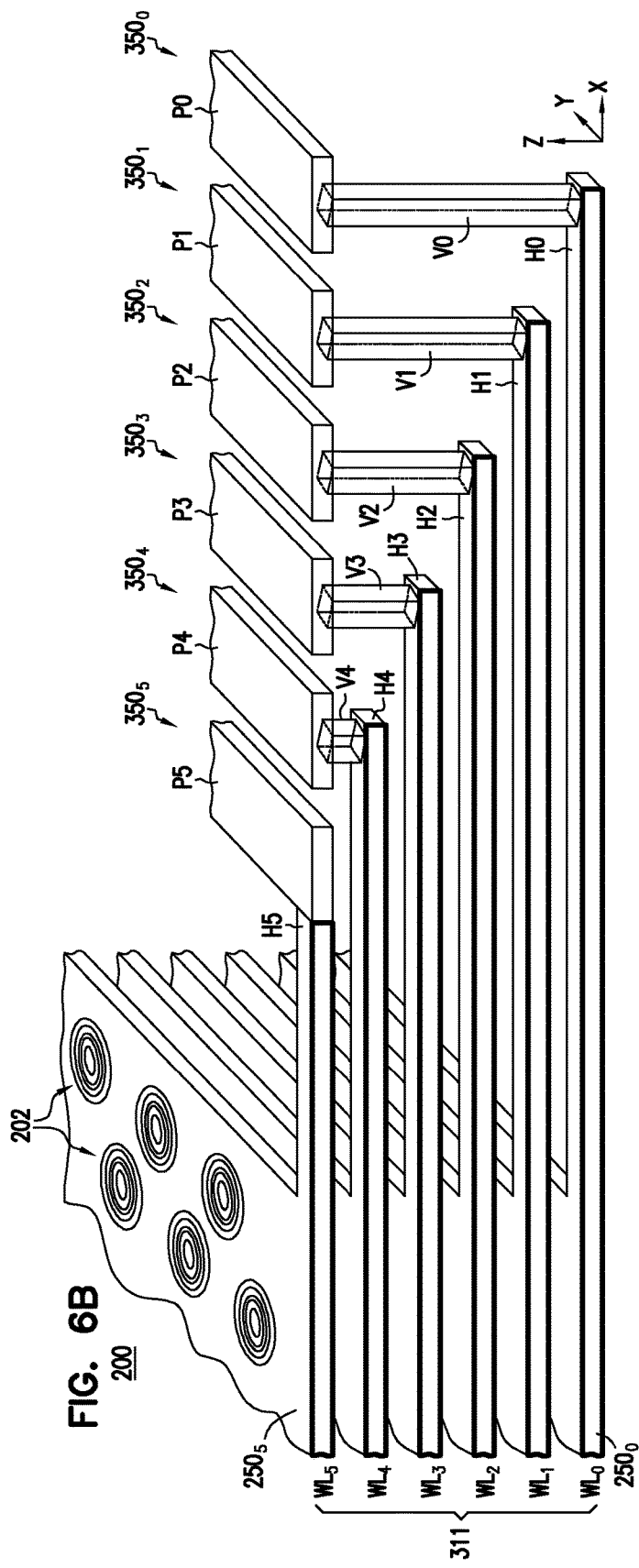
FIG. 6D
FIG. 6C
FIG. 6B

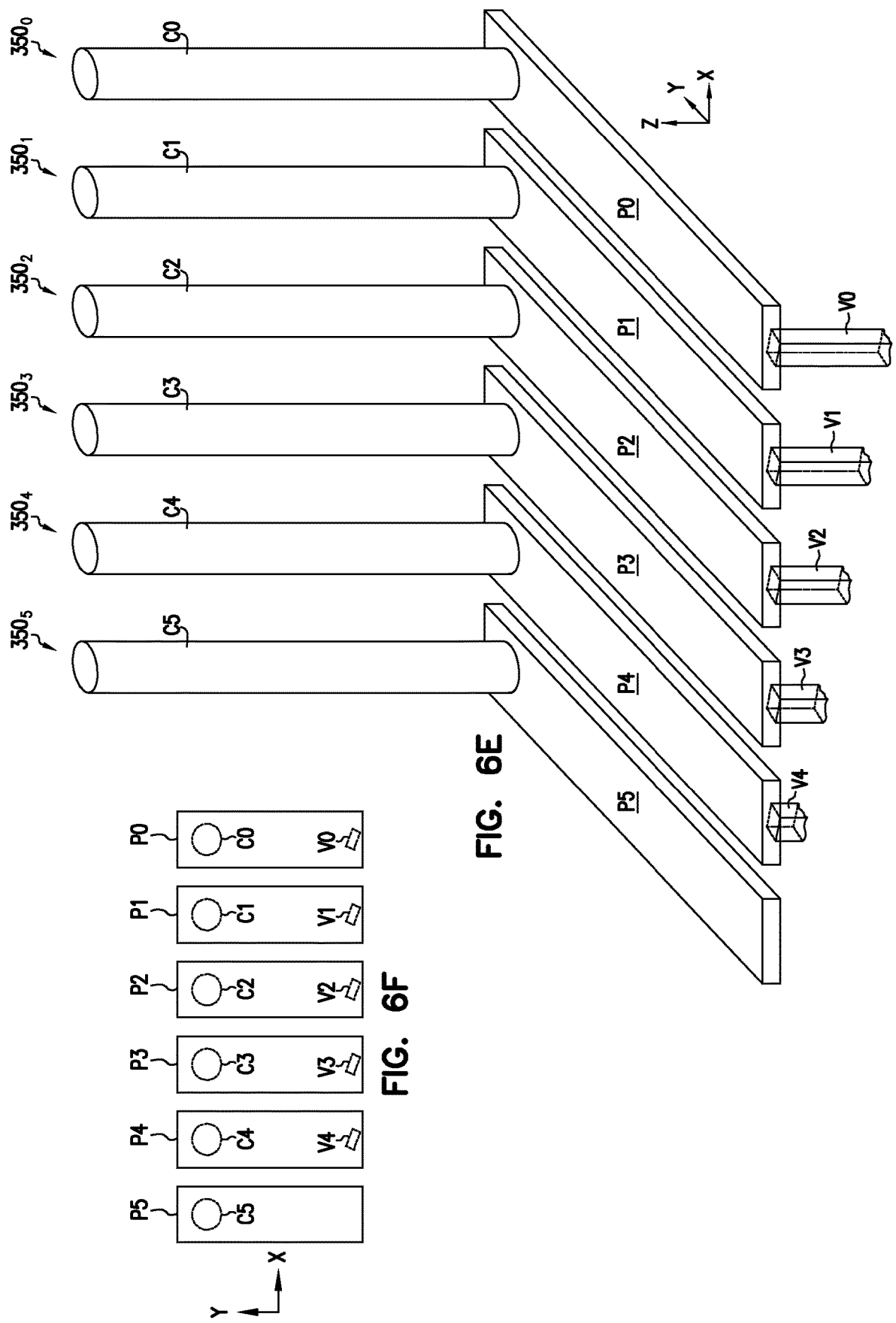

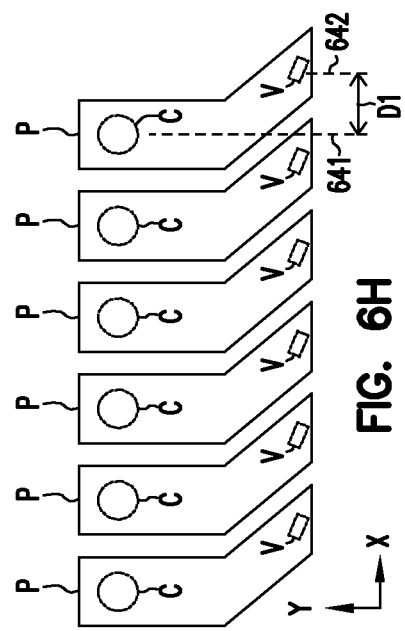
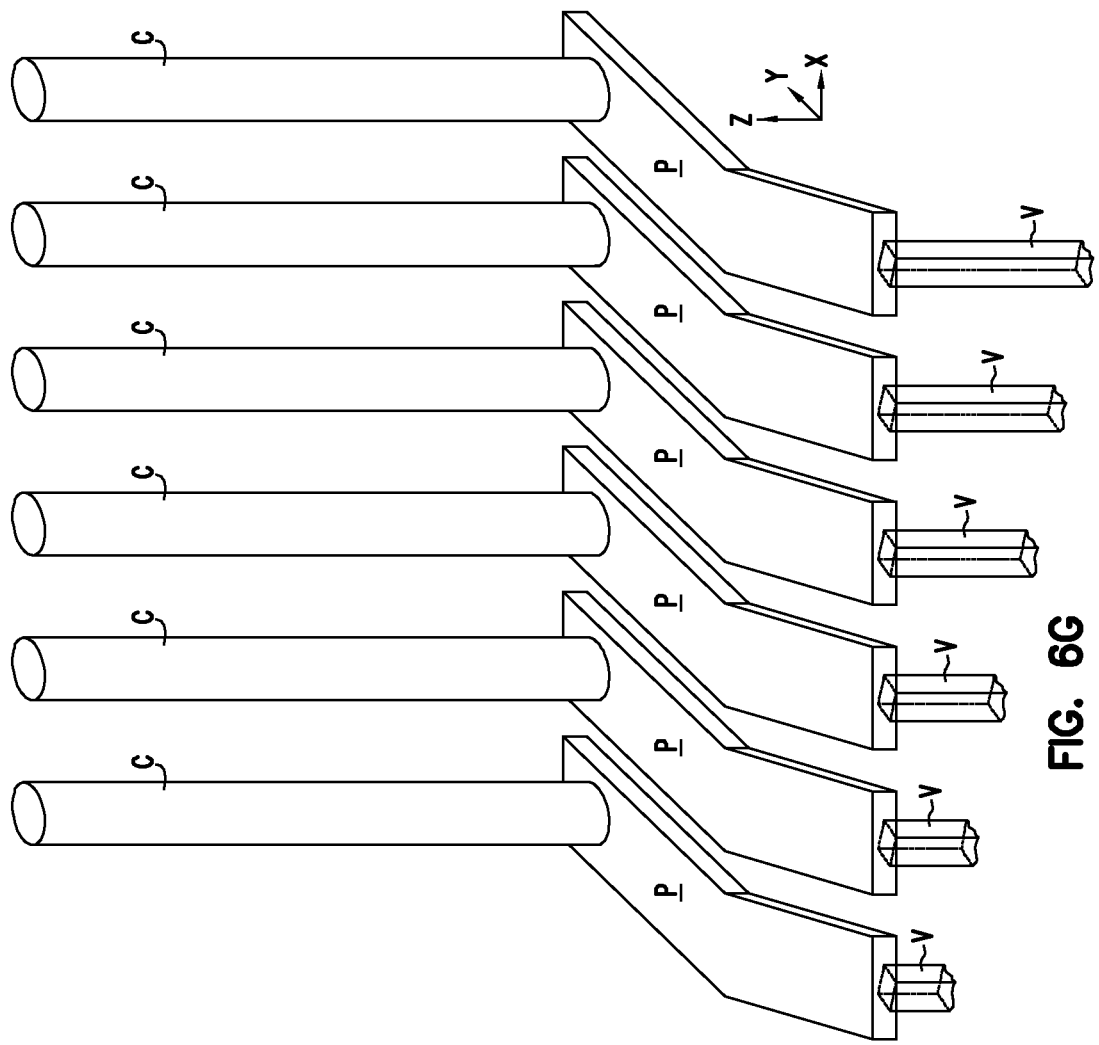

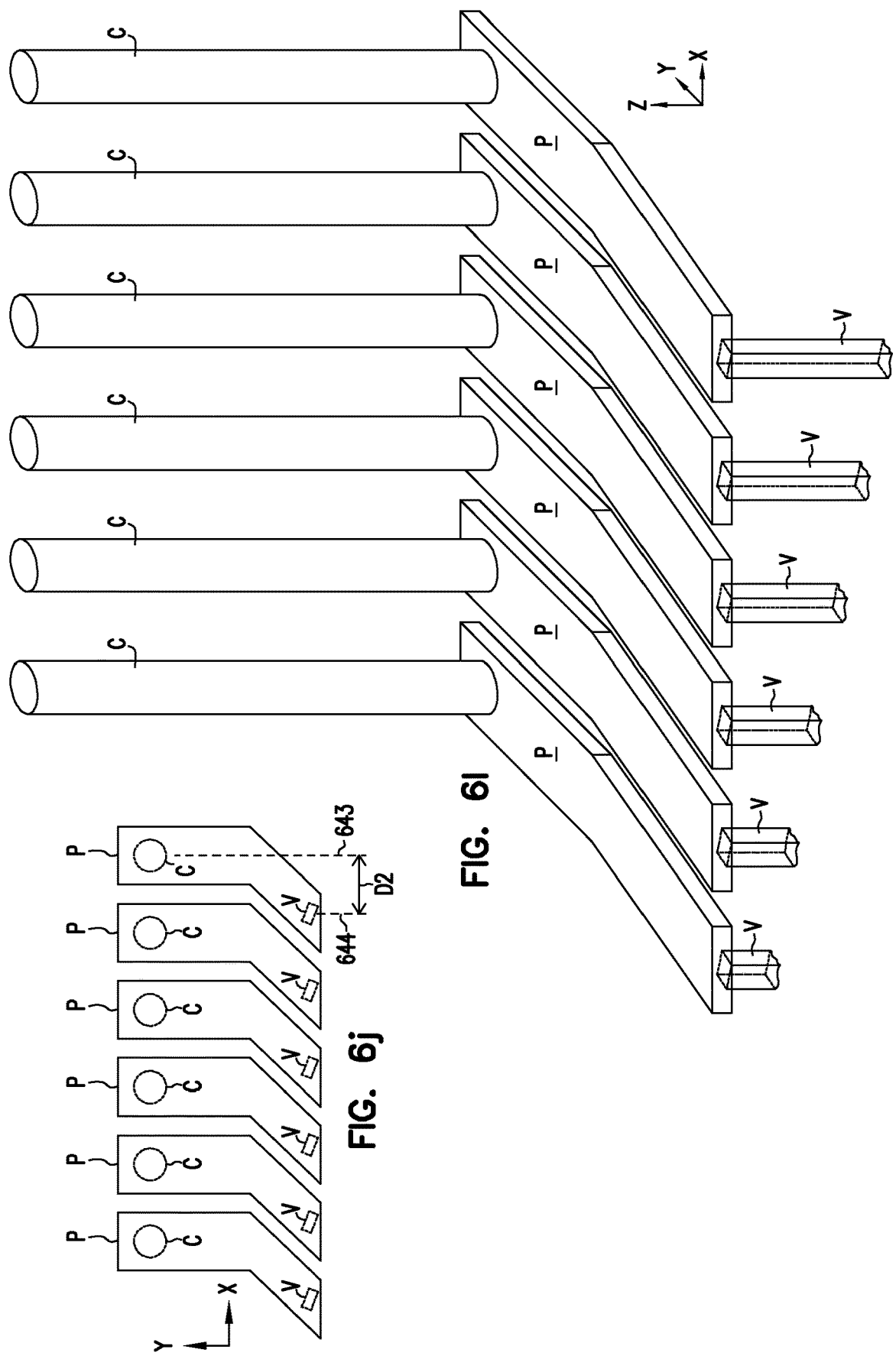

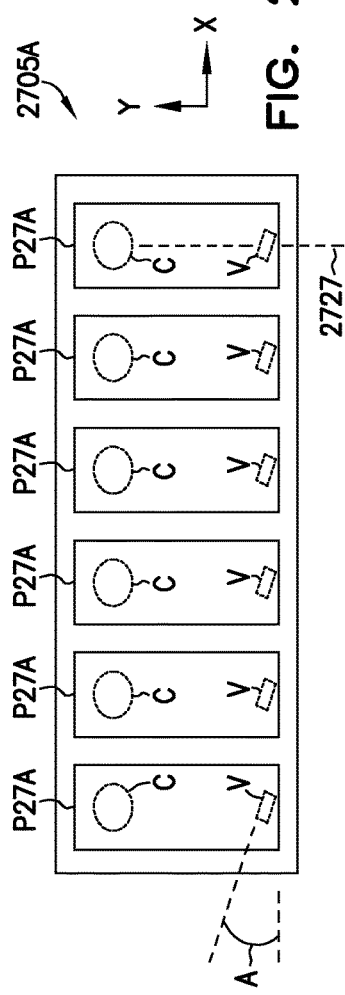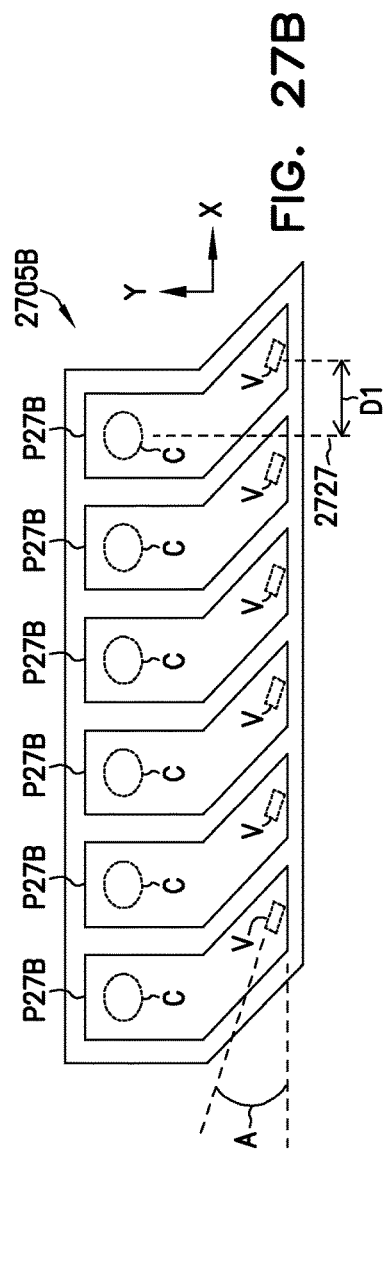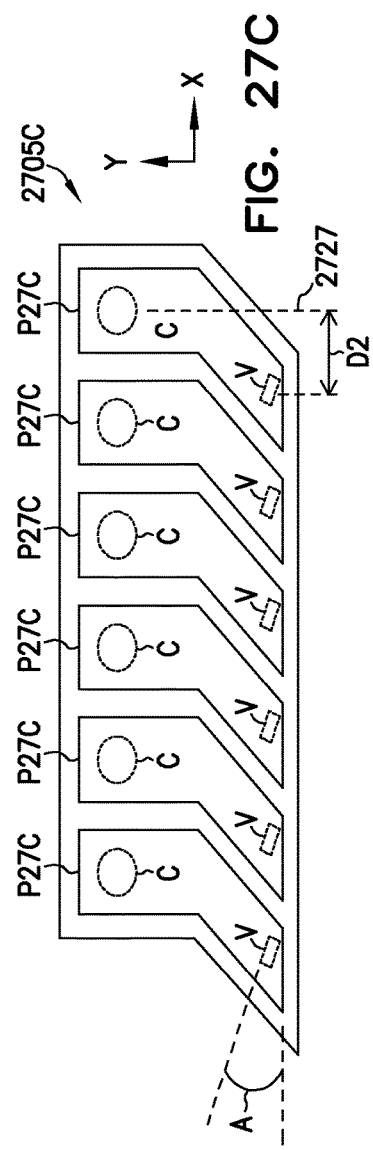

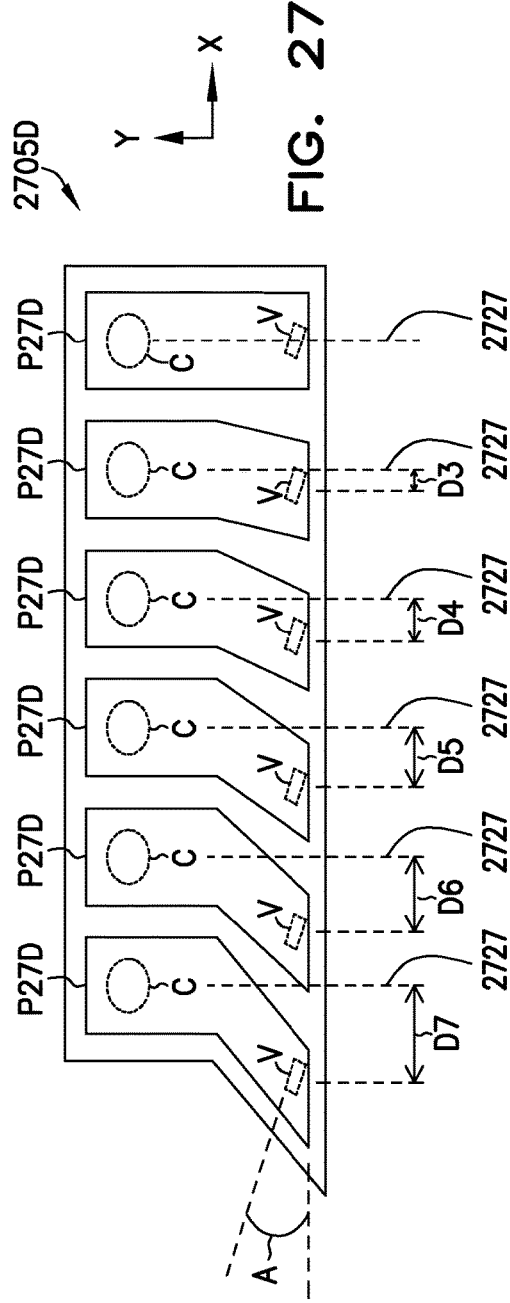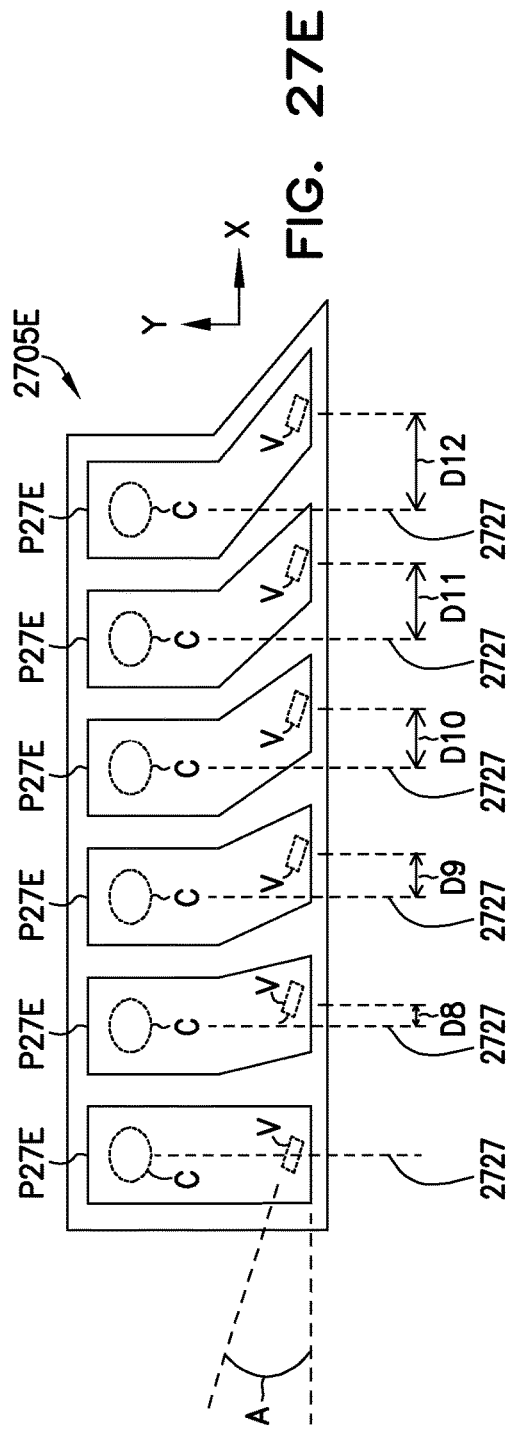

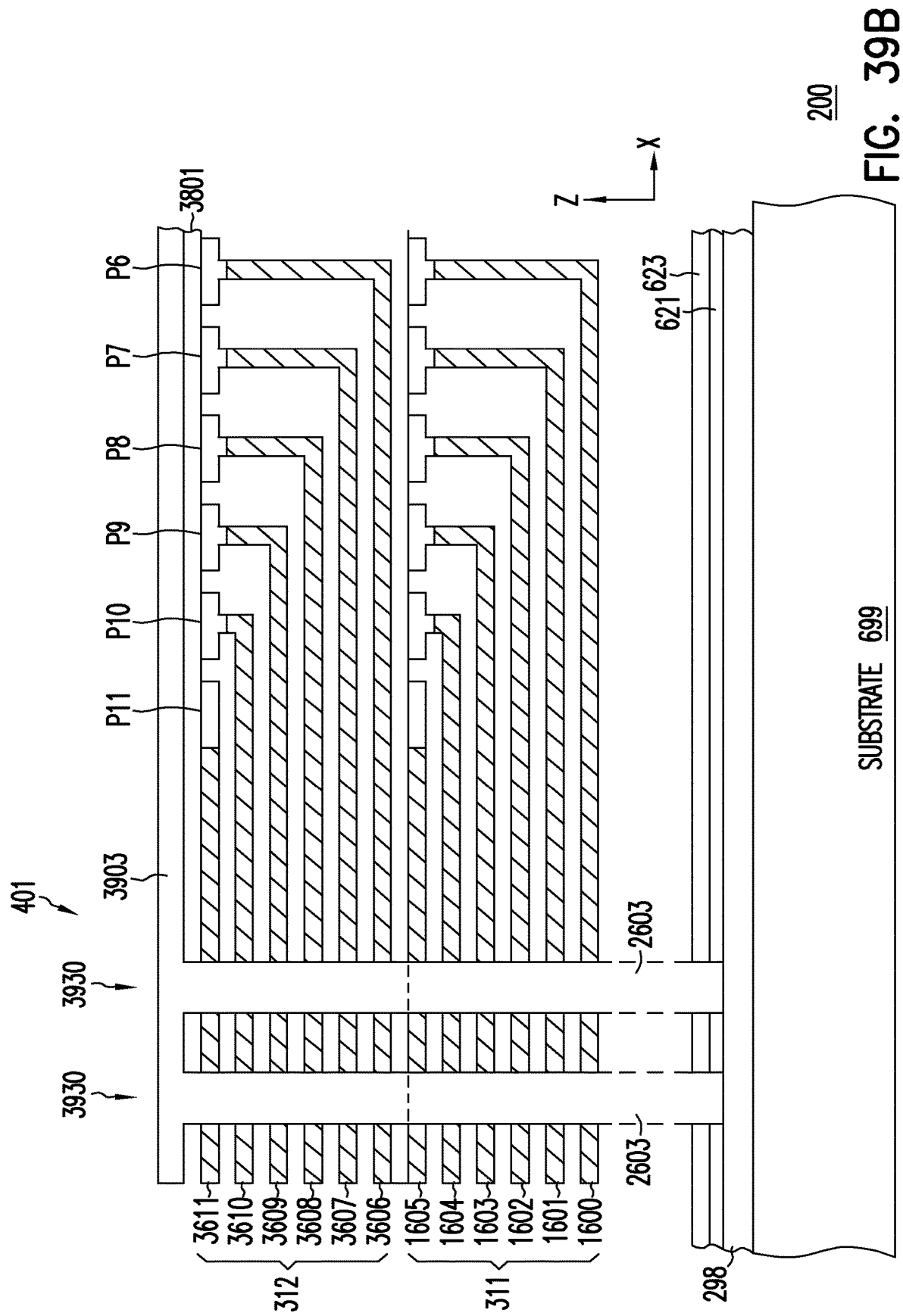

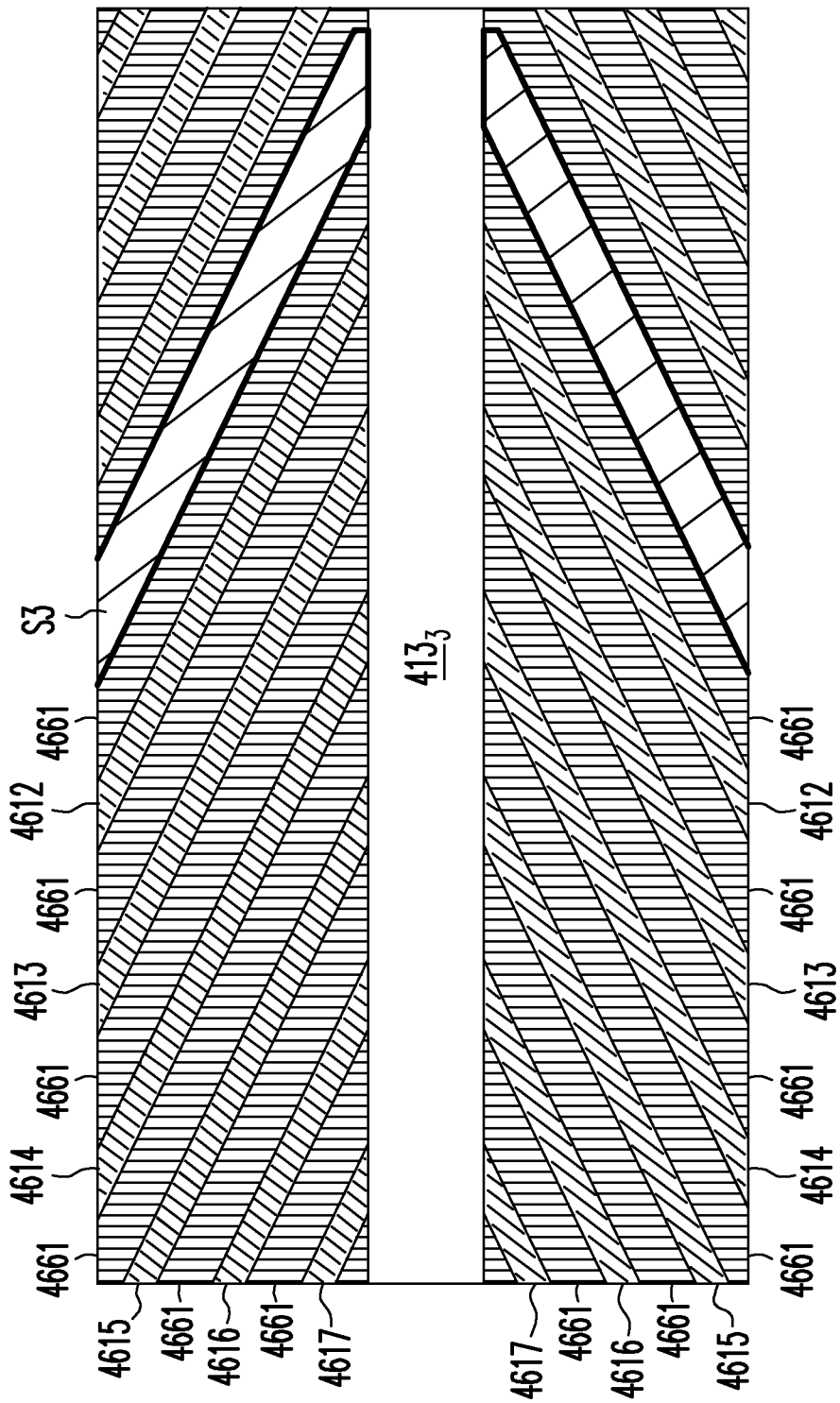

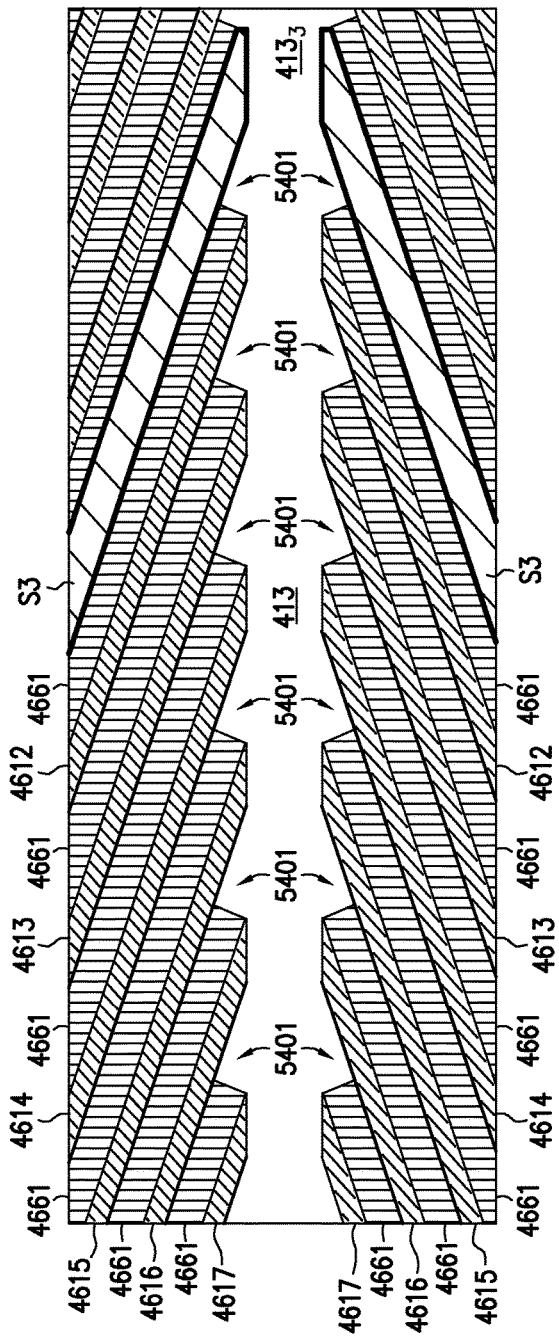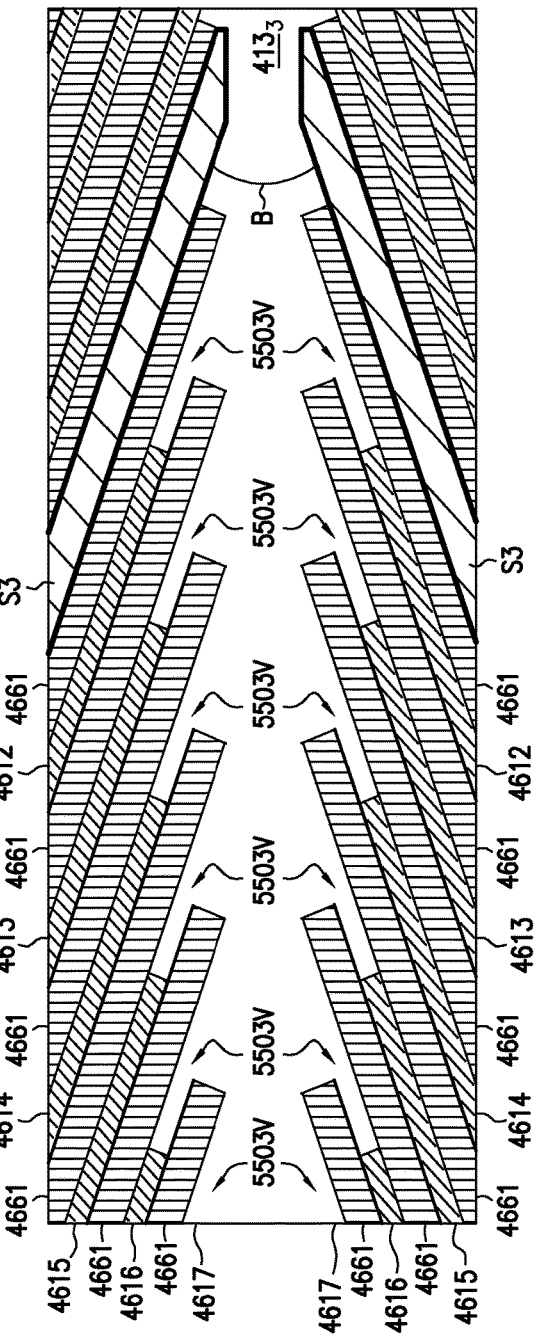

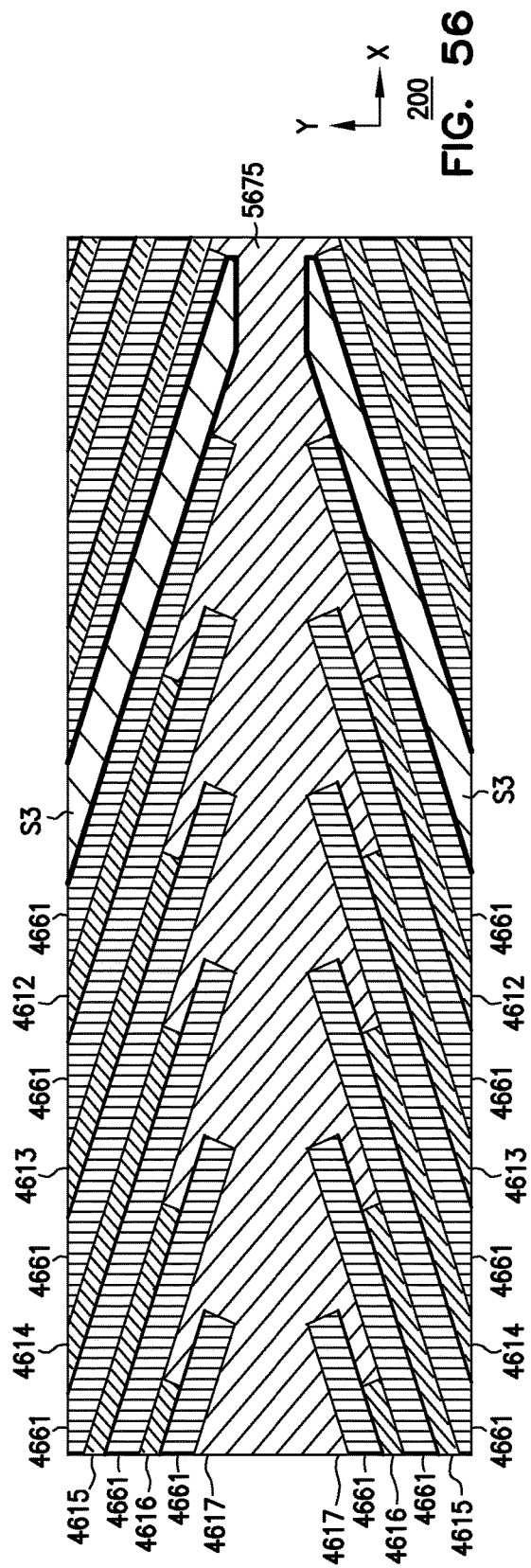
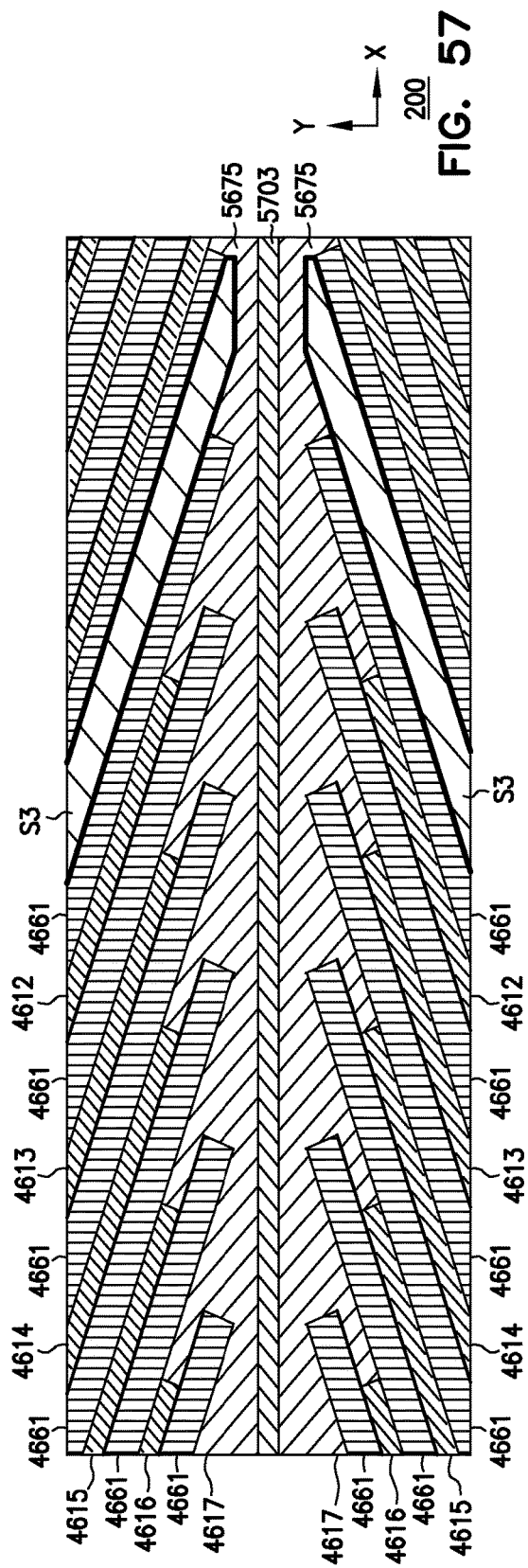

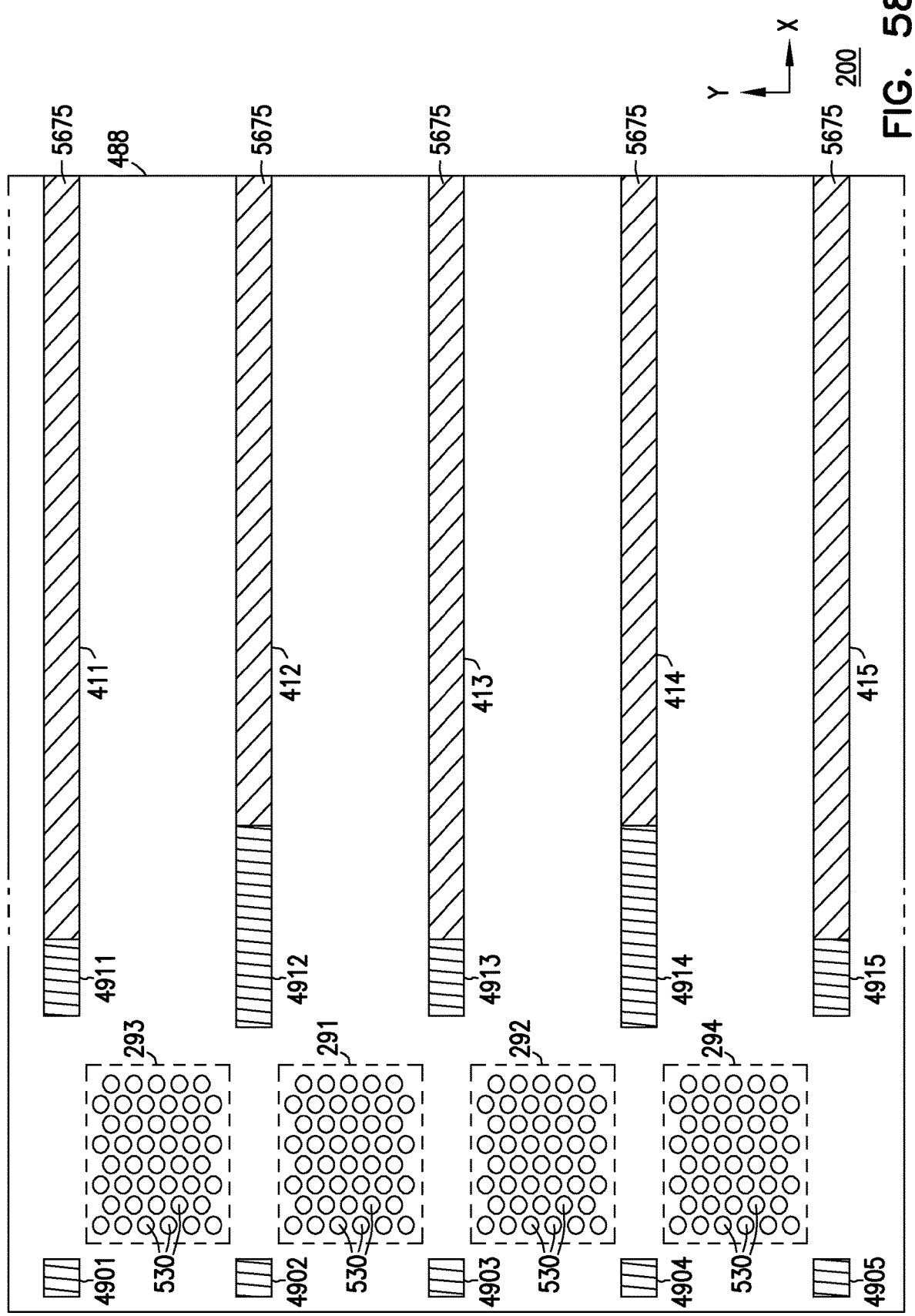

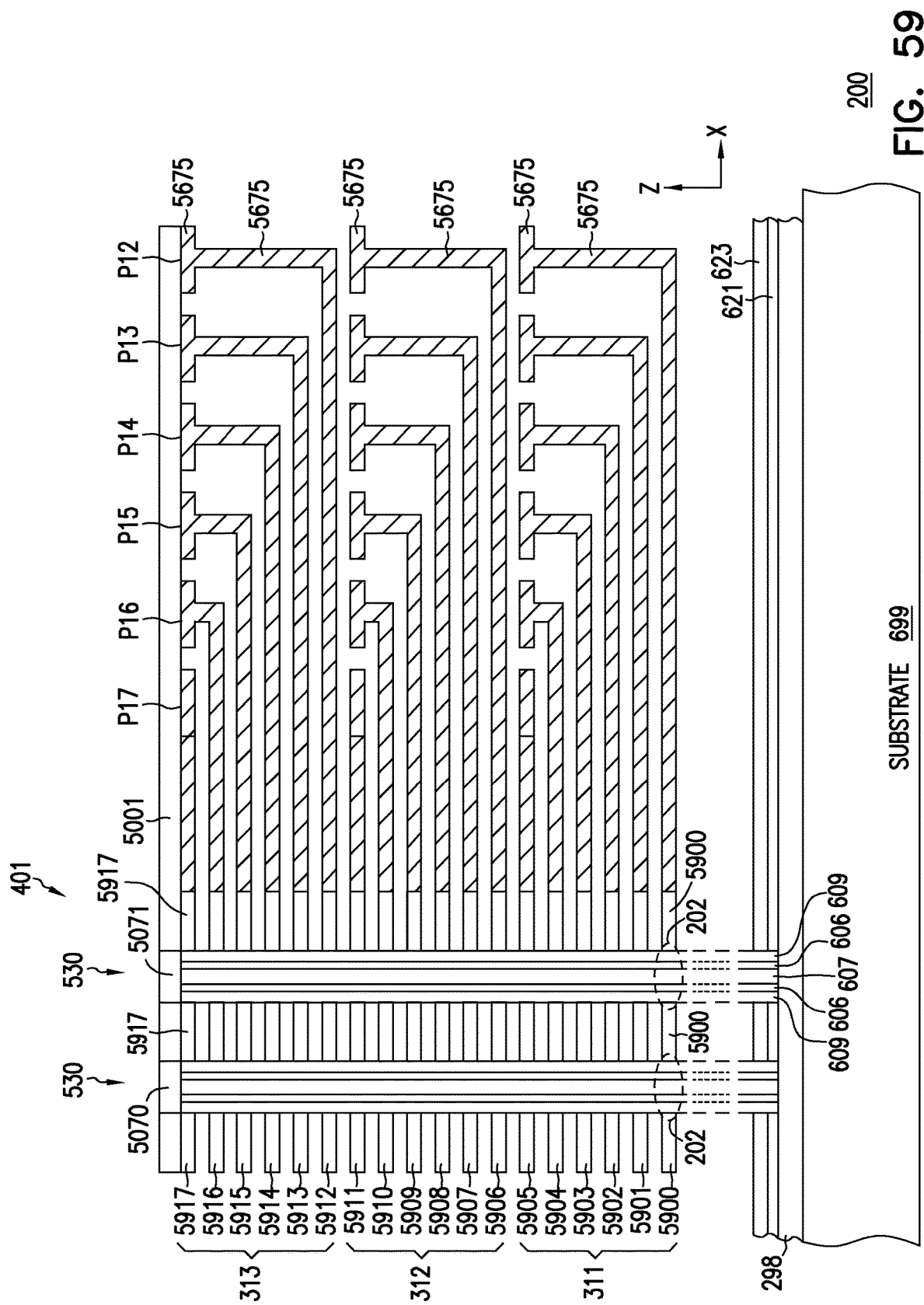

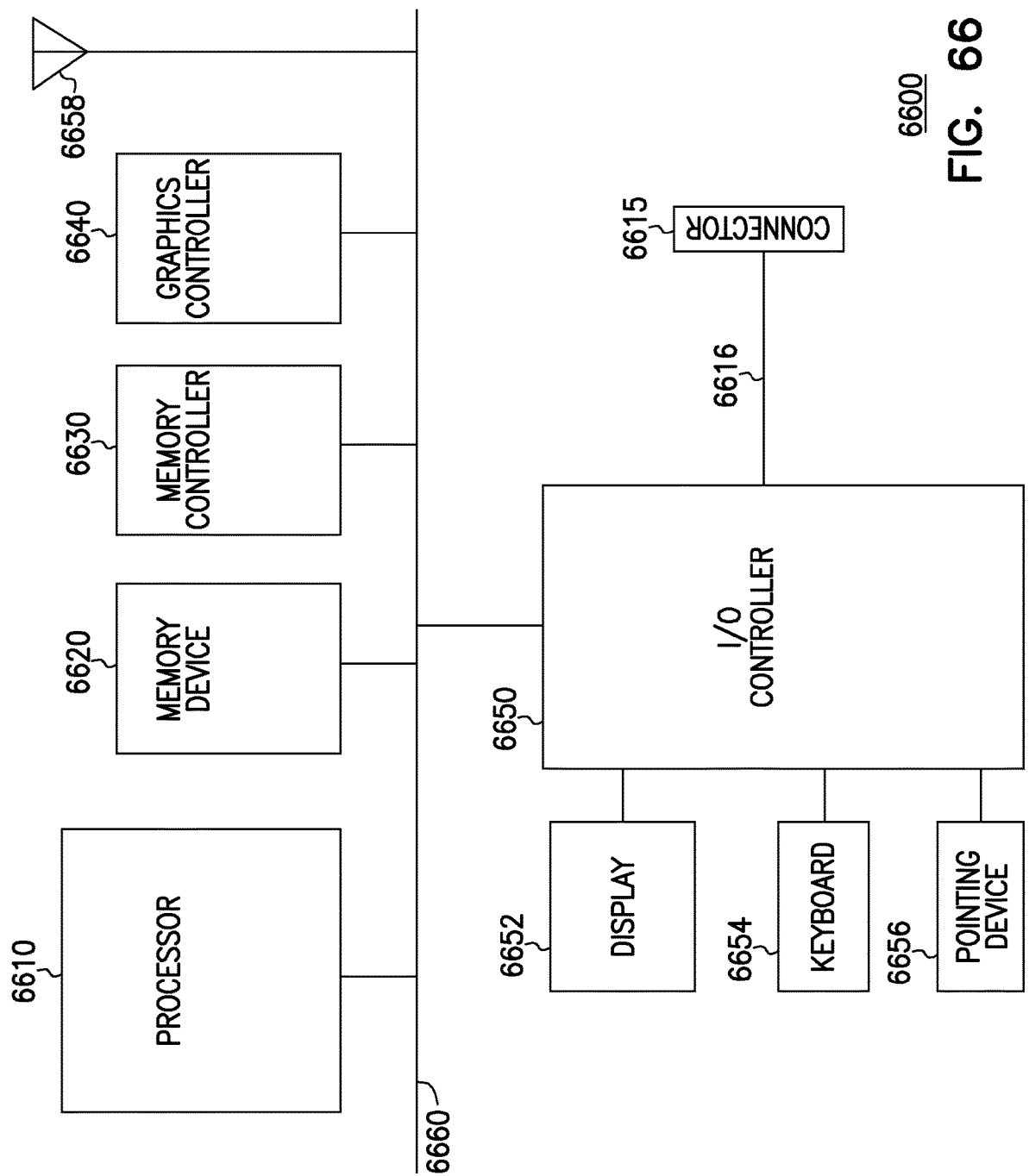

US 12,167,599 B2

MEMORY DEVICE INCLUDING MULTIPLE DECKS OF MEMORY CELLS AND PILLARS EXTENDING THROUGH THE DECKS

PRIORITY APPLICATION

This application is a divisional of U.S. application Ser. No. 17/008,130, filed Aug. 31, 2020, which is incorporated herein by reference in its entirety.

FIELD

Embodiments described herein relate to memory devices including multi-deck non-volatile memory devices.

BACKGROUND

Memory devices are widely used in computers and many other electronic items. A memory device often has memory cells for storing information. The higher the memory cell density, the more information can be stored. A memory device normally has control gates associated with the memory cells to control access to the memory cells. The memory device also has conductive paths and other structures to provide electrical connections between the control gates and other circuitry in the memory device. In some memory devices, the memory cells are stacked in many levels over a semiconductor substrate of the memory device. As demand for memory cell density increases, many conventional techniques aim to build a relatively large number of levels of stacked memory cells for a given area. However, forming conductive paths and other structures in a memory device to accommodate such a large number of levels of stacked memory cells using the conventional techniques can sometimes be difficult or unachievable.

BRIEF DESCRIPTION OF THE DRAWINGS

FIG. 5 shows an enlarged portion of a top view of a memory array portion of the memory device of FIG. 4 including conductive pads and horizontal conductive rails coupled to control gates of respective blocks in of the memory device, according to some embodiments described herein.

FIG. 6A through FIG. 6F show different views of a portion of the memory device of FIG. 5, according to some embodiments described herein.

FIG. 6G and FIG. 6H show an alternative structure for conductive pads of the memory device of FIG. 6A, according to some embodiments described herein.

FIG. 6I and FIG. 6J show another alternative structure for conductive pads of the memory device of FIG. 6A, according to some embodiments described herein.

FIGS. 12 through 32 show different views of structures during processes of forming a first deck of the memory device of FIG. 2 through FIG. 11, including structures of conductive paths in the first deck, according to some embodiments of the invention.

FIG. 43 through 65 show different views of structures during processes of forming a third deck of the memory device of FIG. 2 through FIG. 11, including structures of conductive paths in the third deck, according to some embodiments of the invention.

FIG. 66 shows a system including a memory device, according to some embodiments described herein.

DETAILED DESCRIPTION

The techniques described herein include a memory device that includes decks of memory cells. The decks are stacked one over another over a semiconductor substrate. The memory device also includes pillars going through the stacked decks. The memory device has conductive paths and other structures coupled to the respective control gates of the decks. The techniques described herein also provide ways to form the conductive paths and can be scalable, such that the number of decks in the memory device may not be limited by the structures of conductive paths in the memory device. Therefore, the memory device described herein can have a relatively high number of decks for a given device, resulting in a relatively higher memory cell density. Other improvements and benefits are discussed below with reference to the description of FIG. 1 through FIG. 66.

Figure 1:
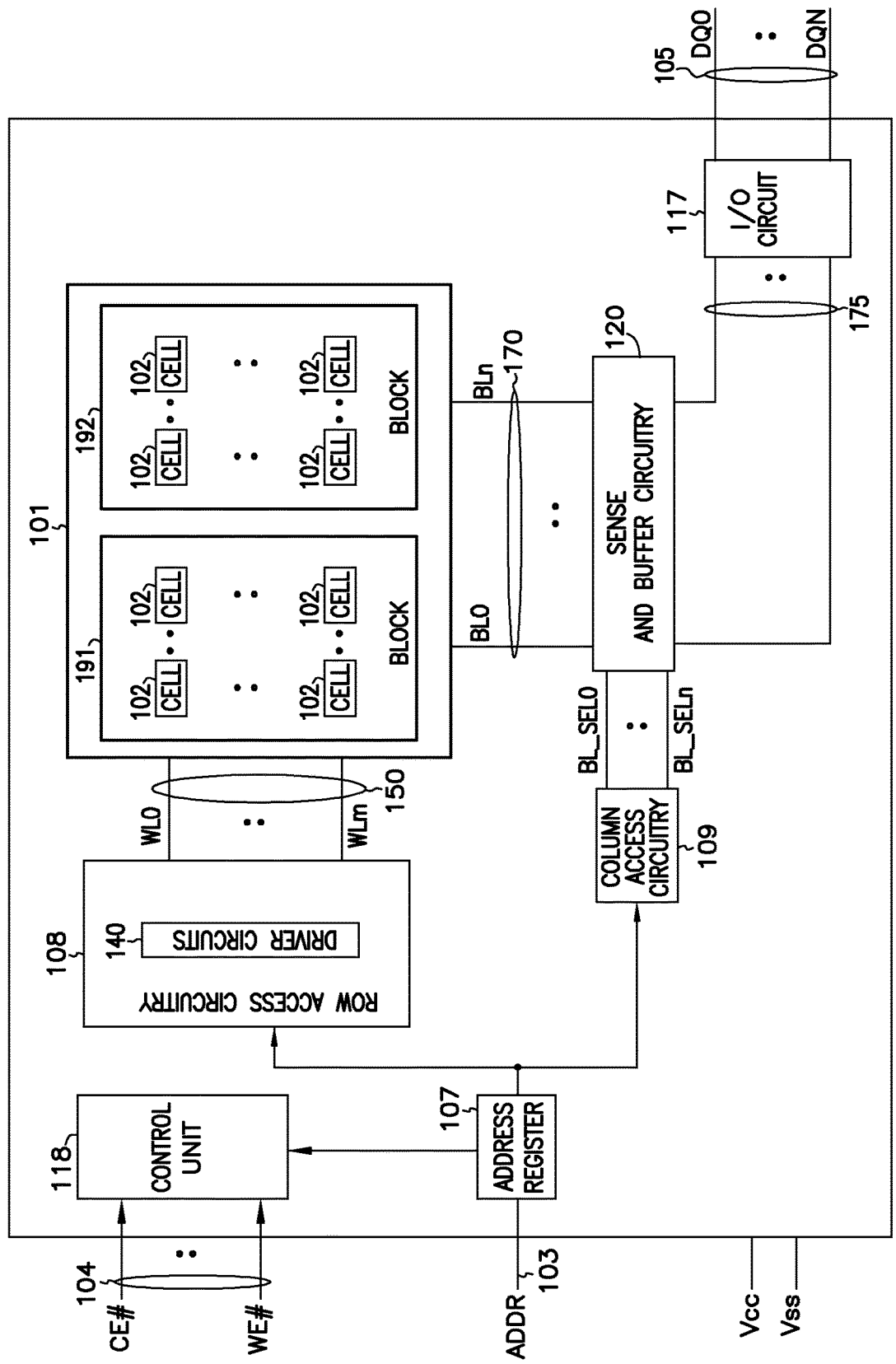
FIG. 1 shows an apparatus in the form of a memory device, according to some embodiments described herein.

FIG. 1 shows an apparatus in the form of a memory device 100, according to some embodiments described herein. Memory device 100 can include a memory array (or multiple memory arrays) 101 containing memory cells 102 arranged in blocks (blocks of memory cells), such as blocks 191 and 192. In the physical structure of memory device 100, memory cells 102 can be arranged vertically (e.g., stacked one over another) over a substrate (e.g., a semiconductor substrate) of memory device 100. FIG. 1 shows memory device 100 having two blocks 191 and 192 as an example. Memory device 100 can have more than two blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks 191 and 192 and data lines 170 to selectively exchange information (e.g., data) with memory cells 102.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks 191 and 192 are to be accessed during a memory operation. Memory device 100 can include drivers (driver circuits) 140, which can be part of row access circuitry 108. Drivers 140 can operate (e.g., operate as switches) to form (or not to form) conductive paths (e.g., current paths) between nodes providing voltages and respective access lines 150 during operations of memory device 100.

Memory device 100 can perform a read operation to read (e.g., sense) information (e.g., previously stored information) from memory cells 102 of blocks 191 and 192, or a write (e.g., programming) operation to store (e.g., program) information in memory cells 102 of blocks 191 and 192. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks 191 and 192.

Memory device 100 can include a control unit 118 that can be configured to control memory operations of memory device 100 based on control signals on lines 104. Examples of the control signals on lines 104 include one or more clock signals and other signals (e.g., a chip-enable signal CE #, a write-enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that may cause memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks 191 and 192 and provide the value of the information to lines (e.g., global data lines) 175. Sense and buffer circuitry 120 can also be configured to use signals on lines 175 to determine the value of information to be stored (e.g., programmed) in memory cells 102 of blocks 190 and 191 (e.g., during a write operation) based on the values (e.g., voltage values) of signals on lines 175 (e.g., during a write operation).

Memory device 100 can include input/output (I/O) circuitry 117 to exchange information between memory cells 102 of blocks 191 and 192 and lines (e.g., I/O lines) 105. Signals DQ0 through DQN on lines 105 can represent information read from or stored in memory cells 102 of blocks 191 and 192. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive Random Access Memory (RAM) device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 66.

Figure 2:
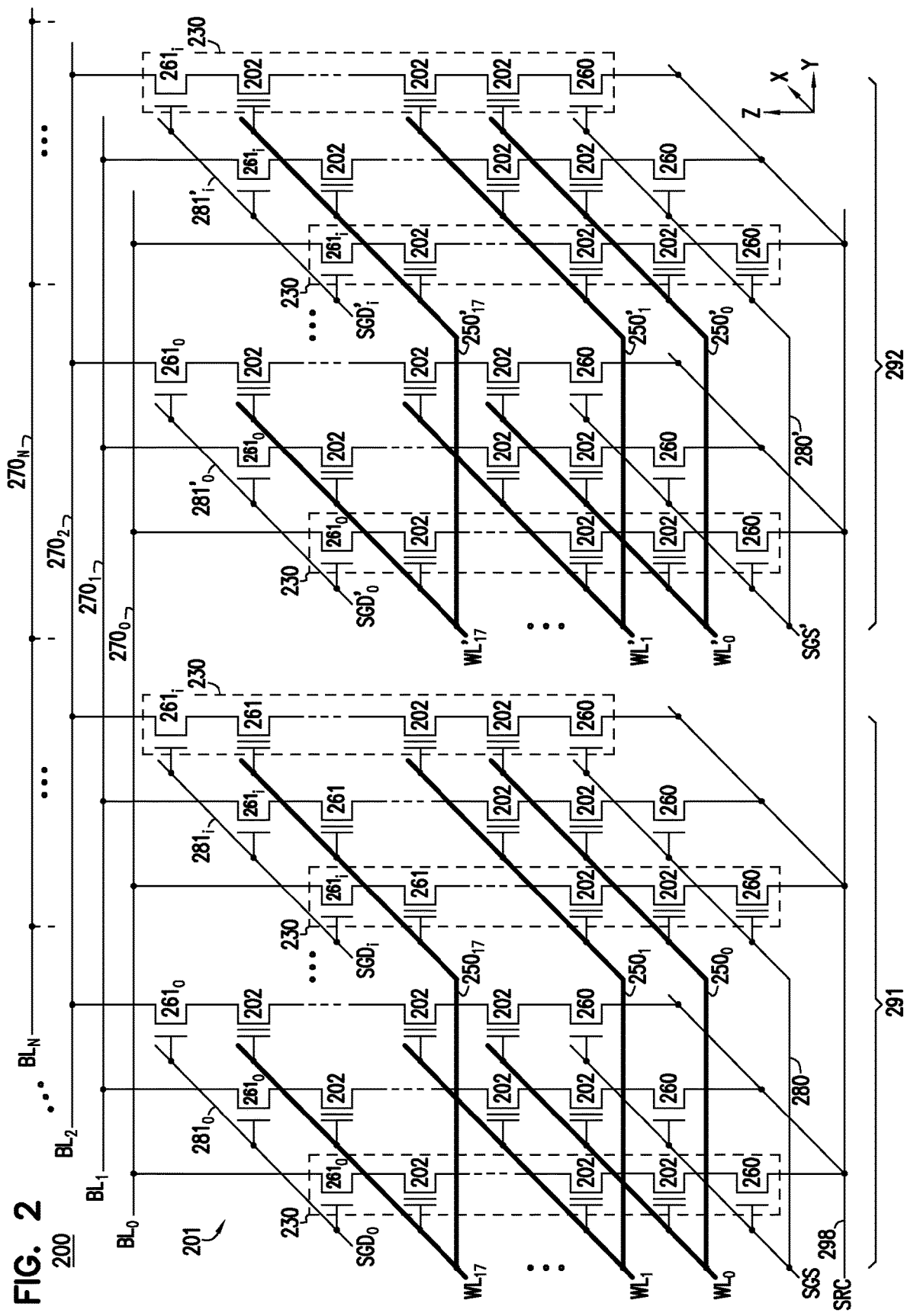
FIG. 2 shows a schematic of an apparatus in the form a memory device having memory cell blocks, according to an embodiment of the invention.

FIG. 2 shows a schematic of an apparatus in the form a memory device 200 having block (e.g., memory cell blocks) 291 and 292, according to an embodiment of the invention. Memory device 200 can include a non-volatile (e.g., NAND flash memory device) or other types of memory devices. As shown in FIG. 2, memory device 200 can include a memory cell array (or multiple memory arrays) 201. Memory device 200 can correspond to memory device 100. For example, memory array 201 and blocks 291 and 292 can correspond to memory array 101 and blocks 191 and 192, respectively, of memory device 100 of FIG. 1.

As shown in FIG. 2, memory device 200 can include memory cells 202, data lines $270_0$ through $270_N$ ($270_0$-$270_N$), control gates $250_0$ through $250_{17}$ (e.g., 18 control gates $250_0$-$250_{17}$) in block 291, and control gates $250'_0$ through $250'_{17}$ (e.g., 18 control gates $250'_0$-$250'_{17}$) in block 292. Data lines $270_0$-$270_N$ can correspond to part of data lines 170 of memory device 100 of FIG. 1. In FIG. 2, label "N" (index N) next to a number (e.g., $270_N$) represents the number of data lines of memory device 200. For example, if memory device 200 includes 16 data lines, then N is 15 (data lines $270_0$ through $270_{15}$).

In FIG. 2, data lines $270_0$-$270_N$ can include (or can be part of) bit lines (e.g., local bit lines) of memory device 200. As shown in FIG. 2, data lines $270_0$-$270_N$ can carry signals (e.g., bit line signals) $BL_0$ through $BL_N$, respectively. In the physical structure of memory device 200, data lines $270_0$-$270_N$ can be structured as conductive lines and have respective lengths extending in the Y-direction.

As shown in FIG. 2, memory cells 202 can be organized into separates blocks (blocks of memory cells) such as blocks 291 and 292. FIG. 2 shows memory device 200 including two blocks 291 and 292 as an example. However, memory device 200 can include numerous blocks. The blocks (e.g., blocks 291 and 292) of memory device 200 can share data lines (e.g., data lines $270_0$-$270_N$) to carry information (in the form of signals) read from or to be stored in memory cells of selected memory cells (e.g., selected memory cells in block 291 or 292) of memory device 200.

Control gates $250_0$-$250_{17}$ can be part of local word lines, which can be part of access lines (e.g., global word lines) of memory device 200 (that can correspond to access lines 150 of memory device 100 of FIG. 1). Control gates $250'_0$-$250'_{17}$ can be another part of other local word lines, which can be part of access lines (e.g., global word lines) of memory device 200. Control gates $250_0$-$250_{17}$ can be electrically separated from control gates $250'_0$-$250'_{17}$. Thus, blocks 291 and 292 can be accessed separately (e.g., accessed one at a time). For example, block 291 can be accessed at one time using control gates $250_0$-$250_{17}$, and block 292 can be accessed at another time using control gates $250'_0$-$250'_{17}$ at another time.

Memory device 200 can have the same number of control gates among the blocks (e.g., blocks 291 and 292) of memory device 200. In the example of FIG. 2, memory device 200 has 18 control gates in each of blocks 291 and 292. FIG. 2 shows memory device 200 including 18 control gates in blocks 291 and 292 as an example. The number of control gates in the blocks (e.g., blocks 291 and 292) of memory device 200 can be different from 18. Thus, memory device 200 can include fewer than 18 control gates or more than 18 control gates for the blocks (e.g., blocks 291 and 292) of memory device 200.

FIG. 2 shows directions X, Y, and Z that can be relative to the physical directions (e.g., dimensions) of the structure of memory device 200. For example, the Z-direction can be a direction perpendicular to (e.g., vertical direction with respect to) a substrate of memory device 200 (e.g., a substrate 699 shown in FIG. 6A). The Z-direction is perpendicular to the X-direction and Y-direction (e.g., the Z-direction is perpendicular to an X-Y plane of memory device 200). As an example, in the physical structure of memory device 200, control gates $250_0$-$250_{17}$ (e.g., 18 control gates) can be formed on 18 different levels (e.g., layers) of memory device 200 in the Z-direction. In this example, the levels (e.g., layers) of control gates $250_0$-$250_{17}$ can be formed (e.g., stacked) one level (one layer of material) over another in the Z-direction.

As shown in FIG. 2, memory cells 202 can be included in respective memory cell strings 230 in each of the blocks (e.g., blocks 291 and 292) of memory device 200. Each of memory cell strings 230 can have series-connected memory cells (e.g., 18 series-connected memory cells) in the Z-direction. In a physical structure of memory device 200, memory cells 202 in each of memory cell strings 230 can be formed (e.g., stacked vertically one over another) in different levels (e.g., 18 different layers in the example of FIG. 2) in the Z-direction of memory device 200. FIG. 2 shows an example of 18 memory cells in each of memory cell strings 230 as an example. However, the number of memory cells in each memory cell string of memory device 200 can vary.

For example, the number of memory cell in each of strings 230 can be equal to the number of levels (e.g., layers) of control gates (e.g., control gates $250_0$-$250_{17}$) of memory device 200.

As shown in FIG. 2, control gates $250_0$-$250_{17}$ can carry corresponding signals $WL_0$-$WL_{17}$. As mentioned above, control gates $250_0$-$250_{17}$ can include (or can be parts of) access lines (e.g., word lines) of memory device 200. Each of control gates $250_0$-$250_{17}$ can be part of a structure (e.g., a level) of a conductive material (e.g., a layer of conductive material) located in a level of memory device 200. Memory device 200 can use signals $WL_0$-$WL_{17}$ to selectively control access to memory cells 202 of block 291 during an operation (e.g., read, write, or erase operation). For example, during a read operation, memory device 200 can use signals $WL_0$-$WL_{17}$ to control access to memory cells 202 of block 291 to read (e.g., sense) information (e.g., previously stored information) from memory cells 202 of block 291. In another example, during a write operation, memory device 200 can use signals $WL_0$-$WL_{17}$ to control access to memory cells 202 of block 291 to store information in memory cells 202 of block 291.

As shown in FIG. 2, control gates $250'_0$-$250'_{17}$ can carry corresponding signals $WL'_0$-$WL'_{17}$. Each of control gates $250'_0$-$250'_{17}$ can be part of a structure (e.g., a level) of a conductive material (e.g., a layer of conductive material) located in a single level of memory device 200. Control gates $250'_0$-$250'_{17}$ can be located in the same levels (in the Z-direction) as control gates $250_0$-$250_{17}$, respectively. As mentioned above, control gates $250'_0$-$250'_{17}$ (e.g., local word lines) can be electrically separated from control gates $250_0$-$250_{17}$ (e.g., other local word lines)

Memory device 200 can use signals $WL'_0$-$WL'_{17}$ to control access to memory cells 202 respectively, of block 292 during an operation (e.g., read, write, or erase operation). For example, during a read operation, memory device 200 can use signals $WL'_0$-$WL'_{17}$ to control access to memory cells 202 of block 292 to read (e.g., sense) information (e.g., previously stored information) from memory cells 202 of block 292. In another example, during a write operation, memory device 200 can use signals $WL'_0$-$WL'_{17}$ to control access to memory cells 202 of block 292 to store information in memory cells 202 block 292.

As shown in FIG. 2, memory cells in different memory cell strings in the same a block can share (e.g., can be controlled by) the same control gate in that block. For example, in block 291, memory cells 202 coupled to control gate $250_0$ can share (can be controlled by) control gate $250_0$. In another example, memory cells 202 coupled to control gate $250_1$ can share (can be controlled by) control gate $250_1$. In another example, in block 292, memory cells 202 coupled to control gate $250'_0$ can share (can be controlled by) control gate $250'_0$. In another example, memory cells 202 coupled to control gate $250'_1$ can share (can be controlled by) control gate $250'_1$.

Memory device 200 can include a source (e.g., a source line, a source plate, or a source region) 298 that can carry a signal (e.g., a source line signal) SRC. Source 298 can be structured as a conductive line or a conductive plate (e.g., conductive region) of memory device 200. Source 298 can be common source line (e.g., common source plate or common source region) of block 291 and 292. Source 298 can be coupled to a ground connection of memory device 200.

Memory device 200 can include select transistors (e.g., drain select transistors) $261_0$ through $261_i$ ($261_0$-$261_i$) and select gates (e.g., drain select gates) $281_0$ through $281_i$.

Transistors $261_0$ can share the same select gate $281_0$. Transistors $261_i$ can share the same select gate $281_i$. Select gates $281_0$-$281_N$ can carry signals $SGD_0$ through $SGD_i$, respectively.

Transistors $261_0$-$261_i$ can be controlled (e.g., turned on or turned off) by signals $SGD_0$-$SGD_i$, respectively. During a memory operation (e.g., a read or write operation) of memory device 200, transistors $261_0$-$261_i$ can be turned on (e.g., by activating respective signals $SGD_0$-$SGD_i$) to couple memory cell strings 230 of block 291 to respective sets of data lines $270_0$-$270_N$. Transistors $261_0$-$261_i$ can be turned off (e.g., by deactivating respective signals $SGD_0$-$SGD_i$) to decouple the memory cell strings 230 of block 291 from respective sets of data lines $270_0$-$270_N$.

Memory device 200 can include transistors (e.g., source select transistors) 260, each of which can be coupled between source 298 and memory cells 202 in a respective memory cell string (one of memory cell strings 230) of block 291. Memory device 200 can include a select gate (e.g., source select gate) 280. Transistors 260 can share select gate 280. Transistors 260 can be controlled (e.g., turned on or turned off) by the same signal, such as SGS signal (e.g., source select gate signal) provided on select gate 280. During a memory operation (e.g., a read or write operation) of memory device 200, transistors 260 can be turned on (e.g., by activating an SGS signal) to couple the memory cell strings of block 291 to source 298. Transistors 260 can be turned off (e.g., by deactivating the SGS signal) to decouple the memory cell strings of block 291 from source 298.

Memory device 200 can include similar select gates and select transistors in block 292. For example, in block 292, memory device 200 can include select gates (e.g., drain select gates) $281'_0$ through $281'_i$ and transistors (e.g., drain select transistors) $261_0$-$261_i$. Transistors $261_0$ of block 291 can share the same select gate $281'_0$. Transistors $261_i$ of block 292 can share the same select gate $281'_i$. Select gates $281'_0$ through $281'_i$ can carry signals $SGD'_0$ through $SGD'_i$, respectively.

Transistors $261_0$-$261_i$ of block 292 can be controlled (e.g., turned on or turned off) by signals $SGD'_0$ through $SGD'_i$, respectively. During a memory operation (e.g., a read or write operation) of memory device 200, transistors $261_0$-$261_i$ of block 292 can be turned on (e.g., by activating respective signals $SGD'_0$ through $SGD'_i$) to couple the memory cell strings of block 292 to data lines $270_0$-$270_N$. Transistors $261_0$-$261_i$ of block 292 can be turned off (e.g., by deactivating respective signals $SGD'_0$-$SGD'_i$) to decouple the memory cell strings of block 292 from respective sets of data lines $270_0$-$270_N$.

Memory device 200 can include transistors (e.g., source select transistors) 260, each of which can be coupled between source 298 and the memory cells in a respective memory cell string of block 292. Transistors 260 of block 292 can share the same select gate (e.g., source select gate) 280' of memory device 200. Transistors 260 of block 292 can be controlled (e.g., turned on or turned off) by the same signal, such as SGS' signal (e.g., source select gate signal) provided on select gate 280'. During a memory operation (e.g., a read or write operation) of memory device 200, transistors 260 of block 292 can be turned on (e.g., by activating an SGS' signal) to couple the memory cell strings of block 292 to source 298. Transistors 260 of block 292 can be turned off (e.g., by deactivating the SGS' signal) to decouple the memory cell strings of block 292 from source 298. FIG. 2 shows select gates 280 and 280' being electrically separated as an example. Alternatively, select gates 280 and 280' can be electrically coupled to each other.

Memory device 200 includes other components, which are not shown in FIG. 2 so as not to obscure the example embodiments described herein. Some of the structure of memory device 200 is described below with reference to FIG. 2 through FIG. 65. For simplicity, detailed description of the same element among the drawings (FIG. 2 through FIG. 66) is not repeated.

Figure 3:
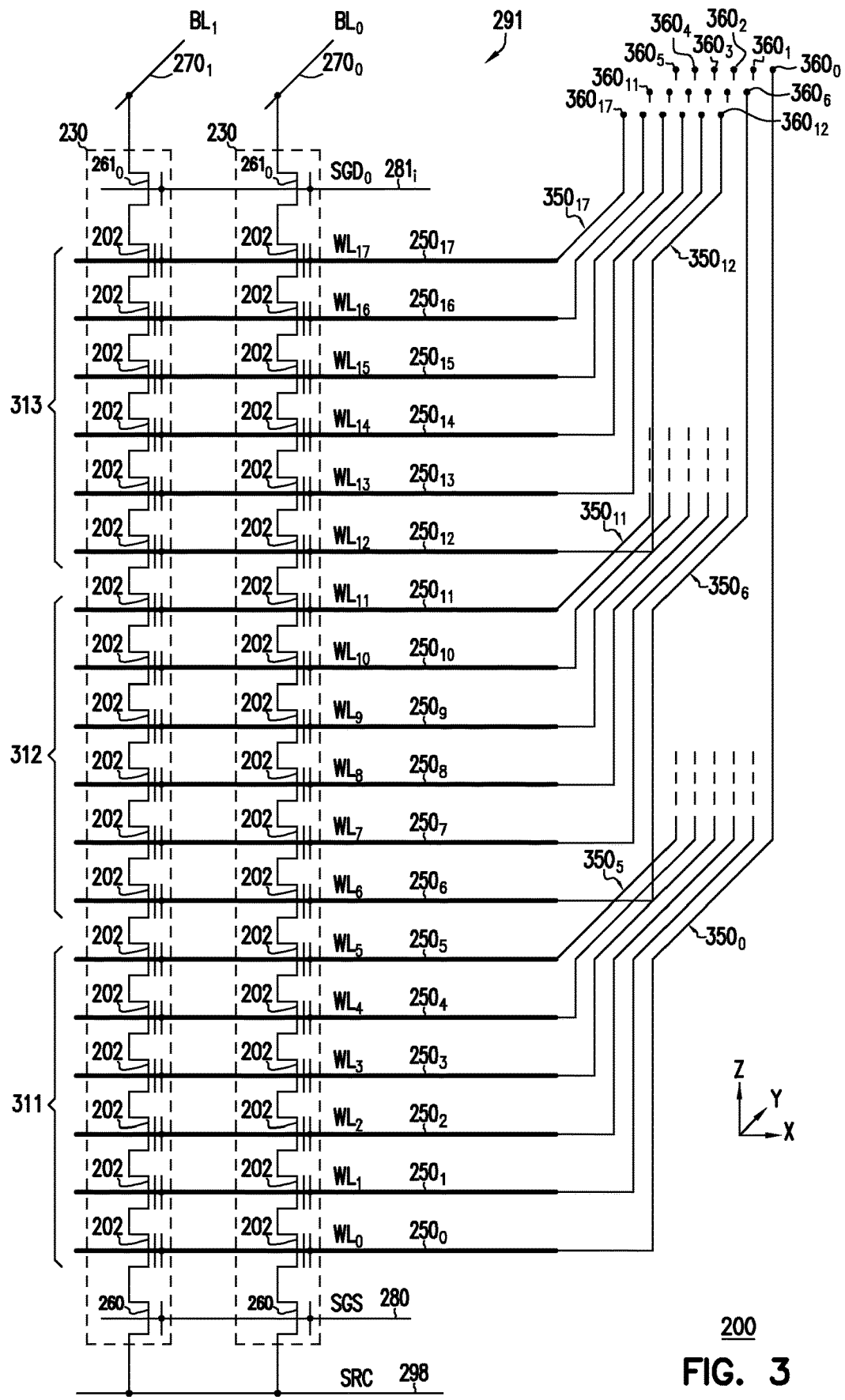
FIG. 3 shows a schematic of a portion of the memory device of FIG. 2 including a portion one of the blocks of FIG. 2 and conductive paths coupled to control gates associated with memory cells of the memory device, according to some embodiments described herein.

FIG. 3 shows a schematic diagram of a portion of memory device 200 of FIG. 2 including a portion of block 291 and conductive paths $350_0$-$350_{17}$ coupling control gates $250_0$-$250_{17}$ to conductive connections $360_0$-$360_{17}$, according to some embodiments described herein. In the physical structure of memory device 200, conductive paths $350_0$-$350_{17}$ can have structures with portions (e.g., conductive segments) arranged (e.g., extending) in the X, Y, and Z directions similar to the arrangement of portions shown in FIG. 3. Conductive connections $360_0$-$360_{17}$ can be coupled to other circuitry of memory device 200. Such circuitry can be formed in a semiconductor substrate (e.g., substrate 699 in FIG. 6A) of memory device 200 and can include drivers (e.g., word line drivers and word line decoders, not shown) of memory device 200. Conductive paths $350_0$-$350_{17}$ can carry signals $WL_0$-$WL_{17}$ (e.g., signals provided by word line drivers and word line decoders) from conductive connections $360_0$-$360_{17}$ to control gates $250_0$-$250_{17}$ of block 291.

As shown in FIG. 3, conductive paths $350_0$-$350_{17}$ can be divided into different groups (e.g., three groups) of conductive paths, for example, a group of conductive paths $350_0$-$350_5$, a group of conductive paths $350_6$-$350_{11}$, and a group of conductive paths $350_{12}$-$350_{17}$. Each of group of conductive paths can be coupled to respective control gates among control gates $250_0$-$250_{17}$ of block 291 to provide respective signals (e.g., word line signals) among signals $WL_0$-$WL_{17}$ (e.g., signals provided by word line drivers and word line decoders) from conductive connections $360_0$-$360_{17}$ to control gates $250_0$-$250_{17}$.

As shown in FIG. 3, control gates $250_0$-$250_{17}$ can be formed in decks such as decks 311, 312, and 313. In a physical structure of memory device 200, decks 311, 312, and 313 are different portions of memory device 200 that are stacked one deck (one device portion) over another (another device portion) in the Z-direction. As shown in FIG. 3, although memory device 200 include separate decks 311, 312, and 313, memory cells 202 of the same memory cell string (e.g., memory cell string 230 coupled to data line $270_0$) can be connected in series (e.g., continuously connected to each other) from one deck to another between a respective data line (e.g., data line $270_0$) and source (e.g., source region) 298.

Each of memory cell strings 230 can include a conductive channel (e.g., a vertical conductive channel) between a particular data line (e.g., data line $270_0$ in FIG. 2) and source 298. A portion of each of memory cells 202 of a particular memory cell string 230 can be part of the conductive channel of that particular memory cell string 230. The conductive channel can carry a current during an operation of memory device 200. For example, in an operation (e.g., a read operation) of memory device 200, current can flow between a particular data line (e.g., data line $270_0$) and source 298 through a conducive channel of a memory cell string 230 coupled to that particular data line.

Each of the other blocks (e.g., block 292 in FIG. 2 and blocks 293 and 294 in FIG. 4) of memory device 200 can have its own conductive connections (similar to conductive connections $360_0$-$360_{17}$ in FIG. 3) and conductive paths (similar to conductive paths $350_0$-$350_{17}$ in FIG. 3). For simplicity, such other conductive connections and conductive paths of the other blocks of memory device 200 are not described in detail in the description herein.

Figure 4:
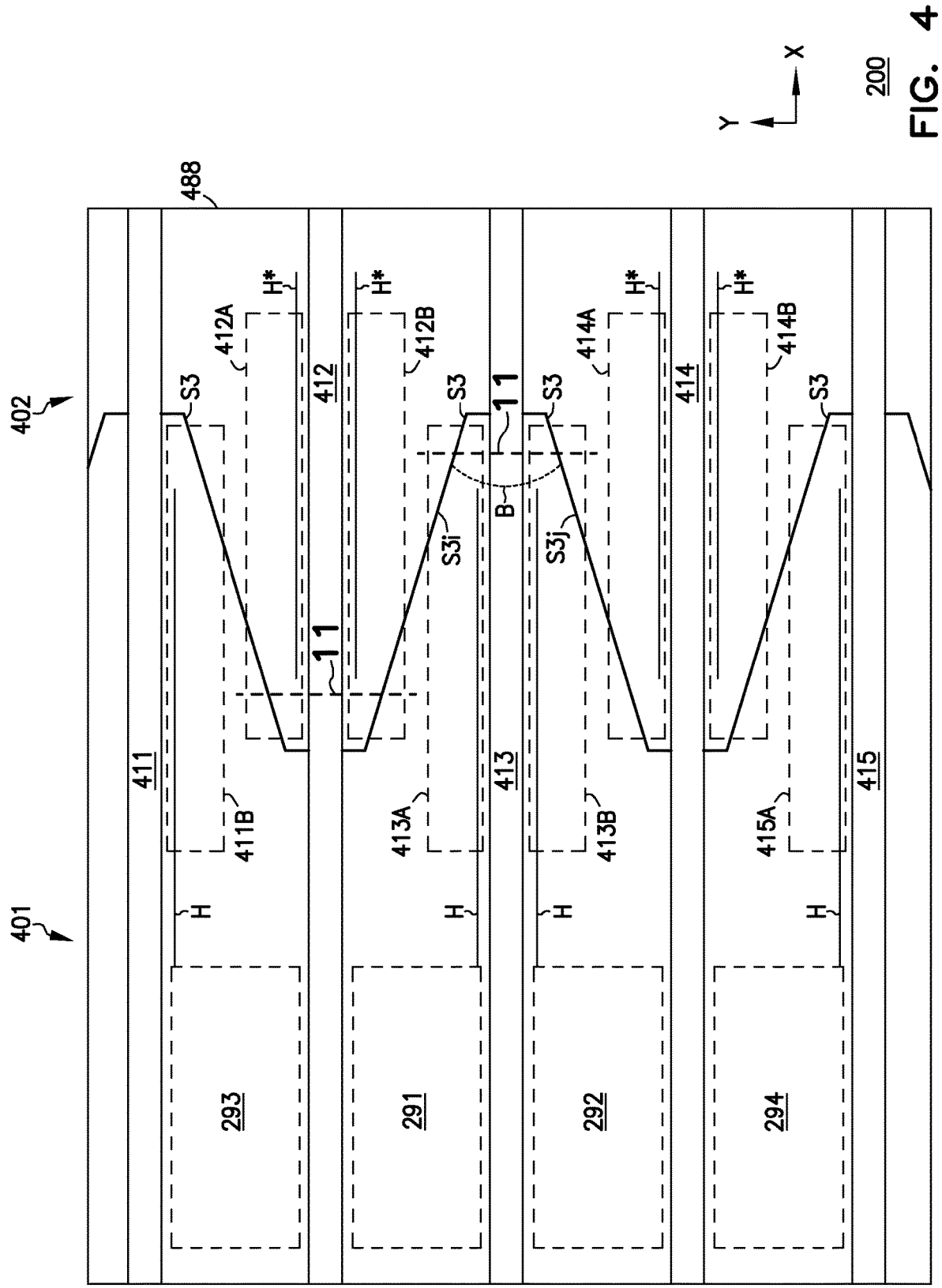
FIG. 4 shows a top view of a structure of the memory device of FIG. 2 and FIG. 3, according to some embodiments described herein.

FIG. 4 shows a top view of a structure of memory device 200 of FIG. 2 and FIG. 3 including a portion 401 that can contain blocks 291, 292, 293, and 294 and a portion 402 that can contain other elements (e.g., peripheral elements and connections) of memory device 200, according to some embodiments described herein. For simplicity, cross-sectional lines (e.g., hatch lines) are omitted from some or all the elements shown in the drawings described herein. Some elements of memory device 200 may be omitted from a particular figure of the drawings so as not to obscure the view or the description of the element (or elements) being described in that particular figure. Further, the dimensions (e.g., physical structures) of the elements shown in the drawings described herein are not scaled.

In FIG. 4, portion 401 can be called a memory array portion of memory device 200 at which blocks 291, 292, 293, and 294 of memory cells are located. Portion 402 can be called a peripheral portion of memory device 200 at which no memory array (no memory cells) are located. Portion 402 can include other elements (e.g., conductive routings) associated with elements in portion 401 or other portions of memory device 200.

Memory device 200 can include an edge 488, which can be one of the physical boundaries of memory device 200. As shown in FIG. 4, portion (e.g., peripheral portion) 402 can be location next to (adjacent) edge 488 and portion (e.g., memory array area) 401 can be located next to another edge (not labeled) of memory device 200 that is opposite from edge 488 in the X-direction.

As shown in FIG. 4, memory device 200 can include blocks 291, 292, 293, and 294 located side-by-side with each other in the Y-direction in portion (e.g., memory array area) 401. Memory device 200 can include dielectric structures 411, 412, 413, 414, and 415 having lengths extending the X-direction. Dielectric structures 411, 412, 413, 414, and 415 can separate (physically (e.g., electrically) separate) portions (e.g., blocks 291, 292, 293, and 294) of memory device 200 from each other.

During the processes of forming (fabrication of) memory device 200, dielectric structures 411, 412, 413, 414, and 415 can be formed by, for example, forming slits (e.g., trenches or cuts) at the locations of dielectric structures 411, 412, 413, 414, and 415 (FIG. 4). The slits are formed to separate different portions (e.g., block 291, 292, 293, and 294) in the structure of memory device 200 from each other. Then, each of the slits can be filled with a dielectric material (or dielectric materials), for example, silicon dioxide, silicon nitride, or both. Other dielectric materials can be used. In completed (finished) structure (e.g., as shown in FIG. 4) of memory device 200, dielectric structures 411, 412, 413, 414, and 415 can be slits (e.g., trenches or cuts) filled with a dielectric material (e.g., silicon dioxide or silicon nitride) or dielectric materials (e.g., silicon dioxide and silicon nitride).

As shown in FIG. 4, memory device 200 can include regions (viewed from top view with respect to the X-Y plane) 413A and 413B located on respective sides (in the Y-direction) of dielectric structure 413. Similarly, memory device 200 can include regions 411B, 412A, 412B, 414A, 414B, and 415A located on respective sides of dielectric structures 411, 412, 414, and 415.

Regions 413A, 413B, 411B, and 415A can be locations where conductive connections and other parts of control paths (shown in more details in FIG. 5 and FIG. 6A) are coupled to respective control gates of blocks 291, 292, 293, and 294. For example, region 413A can be a location where conductive connections $360_0$-$360_{17}$ (FIG. 3) can be located (e.g., located on the surface of region 413A) and coupled to control gate $250_0$-$250_{17}$ of block (through conductive paths $350_0$-$350_{17}$ of FIG. 3). Region 413B can be a location where conductive connections (similar to conductive connections $360_0$-$360_{17}$ of FIG. 3) can be located and coupled to control gates $250'_0$-$250'_{17}$ of block 292 (through separate conductive paths (not shown) that are similar to conductive paths $350_0$-$350_{17}$ of FIG. 3). Regions 412A, 412B, 414A, and 414B can be locations where additional conductive connections are located and coupled to other conductive paths (e.g., peripheral conductive paths) in portion 402.

Each of blocks 291, 292, 293, and 294 can be coupled to separate control paths. In FIG. 4, conductive rails (e.g., horizontal conductive rails) "Hs" coupled to a particular block (e.g., block 291) are part of conductive paths coupled to that particular block. For simplicity, different conductive rails (e.g., horizontal conductive rails) in the same and in different blocks are collectively given the same label "H". As shown in FIG. 4, conductive rails Hs coupled to a particular block can have lengths in the direction (e.g., the X-direction) from that particular block to a respective region among regions 413A, 413B, 411B, and 415A.

Figure 8:
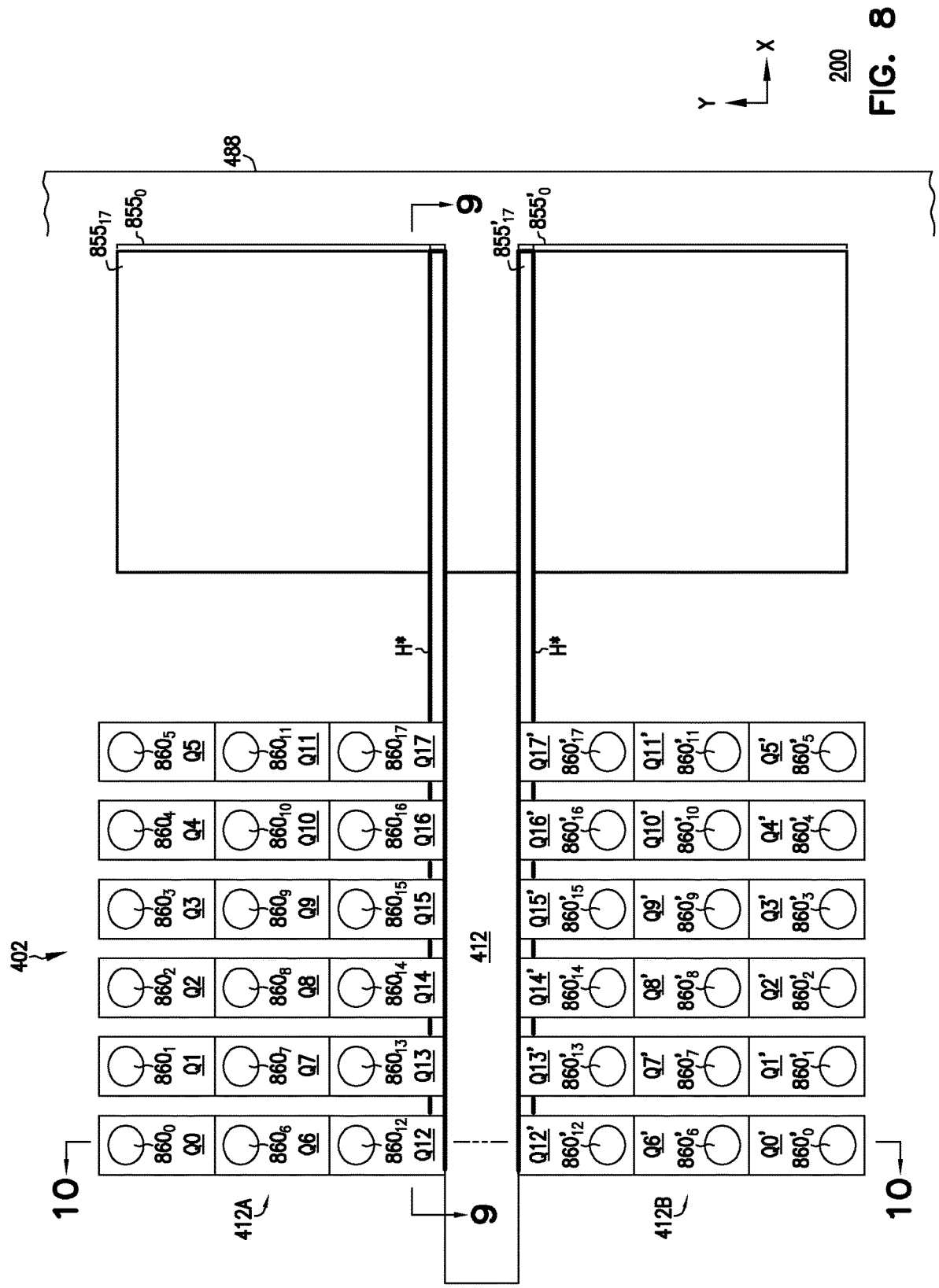
FIG. 8 shows an enlarged portion of a top view of a peripheral portion of the memory device of FIG. 4 including conductive pads and horizontal conductive rails coupled to structures in the peripheral portion, according to some embodiments described herein.
Figure 9:
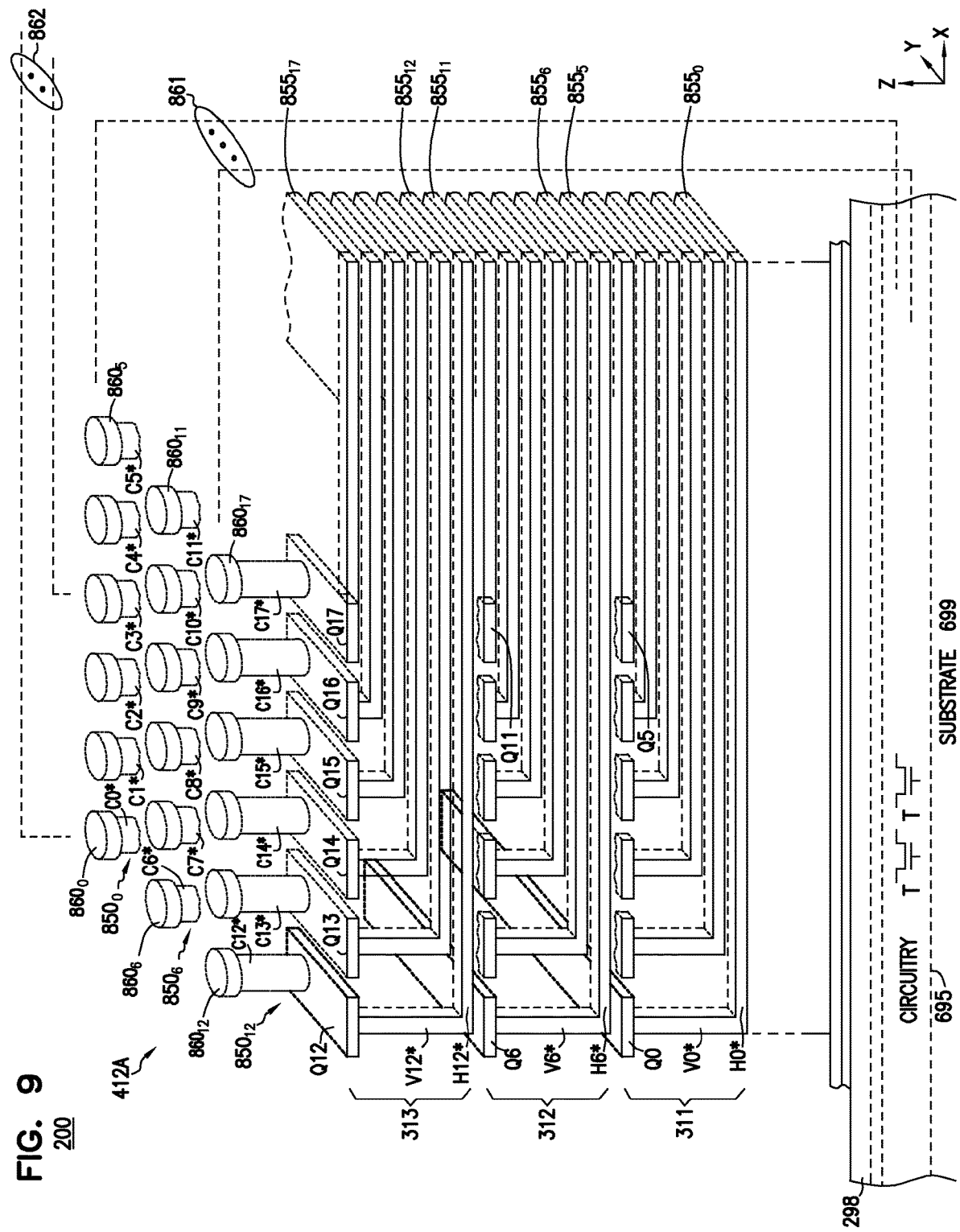
FIG. 9 and FIG. 10 show different views of a portion of the memory device of FIG. 8, according to some embodiments described herein.

Memory device 200 can also include additional conductive paths at portion 402. FIG. 8 and FIG. 9 show more details of such additional conductive paths. In FIG. 4, conductive rails (e.g., horizontal conductive rails) H* are part of the additional conductive paths. The additional conductive paths can be used to provide additional electrical connections to blocks 291, 292, 293, and 294 to other parts (e.g., besides blocks 291, 292, 293, and 294) of memory device 200.

As shown in FIG. 4, memory device 200 can include a spacer structure S3, which is an additional dielectric structure different from dielectric structures 411, 412, 413, 414, and 415. Blocks 291 and 292 can be located at a distance (e.g., in the X-direction) from spacer structure S3. Spacer structure S3 can include portions (e.g., only portions S3i and S3j are labeled) located between respective regions among regions 411B, 412A, 412B, 413A, 413B, 414A, 414B, and 415A. During formation (e.g., formation of the conductive paths) of memory device 200, spacer structure S3 is used as part of a combination of structures used to form some portions of the conductive paths (which include conductive rails Hs and H*) in portions 401 and 402. The portions (e.g., portions S3i and S3J) of spacer structure S3 in FIG. 4 are remaining portions (left-over portions) of spacer structure S3 in the completed (finished) structure of memory device 200 (FIG. 4).

As shown in FIG. 4, the portions of spacer structure S3 can form a zigzag pattern with respect to the top view (e.g., X-Y plane) of memory device 200. Angle B in FIG. 4 indicates the angle between the walls of two adjacent portions (e.g., portion S3i and S3j) in the zigzag pattern of spacer structure S3. As shown in FIG. 4, each of portions S3i and S3j are located (e.g., placed diagonally) at an angle different from 90 degrees (e.g., greater than zero and less than 90 degrees) with respect to the length of dielectric structure 413 in the X-direction. Thus, angle B can be greater than zero and less than 180 degrees. As shown in FIG. 4, other adjacent portions of spacer structure S3 can also have a respective angle (e.g., an angle greater than zero and less than 180 degrees) similar to angle B.

Figure 11:
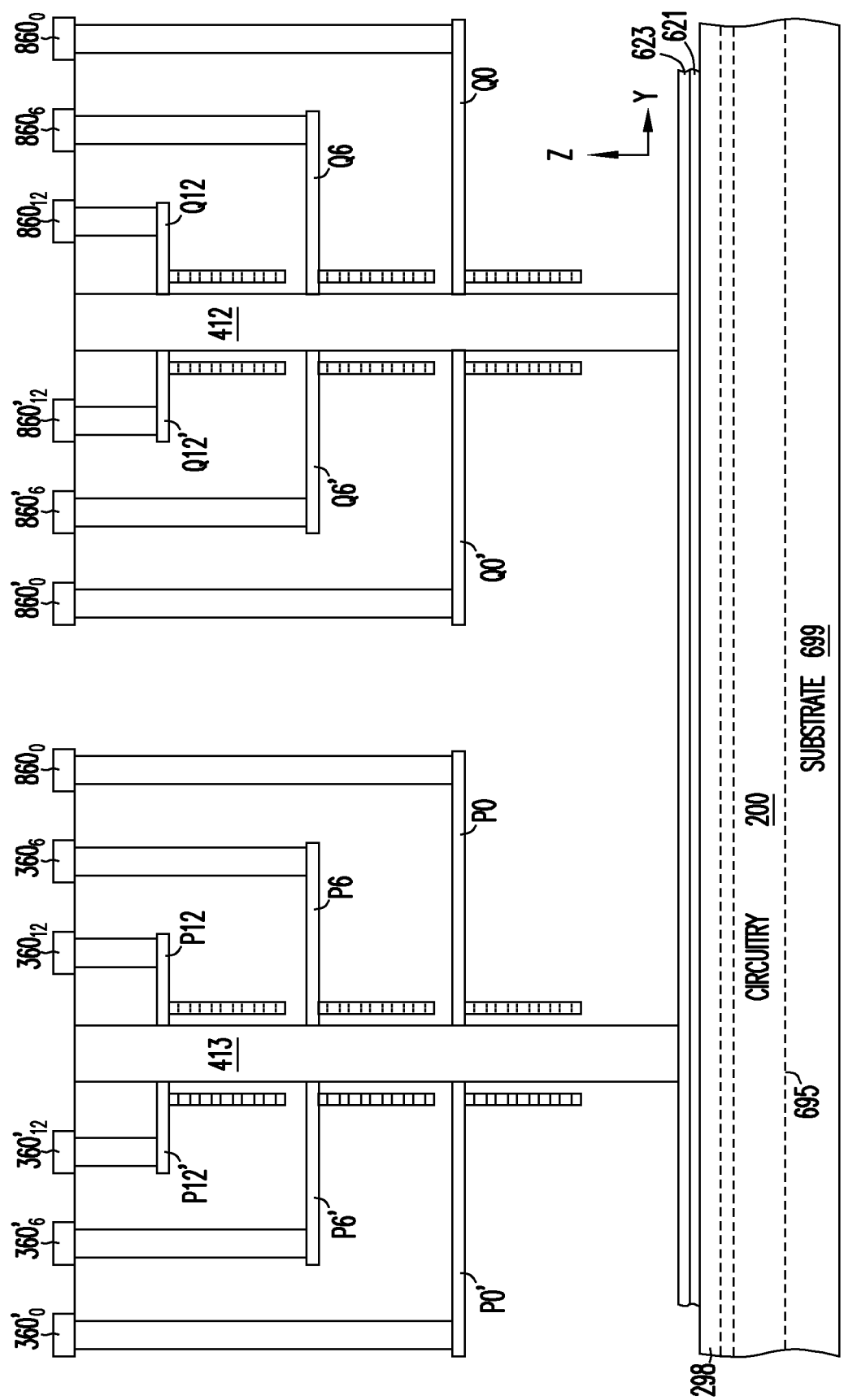
FIG. 11 shows combined cross-sections of different portions of the memory device of FIG. 4, according to some embodiments described herein.

Lines 11 in FIG. 4 indicate the locations of the different portions (e.g., two portions) that are combined (e.g., to create combined cross-sections) and shown in FIG. 11 as one view (for simplicity).

As described below with reference to FIG. 12 through FIG. 65, memory device 200 can also include additional spacer structures (e.g., spacer structures S1 and S2, not shown in FIG. 4). In FIG. 4, the additional spacer structures are located underneath (e.g., and hidden from) spacer structure S3 in the Z-direction. As described in more detail below (e.g., with reference to FIG. 12 through FIG. 65), spacer structure S3 and the additional spacer structures S1 and S2 can be used during parts of the formation of memory device 200.

Figure 6A:
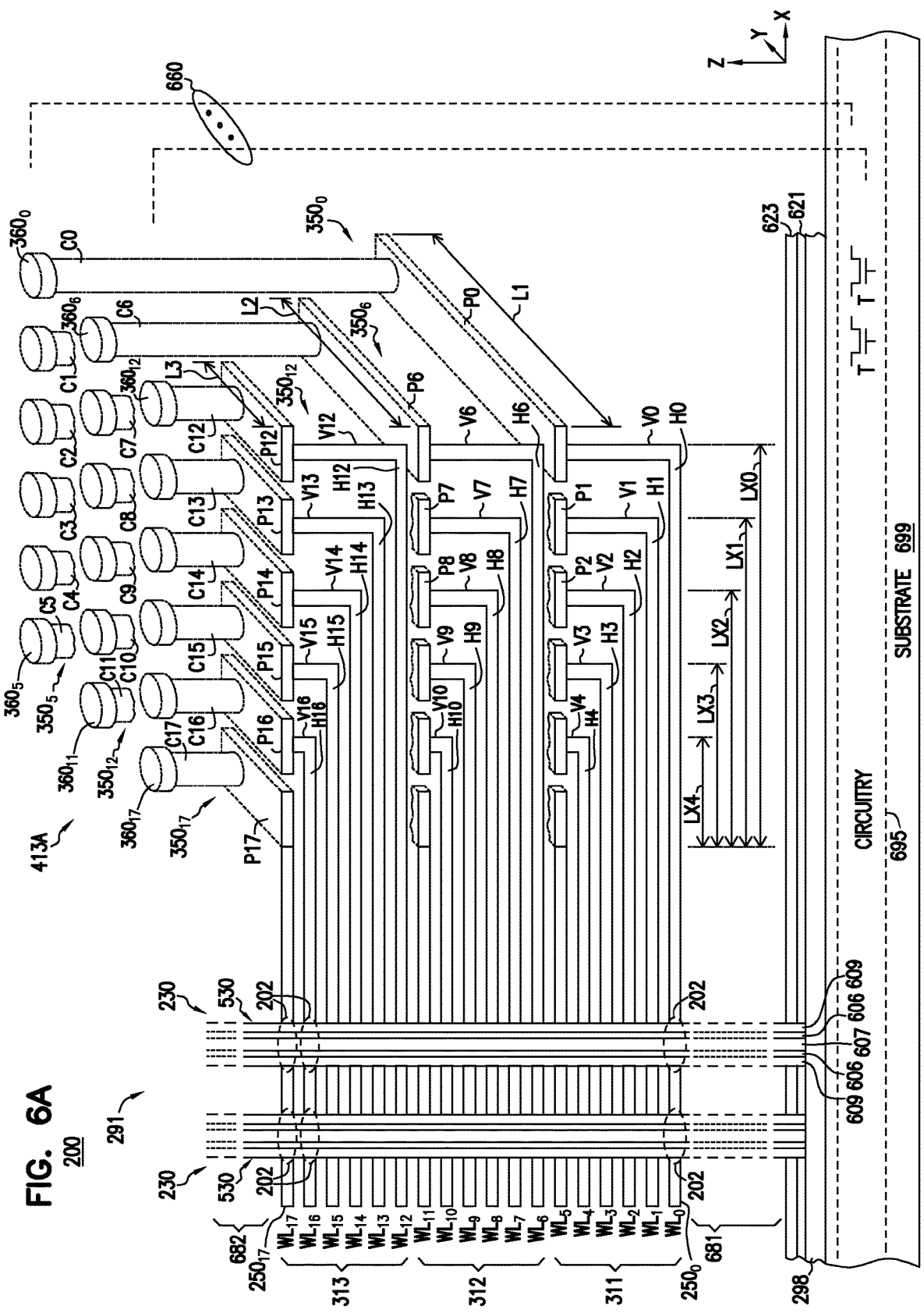
Figure 7:
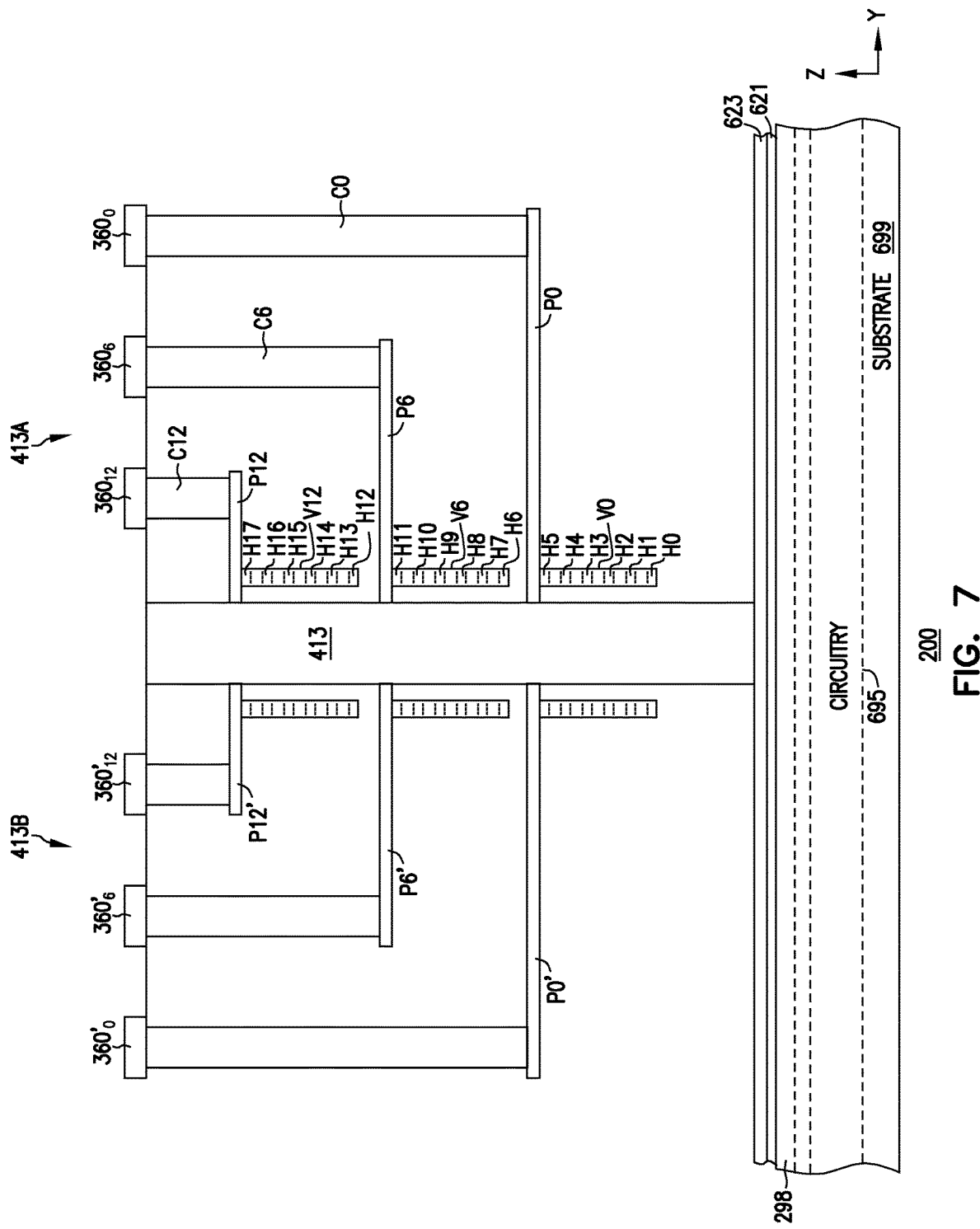
FIG. 7 shows a portion (e.g., a cross-section) of the memory device of FIG. 5 viewing from an X-direction, according to some embodiments described herein.

FIG. 5 shows an enlarged top view of a portion of the structure of memory device 200 of FIG. 4 at portion 401 (e.g., memory array portion) including blocks 291 and 292 and regions 413A and 413B on respective sides of dielectric structure 413, according to some embodiments described herein. In FIG. 5, line 6A-6A and line 7-7 show locations of different views (e.g., cross-sections) of memory device 200 that are shown in FIG. 6A and FIG. 7, respectively.

As shown in FIG. 5, memory device 200 can include pillars 530 in each of blocks 291 and 292. Each of pillars 530 can be part of a memory cell string among memory cell strings 230 (FIG. 2). Data lines $270_0$-$270_7$ (shown partially without middle sections) in FIG. 5 are part of data lines $270_0$-$270_N$ (FIG. 2) of memory device 200. Data lines $270_0$-$270_7$ can be located over pillars 530 (e.g., on top of pillars 530 in the Z-direction) and coupled to respective pillars 530 in blocks 291 and 292.

As shown in FIG. 5 (and in FIG. 6A), control gates $250_0$-$250_{17}$ can be stacked one over another in the Z-direction. For example, among control gates $250_0$-$250_{17}$ of block 291, control gate $250_{17}$ can be the top-most control gate (in the Z-direction) and control gate $250_0$ can be bottom-most control gates. Each of control gates $250_0$-$250_{17}$ and can have portions surrounding respective portions of pillars 530 (with respect to the X-Y plane) and adjacent respective memory cells 202 in block 291. Each of control gates $250_0$-$250_{17}$ and $250'_0$-$250'_{17}$ can have a width Wcg in the Y-direction. As shown in FIG. 5, control gates $250_0$-$250_{17}$ can have the same (equal) width (e.g., width Wcg) and control gates $250'_0$-$250'_{17}$ can have the same width (e.g., width Wcg).

Memory device 200 can include horizontal conductive rails (e.g., conductive rails H12, H13, H14, H15, and H16, collectively shown in FIG. 4 as conductive rails Hs) coupled to respective control gates $250_0$-$250_{17}$ of block 291, and horizontal conductive rails (e.g., conductive rails H12', H13', H14', H15', and H16', collectively shown in FIG. 4 as conductive rails Hs') coupled to respective control gates $250'_0$-$250'_{17}$ of block 292. Each of the horizontal conductive rails coupled to block 291 have a width Wr1 (in the Y-direction). Each of the horizontal conductive rails coupled to block 292 have a width Wr2 (in the Y-direction). As shown in FIG. 5, each of width Wr1 and width Wr2 is less than width Wcg. Width Wr1 can be the same as (equal to) width Wr2. However, Wr1 can be different from (unequal to) width Wr2 (e.g., due to process variations).

The conductive rails (e.g., conductive rails H12-H16) coupled to block 291 can have different lengths (e.g., lengths LX0, LX1, LX2, LX3, and LX4 shown in FIG. 6A). The conductive rails (e.g., conductive rails H12'-H16') coupled to block 292 can also have different lengths (not shown) similar to lengths LX0, LX1, LX2, LX3, and LX4 in FIG. 6A. The lengths of conductive rails H12-H16 can be the same as the lengths of conductive rails H12'-H16', respectively.

As shown in FIG. 5, memory device 200 can include conductive pads P0 through P17 (P0-P17) in region 413A. Conductive pads P0-P17 can be called local word line contact landing pads and are part of conductive paths $350_0$-$350_{17}$ (FIG. 2) coupled to control gates $250_0$-$250_{17}$ of block 291. Conductive pads P0-P17 can be located underneath (below) conductive connections $360_0$-$360_{17}$ with respect to the Z-direction. Each of conductive pads P0-P17 can be coupled to (can be in electrical contact with) a respective conductive connection (among conductive connections $360_0$-$360_{17}$) through a respective conduct contact among conductive contacts C0-C17 (FIG. 6A).

As shown in FIG. 5 (and FIG. 6A), conductive pads P0-P17 can have lengths L1, L2, and L3 extending in the Y-direction from the same reference location (e.g., near or at an edge of dielectric structure 413). Lengths L1, L2, and L3 can have different measurements. Length L1 is greater than length L2, and length L2 is greater than length L3.

Memory device 200 can include elements in block 292 and region 413B that have structures similar to the structures of the elements in block 291 and region 413A, respectively. For example, as shown in FIG. 5, control gates $250'_0$-$250'_{17}$ can be stacked one over another in the Z-direction. Memory device 200 can include conductive pads P0' through P17' (P0'-P17') in region 413B. Conductive pads P0'-P17' can be called local word line contact landing pads and are part of conductive paths coupled to control gates $250'_0$-$250'_{17}$ (FIG. 2) of block 292. As shown in FIG. 5, memory device 200 can include conductive connections $360'_0$-$360'_{17}$ in region 413B that can be similar to conductive connections $360_0$-$360_{17}$ in region 413A. Conductive pads P0'-P17' can be located underneath and coupled to respective conductive connections $360'_0$-$360'_{17}$ through respective conductive contacts (not shown).

FIG. 6A shows a side view (e.g., a cross section) with respect to the X-Z directions) of a structure of a portion of memory device 200 of FIG. 5 including the structure of control gates $250_0$ through $250_{17}$, pillars 530, and conductive paths $350_0$-$350_{17}$, according to some embodiments described herein. As shown in FIG. 6A, memory device 200 can include a substrate 699. Decks 311, 312, and 313 are shown stacked one deck over another in the Z-direction (which is also a direction from one deck to another).

Substrate 699 can include a semiconductor substrate (e.g., silicon-based substrate). For example, substrate 699 can include a p-type silicon substrate or an n-type silicon substrate. Source 298 (also shown schematically in FIG. 2) can include a conductive region that can be region formed in (or formed on) substrate 699. For example, source 298 can be formed on substrate 699, such that source 298 include conductive material formed on substrate 699. (e.g., by depositing a conductive material on substrate 699). In another example, source 298 can be formed in substrate 699, such that source 298 can be a conductively doped region of substrate 699.

As shown in FIG. 6A, memory cells 202 of each of memory cell strings 230 can be located in different levels (in the Z-direction) of memory device 200 along respective portions of a respective pillar 530. For example, memory cells 202 of each of memory cell strings 230 can be located one over another (e.g., formed vertically) in different levels (which can be the same as the levels of control gates $250_0$ through $250_{17}$) of memory device 200. For simplicity, only control gates $250_0$ and $250_{17}$ are labeled in FIG. 6A and only some of memory cells 202 are labeled. As described above with reference to FIG. 2, each of memory cell strings 230 can include an example of 18 memory cells. Thus, in this example, memory device 200 can have 18 control gates associated with 18 memory cells in each memory cell string 230.

As shown FIG. 6A, control gates $250_0$-$250_{17}$ can be formed in tiers (e.g., in different levels of in the Z-direction) of memory device 200, such that control gates $250_0$-$250_{17}$ can be stacked one over another in the Z-direction. Control gates $250_0$-$250_{17}$ can be located on the same levels of memory cells 202 of a memory cell string 230.

Control gates $250_0$-$250_{17}$ can include levels of conductive materials (e.g., 18 levels of conductive material) that are interleaved with levels of dielectric materials (e.g., silicon dioxide, not labeled). In an example, control gate $250_0$-$250_{17}$ can include a single conductive material, for example, a single metal (e.g., tungsten). In another example, control gates $250_0$-$250_{17}$ can include multiple materials (which can be formed one material at time). One of such multiple materials can include a conductive material (e.g., metal such as tungsten). For example, control gate $250_0$-$250_{17}$ can include different layers of aluminum oxide (AlO), titanium nitride (TNi), and tungsten (W).

For simplicity, FIG. 6A omits other elements of memory device 200 associated with each memory cell string 230. For example, in each memory cell string 230, memory device 200 can include at least one select gate (e.g., source select gate (SGS)) located below control gate $270_0$ (e.g., located at portion 681) and at least one select gate (e.g., drain select gate (SGD)) located above control gate $270_{17}$ (e.g., located at portion 682).

As shown in FIG. 6A, pillars 530 can extend (e.g., extend continuously) through control gate $250_0$-$250_{17}$. Each of pillars 530 can include a structure (e.g., a conductive channel) 606, a structure 607, and a structure 609. Structure 606 can be a conductive structure that can conduct current. Structure 606 of pillar 530 of a particular memory string can extend (e.g., extend continuously) through control gate $250_0$-$250_{17}$ (and through memory cells 202) of that particular memory cell string and couple to (contact) source 298. A portion of structure 606 in a particular memory cell string 230 and can form a transistor channel of each of memory cells 202 of that particular memory cell string. Structure 606 of pillar 530 of a particular memory cell string 230 can form a circuit path (e.g., a continuous current path) in that particular memory cell string 230 between a respective data line and the conductive region of source 298 during an operation (e.g., read operation) of memory device 200.

In FIG. 6A, structure (e.g., memory element structure) 609 can include material (or materials) that can hold (e.g., trap) charge. Structure 609 can include multiple layers of different materials that can be formed one layer after another. FIG. 6B shows an example of a structure having multiple layers. In FIG. 6A, part of structure 609 at a particular memory cell (among memory cells 202) can form a memory element of that particular memory cell.

Memory device 200 can include circuitry 695 located (e.g., formed in) substrate 699. At least a portion of circuitry 695 (e.g., the entire circuitry 695 or only a portion of circuitry 695) can be located in a portion of substrate 699 that is under (e.g., directly under) memory cell strings 230. Circuitry 695 can include circuit elements (e.g., transistors T shown in FIG. 6A) coupled to circuit elements outside substrate 699. For example, the circuit elements outside substrate 699 can include data lines $270_0$ (FIG. 5), conductive connections $360_0$ (FIG. 6A), and other (not shown) conductive connections, and other circuit elements of memory device 200. The circuit elements (e.g., transistors T) of circuitry 695 can be configured to perform part of a function of a memory device, such as memory device 200. For example, circuitry 695 can include decoder circuits, driver circuits, buffers, sense amplifiers, charge pumps, and other circuitry of memory device 200. Transistors T in FIG. 6A can be part of (e.g., can represent) such decoder circuits, driver circuits, buffers, sense amplifiers, charge pumps, and other circuitry of memory device 200.

As shown in FIG. 6A, memory device 200 can include conductive paths (e.g., conductive routings) 660 that can include portions (segments) extending in the Z-direction (e.g., extending vertically). Some all or of conductive paths $350_0$-$350_{17}$ can be part of conductive paths 660. Conductive paths 660 can include (e.g., can be coupled to) some (or all) of conductive connections $360_0$-$360_{17}$. As shown in FIG. 6A, conductive paths 660 can be coupled to circuitry 695. For example, at least one of conductive paths 660 (which can include at least one of conductive paths $350_0$-$350_{17}$) can be coupled to at least of one transistors T of circuitry 695.

Conductive paths 660 can provide electrical connections between some (or all) of conductive connections $360_0$-$360_{17}$ and other elements of memory device 200. For example, conductive paths 660 can be coupled to some of conductive connections $360_0$-$360_{17}$ and circuit elements (e.g., word line drivers and word line decoders, not shown) of circuitry 695 to provide electrical connection (e.g., in the form of signals $WL_0$-$WL_{17}$) from circuit elements (e.g., word line drivers, word line decoders, and charge pumps, not shown) from circuitry 695 to control gates $250_0$-$250_{17}$.

FIG. 6A shows an example where conductive paths 660 can be coupled to circuitry 695 in substrate 699. However, alternatively or additionally, conductive paths 660 can be coupled to other circuit elements outside substrate 699. Thus, alternatively or additionally, conductive paths 600 can provide electrical connections (e.g., in the form of signals) from other circuitry outside substrate 699 to control gates $250_0$-$250_{17}$.

FIG. 6A symbolically shows the entire transistor T located in substrate 699. However, the entire structure of transistor T or only part of the structure of transistor T (only a portion of the structure of transistor T) may be located in substrate 699. For example, the source and drain regions (not shown) of transistor T can be doped regions (not shown) located in substrate 699 and the gate (not shown) of transistor T can be located over substrate 699 and separated from the source and drain regions of transistor T by a dielectric region (e.g., by a gate oxide of transistor T). In FIG. 6A, at least one of conductive paths $350_0$-$350_{17}$ (which are coupled to respective control gates $250_0$-$250_{17}$) can be coupled to the source region or the drain region of transistor T through at least one of conductive paths 660.

As shown in FIG. 6A, memory device 200 can include other structures including an etch stop structure 621 and a dielectric 623 located over source 298 and under control gates $250_0$-$250_{17}$. Example materials for etch stop structure 621 include tungsten or other materials that can be used as a reference location (e.g., a boundary) at which an etch process can stop (e.g., an etch process associated with FIG. 26A) during process of forming memory device 200. Example materials for 623 in FIG. 6A can include silicon dioxide ($SiO_2$) or other dielectric materials.

As shown in FIG. 6A, control gates $250_0$-$250_{17}$ can be formed in decks 311, 312, and 313. Each of control gates $250_0$-$250_{17}$ in a respective deck (among decks 311, 312, and 313) can be coupled to a respective pad (one of conductive pads P0-P17) through a horizontal conductive rail and a vertical conductive rail. For example, in deck 313, the control gate associated with signal $WL_{12}$ can be coupled to conductive pad P12 through a conductive rail (e.g., horizontal conductive rail) H12 in the X-direction and a conductive rail (e.g., vertical conductive rail) V12 in the Z-direction. Each of conductive rails H0 and V0 can include a structure (e.g., a layer) of conductive material. The conductive rails (e.g., conductive rails H12 and V12) and the conductive pads (e.g., conductive pad P12) of memory device 200 can include (e.g., can be formed from) the same conductive material (e.g., tungsten or other conductive material (or materials)).

Similarly, each of the other control gates (associated with signals $WL_{13}$-$WL_{17}$) of deck 313 can be coupled to a respective pad (among conductive pads P12-P17) through a horizontal conductive rail and a vertical conductive rail. For example, FIG. 6A shows control gates associated with signals $WL_{13}$, $WL_{14}$, $WL_{15}$, and $WL_{16}$ of deck 311 can be coupled to conductive pads P13, P14, P15, and P16, respectively, through conductive rails H13, H14, H15, and H16, respectively, and conductive rails V13, V14, V15, and V16, respectively.

As shown in FIG. 6A, the control gate associated with signal $WL_{17}$ can be located on the same level with conductive pad P17, such that the control gate associated with signal $WL_{17}$ can be coupled to (e.g., directly coupled to) conductive pad P17 without going through a horizontal conductive rail and a vertical conductive rail. Similarly, the control gates associated with signals $WL_5$ and $WL_{11}$ can be located on the same levels with conductive pads P5 and P11, respectively, such that the control gate associated with signals $WL_5$ and $WL_{11}$ can be coupled to (e.g., directly coupled to) conductive pads P5 and P11, respectively, without going through a horizontal conductive rail and a vertical conductive rail. Alternatively, each of the control gates in a deck (e.g., each of the control gates associated with signals $WL_0$ and $WL_5$ in deck 311) can be coupled to a respectively horizontal conductive rail. For example, FIG. 6B shows each of the (six) control gates associated $WL_0$-$WL_5$ in deck 311 can be coupled to a respectively horizontal conductive rail among (six) horizontal conductive rails H0 through H5.

As shown in FIG. 6A, in the same deck (e.g., deck 311) the horizontal conductive rails (e.g., conductive rails H0, H1, H2, H3, and H4) can have different lengths (unequal lengths) in the X-direction. For example, FIG. 6A shows conductive rails H0, H1, H2, H3, and H4 can have different lengths LX0, LX1, LX2, LX3, and LX4, respectively. Similarly, conductive rails H6, H7, H8, H9, and H10 can have different lengths LX0, LX1, LX2, LX3, and LX4, respectively. Conductive rails H12, H13, H14, H15, and H16 can have different lengths LX0, LX1, LX2, LX3, and LX4, respectively. Thus, the horizontal conductive rails of the same deck can have different lengths. However, at least one of the horizontal conductive rails of a deck and at least one of the horizontal conductive rails of another deck can have the same length. For example, conductive rails H0, H6, and H12 can have the same length LX0.

FIG. 6A shows an example where horizontal conductive rails (e.g., conductive rails H0, H6, and H12) located at the same relative locations (e.g., location of conductive rails H0, H6, and H12) in deck 311, 312, and 313 have the same length (e.g., length LX0). However, such horizontal conductive rails (e.g., conductive rails H0, H6, and H12) can have different lengths. For example, at least two of conductive rails H0, H6, and H12 can have different lengths.

The horizontal conductive rails (e.g., conductive rails H0-H4, H6-H11, and H12-H16) of decks 311, 312, and 313 can have the same width, such as width Wr1 in the example shown in FIG. 5 and FIG. 6D. However, the horizontal conductive rails between different decks can be different (unequal) even when the horizontal conductive rails of the same deck can be the same (equal).

As shown in FIG. 6A, memory device 200 can include conductive contacts C12, C13, C14, C15, C16, and C17 (C12-C17) coupled to conductive pads P12-P17, respectively, and to conductive connections $360_{12}$-$360_{17}$, respectively. Example materials for conductive contacts C12-C17 include metal (e.g., tungsten), conductively doped polysilicon, or other conductive materials. Conductive contacts C12-C17 can have the same length in the Z-direction (e.g., extending vertically). The length of each of conductive contacts C12-C17 can be measured in the Z-direction from a respective conductive pad among conductive pads P12-P17 to a respective conductive connection among conductive connections $360_{12}$-$360_{17}$.

Each of decks 311 and 312 can have elements similar to that of deck 313. For example, FIG. 6A shows deck 311 having six control gates (associated with signals $WL_0$-$WL_5$), horizontal conductive rails H0-H4, vertical conductive rails V0-V4, and six pads (only conductive pads P0, P1, and P2 are labeled) coupled to contacts C0-C5, respectively. Conductive contacts C0-C5 can have the same length in the Z-direction (e.g., extending vertically). The length of each of conductive contacts C0-C5 can be measured in the Z-direction from a respective conductive pad among conductive pads P0-P5 to a respective conductive connection among conductive connections $360_0$-$360_5$. In another example, FIG. 6A shows deck 312 having six control gates (associated with signals $WL_6$-$WL_{11}$), horizontal conductive rails H6-H10, vertical conductive rails V6-V10, and six conductive pads (only conductive pads P6, P7, and P8 are labeled) coupled to conductive contacts C6-C11, respectively. Conductive contacts C6-C11 can have the same length in the Z-direction (e.g., extending vertically). The length of each of conductive contacts C6-C11 can be measured in the Z-direction from a respective conductive pad among conductive pads P0-P5 to a respective conductive connection among conductive connections $360_6$-$360_{11}$.

As shown in FIG. 6A, the length of each of conductive contacts C0-C5 can be different from (e.g., greater than) the length of each of conductive contacts C6-C11 The length of each of conductive contacts C6-C11 can be different from (e.g., greater than) the length of each of conductive contacts C12-C17.

As shown in FIG. 6A, conductive pads P0-P5 can be located on the same level (physical level, e.g., the same as the level of control gate associated with signal $WL_5$) of memory device 200. Conductive pads P6-P11 can be located over conductive pads P0-P5 and located on the same level (physical level, e.g., the same as the level of control gate associated with signal $WL_{11}$) of memory device 200 and over the level of conductive pads C0-C5. Conductive pads P12-P17 can be located over conductive pads P6-P11 and located on the same level (physical level, e.g., the same as the level of control gate associated with signal $WL_{17}$) of memory device 200 and over the level of conductive pads P6-P11.

As described above with reference to FIG. 5 and as shown in FIG. 6A, conductive pads P0-P17 of different decks can have different lengths L1, L2, and L3 in the Y-direction. However, as shown in FIG. 6A, conductive pads of the same deck can have the same length (in Y-direction). For example, each of conductive pads P0-P5 of deck 311 can have a length L1. Each of conductive pads P6-P11 of deck 312 can have a length L2. Each of conductive pads P12-P17 of deck 313 can have a length L3. The differences in the lengths of the conductive pads allow conductive contacts (e.g., conductive contacts C0-C5) for a lower deck (e.g., deck 311) to be formed and make contact with both pads of the lower deck and respective conductive connections (e.g., $360_0$-$360_5$) located above the lower deck.

As shown in FIG. 6A, the structure of conductive path $350_0$ coupled to control gate $250_0$ (associated with signal $WL_0$) can include conductive rail H0, conductive rail V0, conductive pad P0, conductive contact C0, and conductive connection $360_0$. Other conductive paths $350_1$-$350_{17}$ can have a structure similar to that of conductive path $350_0$. Thus, in memory device 200, a conductive path (e.g., conductive path $350_0$) coupled to a particular control gate (e.g., control gate $250_0$) can include a horizontal conductive rail (e.g., H0), a vertical conductive rail (e.g., V0), a conductive pad (e.g., P0), a conductive contact (e.g., C0), and a conductive connection (e.g., $360_0$).

FIG. 6A shows an example where decks 311, 312, and 313 can have the same number (e.g., six) of control gates, such as gates $250_0$-$250_5$ in deck 311, control gates $250_6$-$250_{11}$ in deck 312, and $250_{12}$-$250_{17}$ in deck 313. However, the number of control gates in one deck can be different from the number of control gates in another decks. Further, FIG. 6A shows memory device 200 including three decks 311, 312, and 313 as an example. However, the number of decks of memory device 200 can vary. For example, memory device 200 can include only one deck (e.g., deck 311), only two decks (e.g., decks 311 and 312), or more than three decks (e.g., an additional deck besides decks 311, 312, and 313, in which the additional deck can be formed over deck 313).

FIG. 6B, FIG. 6C, FIG. 6D, and FIG. 6E show portions (e.g., in perspective views) of deck 311 of memory device 200 of FIG. 6A including portions of control gates $250_0$-$250_5$, memory cells 202, and conductive paths $350_0$-$350_5$, according to some embodiments described herein. For simplicity, FIG. 6B through FIG. 6E show some of the elements of deck 311. Other decks (e.g., decks 312 and 313) of memory device 200 can have similar structures.

As shown in FIG. 6B and FIG. 6C, structures 606, 607, and 609 can be surrounded (with respect to the X-Y plane) by a portion of a respective control gate among control gates $250_0$-$250_5$. As shown in FIG. 6C, structure 609 at each of memory cells 202 can include portions (layers) 603, 604, and 605.

Structure 606 can be a conductive structure and can include polysilicon (e.g., doped or undoped polysilicon) or other materials that can conduct current. Structure 607 can include a dielectric material (e.g., silicon dioxide). In an alternative structure of memory device 200, structure 607 can be omitted from memory device 200. For example, in an alternative structure, the same material (e.g., polysilicon) can fill the locations of both structures 606 and 607.

In structure 609, portion 603 can include a charge-blocking material (or charge-blocking materials), for example, a dielectric material (e.g., silicon nitride) that is capable of blocking a tunneling of a charge. Portion 604 can include a charge storage material (or charge storage materials) that can provide a charge storage function to represent a value of information stored in a memory cell 202. For example, portion 604 can include a dielectric material (e.g., silicon-nitride based material or other dielectric materials) that can trap charge in memory cell 202. Portion 604 can include other charge storage materials (e.g., materials different from dielectric materials). Portion 605 can include a tunnel dielectric material (or tunnel dielectric materials), for example, silicon dioxide, that is capable of allowing tunneling of a charge (e.g., electrons).

FIG. 6D shows an angle A between lines 610 and 611. Lines 610 and 611 are parallel to the X-Y plane. Line 610 is parallel to the X-direction that is also parallel to the length of each of the horizontal conductive rails (e.g., conductive rail H0) coupled to a respective control gate (e.g., control gate $250_0$). Line 611 (at angle A from line 610) can be parallel to an edge of conductive rail V0. As shown in FIG. 6D, conductive rail V0 can be formed at angle A with respect to conductive rail H0. Angle A can be greater than zero and less than 90 degrees. Similarly, other conductive rails V1-V4 can be formed at angle A relative to the length of a horizontal conductive rail (one of conductive rails H1-H4). As described below with reference to FIG. 12 through FIG. 65, angle A can be dependent on an angle (e.g., angle A in FIG. 12) of the structure of a spacer (e.g., spacer structure S1 in FIG. 12) used to form part (e.g., part of deck 311) of memory device 200.

FIG. 6E shows another portion of conductive paths $350_0$-$350_{17}$ including conductive contacts C0-C5, conductive pads P0-P5, and part of conductive rails V0-V4. FIG. 6F shows a top view of conductive pads P0-P5 of FIG. 6E. As shown in FIG. 6E, conductive contacts C0-C5 can have the same length in the Z-direction and can be coupled to (e.g., coupled to the top sides) of pads P0-P5. Conductive connections $360_0$-$360_{17}$ can include metal, conductively doped polysilicon, or other conductive materials.

FIG. 6A, FIG. 6E, and FIG. 6F show an example where conductive pads P0-P17 have a specific structure (e.g., a specific shape, such as a rectangular shape or "I" shape). However, some or all of conductive pads P0-17 can have a structure (e.g., shape) different from the structure shown in FIG. 6A provided that each of conductive pads P0-P17 can be in electrical contact with a respective conductive contact (e.g., one of conductive contacts C0-C17) and one of vertical conductive rails (e.g., one of conductive rails V0-V4, V6-10, and V12-V16). Other examples of the shape of some (or all) of conductive pads P0-P17 are shown in FIG. 6G through FIG. 6I.

FIG. 6G shows a view (e.g., a perspective view) of conductive pads P having a structure (e.g., a shape similar to an "L" shape or an "L" like shape). FIG. 6H shows a top view (with respect to the X-Y plane) of conductive pads P of FIG. 6H. Conductive pads P can represent some of conductive pads P0-P17 (FIG. 6A) of memory device 200. Conductive contacts C can represent some of conductive contacts C0-C17 (FIG. 6A) memory device 200. Conductive rails V can represent some of conductive rails (e.g., conductive rails V0-V4, V6-10, and V12-V16 in FIG. 6A) of memory device 200.

FIG. 6H shows lines 641 and 642 that are parallel to each other and parallel to the Y-direction. Line 641 can pass through the location of a particular conductive pad P. Line 642 can pass through the location of particular conductive rail V. As shown in FIG. 6H, conductive rails V are not aligned with conductive contacts C in that conductive rails V are shifted (e.g., shifted to the right in the X-direction) by a distance (offset distance) D1 in a direction from line 641 to line 642. Thus, to allow each of conductive pads P to be in parallel with line 641 and to be in electrical contact with a respective conductive contact C and a respective conductive rail V, each of conductive pads P can be formed to have structure (e.g., an "L-like" shape) as shown in FIG. 6G and FIG. 6H.

FIG. 6G and FIG. 6H show an example where the offset (e.g., distance D1) in one pair of conductive contact C and a corresponding conductive rail V can be the same as the offset (e.g., distance D1) in another pair of conductive contact C and a corresponding conductive rail V. However, the offset (e.g., distance D1) in one pair of conductive contact C and a corresponding conductive rail V can be the different from the offset (e.g., not equal to distance D1) in another pair of conductive contact C and a corresponding conductive rail V, as shown in the example of FIG. 27E (described in more detail below with reference to FIG. 27E).

FIG. 6I shows a view (e.g., a perspective view) of conductive pads P having another structure (e.g., a shape similar to an L shape or an L-like shape). FIG. 6J shows a top view (with respect to the X-Y plane) of conductive pads P of FIG. 6J. In comparison with FIG. 6G and FIG. 6H, the L-like shape of conductive pads P in FIG. 6I can a mirror of the L-like shape of conductive pads P of FIG. 6G. Conductive pads P in FIG. 6I can represent some of conductive pads P0-P17 (FIG. 6A) of memory device 200. Conductive contacts C in FIG. 6I can represent some of conductive contacts C0-C17 (FIG. 6A) memory device 200. Conductive rails V in FIG. 6I can represent some of conductive rails (e.g., conductive rails V0-V4, V6-10, and V12-V16 in FIG. 6A) of memory device 200. FIG. 6J shows lines 643 and 644 that are parallel to each other and parallel to the Y-direction. Line 643 can pass through the location of a particular conductive pad P. Line 644 can pass through the location of particular conductive rail V. As shown in FIG. 6J, conductive rails V are not aligned with conductive contacts C in that conductive rails V are shifted (e.g., shifted to the left in the X-direction) by a distance (e.g., offset distance) D2 in a direction from line 643 to line 644. Thus, to allow each of conductive pads P to be in parallel with line 643 and to be in electrical contact with a respective conductive contact C and a respective conductive rail V, each of conductive pads P can be formed to have a shape (e.g., an L-like shape) as shown in FIG. 6I and FIG. 6J.

FIG. 6I and FIG. 6J show an example where the offset (e.g., distance D2) in one pair of conductive contact C and a corresponding conductive rail V can be the same as the offset (e.g., distance D2) in another pair of conductive contact C and a corresponding conductive rail V. However, the offset (e.g., distance D2) in one pair of conductive contact C and a corresponding conductive rail V can be the different from the offset (e.g., not equal to distance D2) in another pair of conductive contact C and a corresponding conductive rail V, as shown in the example of FIG. 27D (described in more detail below with reference to FIG. 27D).

Memory device 200, the shape of the conductive pads (e.g., conductive pads P0-P5) in one deck (e.g., deck 311) can be different from the shape of the conductive pads (e.g., conductive pads P6-P11 or P12-P17) in another deck (e.g., deck 312 or 313). However, the shape of the conductive pads (e.g., conductive pads P0-P5) of the same deck (e.g., deck 311) can be the same.

FIG. 7 shows a portion (e.g., a cross-section) of memory device 200 along line 7-7 of FIG. 5, according to some embodiments described herein. As shown in FIG. 7, some of the elements of regions 413A and 413B (labeled in FIG. 4) can be formed symmetrically (e.g., or substantially symmetrically) with respect to dielectric structure 413.

Figure 10:
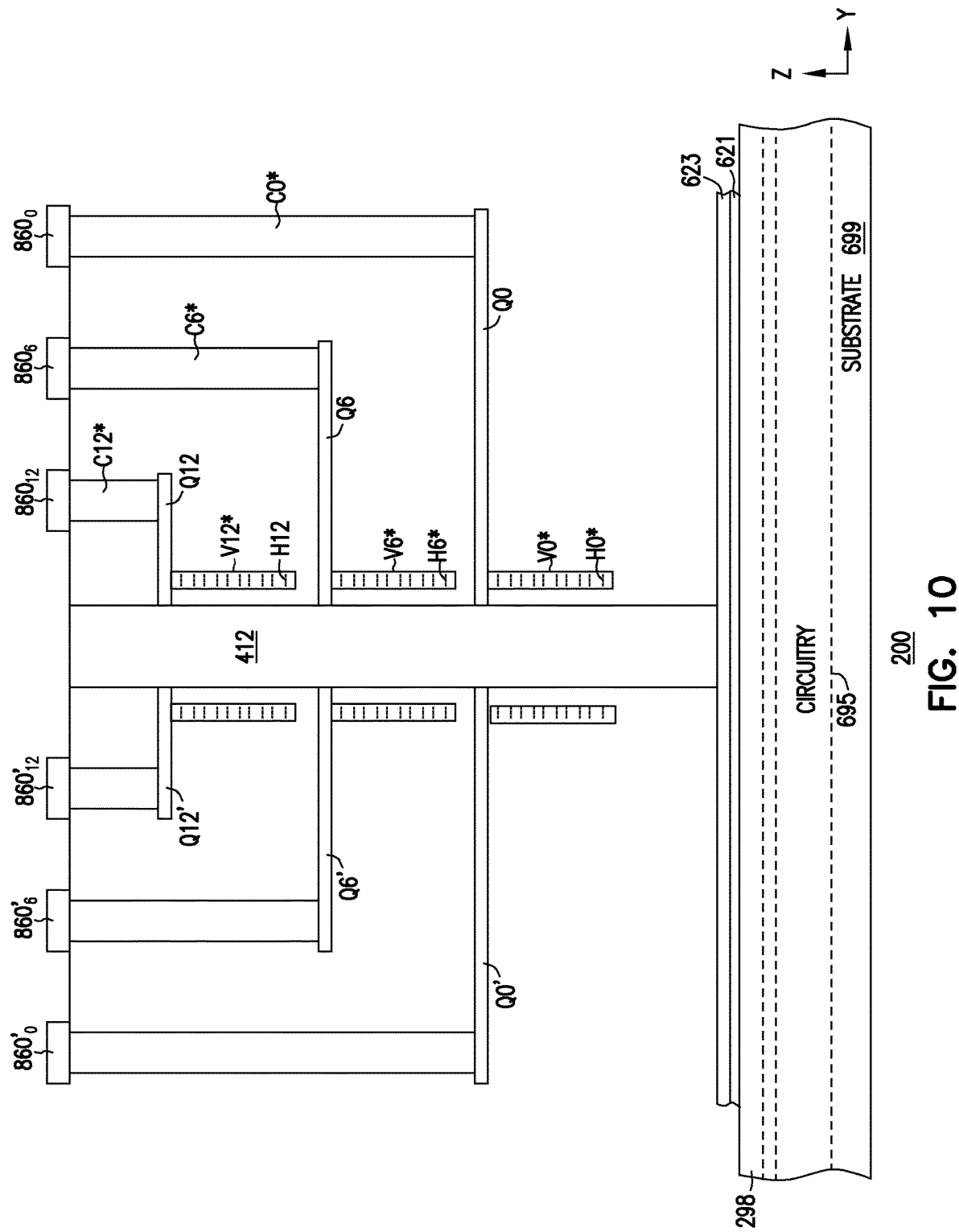

FIG. 8 shows a top view of a portion of the structure of memory device 200 of FIG. 4 at portion (e.g., peripheral portion) 402 including regions 412A and 412B on respective sides of dielectric structure 412, according to some embodiments described herein. FIG. 9 and FIG. 10 show portions (e.g., a cross-sections) of memory device 200 along lines 9-9 and 10-10, respectively, of FIG. 8.

As shown in FIG. 8 and FIG. 9, memory device 200 can include structures $855_0$ through $855_{17}$ ($855_0$-$855_{17}$). For simplicity, only some of structures $855_0$-$855_{17}$ are labeled in FIG. 8 and FIG. 9. Structures $855_0$-$855_{17}$ are levels (e.g., layers) of materials stacked one over another in the Z-direction. The stacked levels (e.g., stacked layers) of structures $855_0$-$855_{17}$ are similar to the stacked levels of control gates (e.g., control gates $250_0$-$250_{17}$) of the blocks (e.g., block 291) of memory device 200. However, since portion 402 contains no memory cells, structures $855_0$-$855_{17}$ have no memory cell strings (e.g., no pillars) going through them. Structures $855_0$-$855_{17}$ can include dielectric materials (e.g., silicon nitride).

As shown in FIG. 9, structures $855_0$-$855_{17}$ can be included in decks 311, 312, and 313. Structures $855_0$-$855_{17}$ can be formed on the same levels (physical levels in the Z-direction) as control gates $250_0$-$250_{17}$, respectively. For example, structures $855_0$-$855_{17}$ can include 18 levels of conductive materials that are interleaved with levels of dielectric material (not shown). Structures $855_0$-$855_{17}$ can be formed at the same time (e.g., concurrently formed in the same processes) that control gates $250_0$-$250_{17}$, respectively, are formed.

As shown in FIG. 8 and FIG. 9, memory device 200 (FIG. 8) can include conductive pads Q0-Q17 and conductive pads Q0'-Q17' that can be similar to conductive pads P0-P17 and conductive pads P0'-P17' (FIG. 5), respectively. For simplicity, some of conductive pads Q0-Q17 are not labeled in FIG. 9.

As shown in FIG. 8 and FIG. 9, conductive pads Q0-Q17 can be coupled to conductive connections $860_0$ through $860_{17}$, respectively. Conductive pads Q0'-Q17' can be coupled to conductive connections $860_0$' through $860_{17}$', respectively. Conductive connections $860_0$ through $860_{17}$ can be similar to conductive connections $360_0$-$360_{17}$ (FIG. 5), respectively. Conductive connections $860_0$' through $860_{17}$' can be similar to conductive connections $360_0$'-$360_{17}$' (FIG. 5), respectively.

As shown in FIG. 9, each of conductive pads Q0-Q17 can also be coupled to a respective structure among structures $855_0$-$855_{17}$ through a horizontal conductive rail and a vertical conductive rail. For example, as shown in FIG. 9, conductive pad Q0 can be coupled to structure $855_0$ through a conductive rail (e.g., horizontal conductive rail) H0* and a conductive rail (e.g., vertical conductive rail) V0*. In another example, conductive pad Q6 can be coupled to structure 8556 through a conductive rail (e.g., horizontal conductive rail) H6* and a conductive rail (e.g., vertical conductive rail) V6*. In another example, conductive pad Q12 can be coupled to structure $855_{12}$ through a conductive rail (e.g., horizontal conductive rail) H12* and a conductive rail (e.g., vertical conductive rail) V12*. The horizontal conductive rails (e.g., conductive rails H0*, H6*, and H12*) are collectively shown in FIG. 9 as conductive rails H*.

As shown in FIG. 9, memory device 200 can include conductive paths 8500 through 85017 (some of which are not labeled for simplicity). Each of conductive paths $850_0$ through $850_{17}$ can include part of one of conductive connection $860_0$-$860_{17}$, one of conductive contacts C0*-C17*, one of conductive pads Q0-Q17, a vertical conductive rail, a horizontal conductive rail, and one of structures $855_0$-$855_{17}$. For example, as shown in FIG. 9, conductive path $850_{12}$ can include part of conductive connection $860_{12}$, conductive connection C12*, conductive pad Q12, conductive rail (e.g., vertical conductive rail) V12*, conductive rail (e.g., a horizontal conductive rail) H12*, and structure $855_{12}$. In another example, as shown in FIG. 9, conductive path 8506 can include part of conductive connection $860_6$, conductive connection C6*, conductive pad Q6, conductive rail (e.g., vertical conductive rail) V6* conductive rail (e.g., a horizontal conductive rail) H6*, and structure 8556.

As shown in FIG. 9, memory device 200 can include conductive paths (e.g., conductive routings) 861 and 862 that can include portions (segments) extending in the Z-direction (e.g., extending vertically). Some or all of conductive paths 861 can be coupled to some all or all of conductive paths $850_0$-$850_{17}$. Some or all of conductive paths 862 can be coupled to some all or all of conductive paths $850_0$-$850_{17}$. Some of conductive paths 861 may be coupled to some of conductive paths 862. Further, some or all of conductive paths 862 can be coupled to other elements located outside memory device 200.

Conductive paths 861, 862, and $850_0$-$850_{17}$ can form a conductive routing structure for part of memory device 200. For example, at least some of conductive paths 861, 862, and $850_0$-$850_{17}$ may be electrically coupled to circuit elements (e.g., word line drivers, word line decoders, sense amplifiers, and charge pumps, not shown) of circuitry 695 to provide electrical connections between elements of circuitry 695, between elements of circuitry 695 and other additional elements, or between elements of circuitry 695 and between elements of circuitry 695 and other additional elements. The other additional elements can be located inside or outside memory device 200.

FIG. 10 shows a portion (e.g., a cross-section) of memory device 200 along line 10-10 of FIG. 8, according to some embodiments described herein. As shown in FIG. 10, some of the elements of regions 412A and 412B (labeled in FIG. 4) can be formed symmetrically (e.g., substantially symmetrically) with respect to dielectric structure 412.

FIG. 11 shows combined cross-sections of memory device 200 at lines 11 of FIG. 4, according to some embodiments described herein. FIG. 11 can also be a combination of FIG. 7 and FIG. 10.

The above description with reference to FIG. 2 through FIG. 11 show memory device 200 including conductive paths (e.g., conductive paths $350_0$-$350_{17}$ and $850_0$-$850_{17}$). However, in alternative structure of memory device 200, conductive paths $850_0$-$850_{17}$ can be omitted from (e.g., not be included in) memory device 200.

Figure 12:
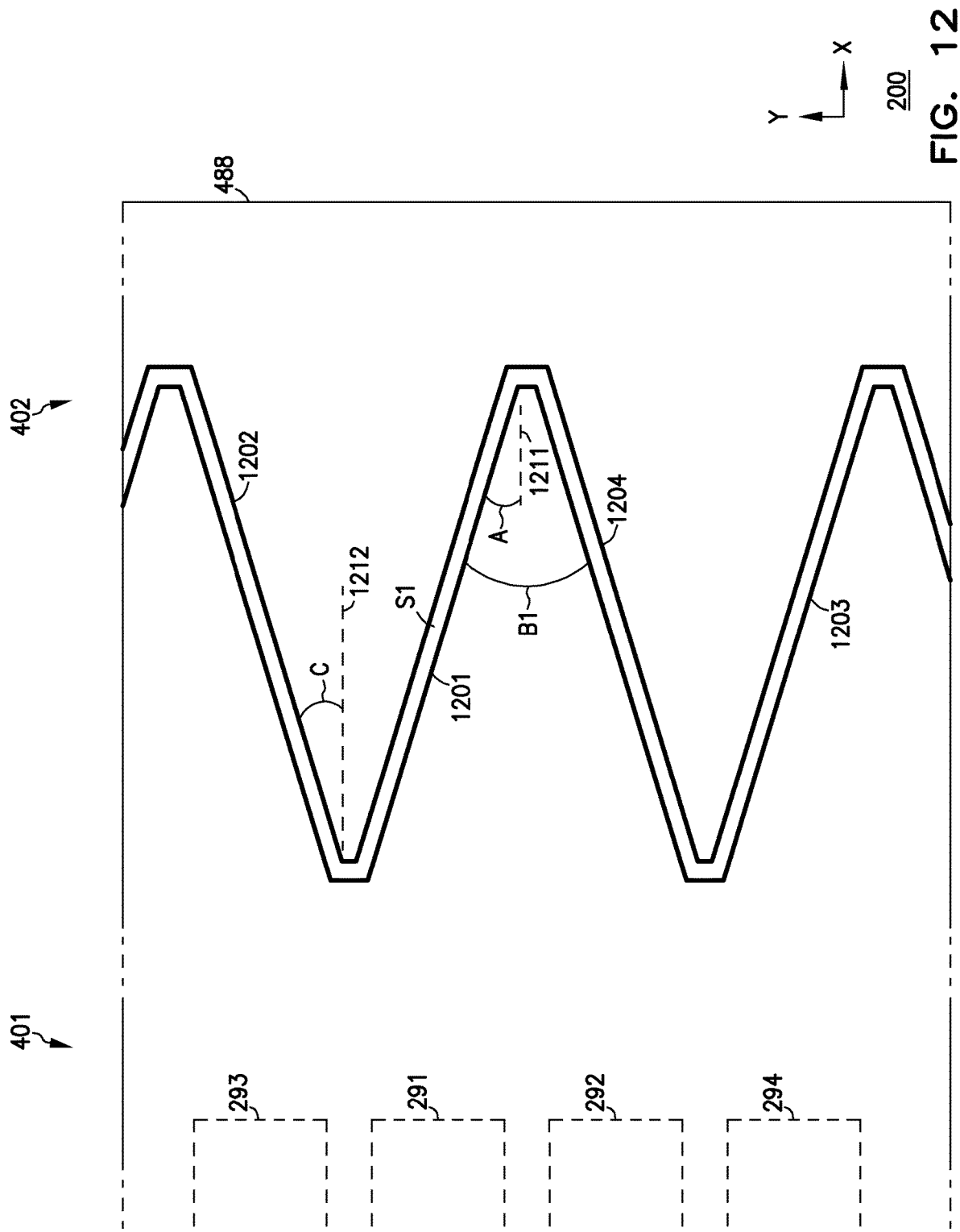
Figure 65:
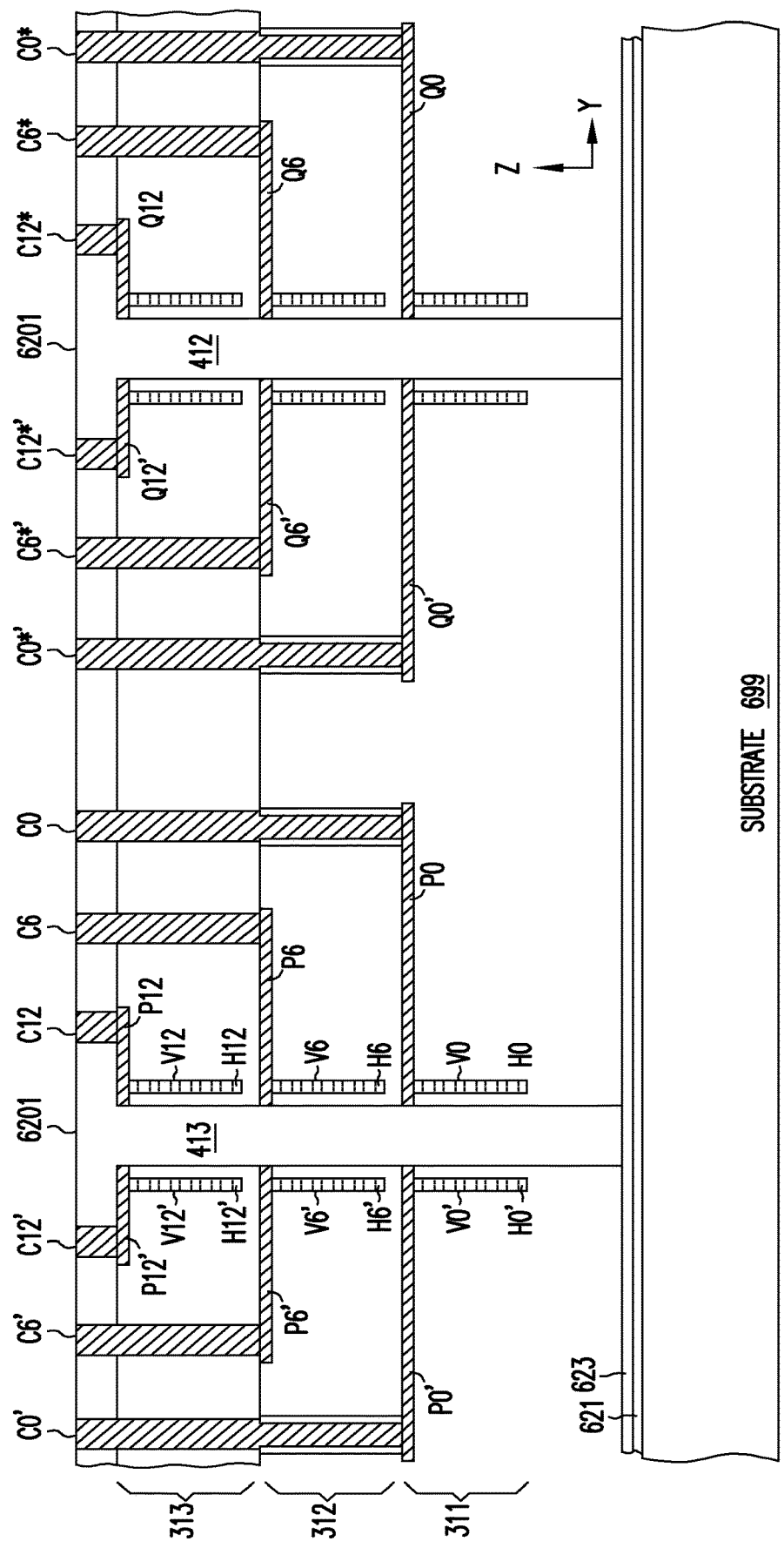

FIG. 12 through FIG. 65 show different views (e.g., top views and cross-sectional views) of elements (e.g., structures) of memory device 200 during processes of forming a memory device 200 of FIG. 2 through FIG. 11, according to some embodiments of the invention. As mentioned above, detailed description of the same element among the drawings (e.g., figures) described herein is not repeated in the description of a subsequent figure (or subsequent figures). For ease of viewing some of the figures described herein, some elements may be shown without cross-sectional lines (e.g., hatch lines) in some figures, but such elements may be shown with cross-sectional lines in some other figures. Furthers, some elements of memory device 200 may be omitted from a particular figure so as not to obscure the description of the element (or elements) being described in that particular figure. The dimensions of the elements shown in the drawings described herein are not scaled.

Moreover, one of ordinary skill in the art can recognize that the processes of forming memory device 200 (as described below with reference to FIG. 12 through FIG. 65) may include additional processes that are omitted from the description herein so as not to obscure the processes being described. For example, the processes of forming memory device 200 (as described below with reference to FIG. 12 through FIG. 65) can include forming at least one source select transistor (e.g., source select transistor 260 in FIG. 2) in portion 681 (FIG. 6) for a respective memory cell string 230 of memory device 200, and forming at least one drain select transistor (e.g., drain select transistor $261_0$ or transistor $261_1$ in FIG. 2) in portion 682 (FIG. 6A) for a respective memory cell string 230 of memory device 200. The processes of forming memory device 200 can also include forming at least one drain select gate (e.g., select gates $281_0$-$281_i$) and at least one source select gate (e.g., select gates 280 and 280') in portions 681 and 682 (FIG. 6A), respectively. However, in order not to obscure the embodiments described herein, the processes of forming the structures of portions 681 and 682 (FIG. 6A) of memory device 200 (e.g., forming source and drain select transistors and source and drain select gates) are omitted from the description of FIG. 12 through FIG. 65.

Figure 13:
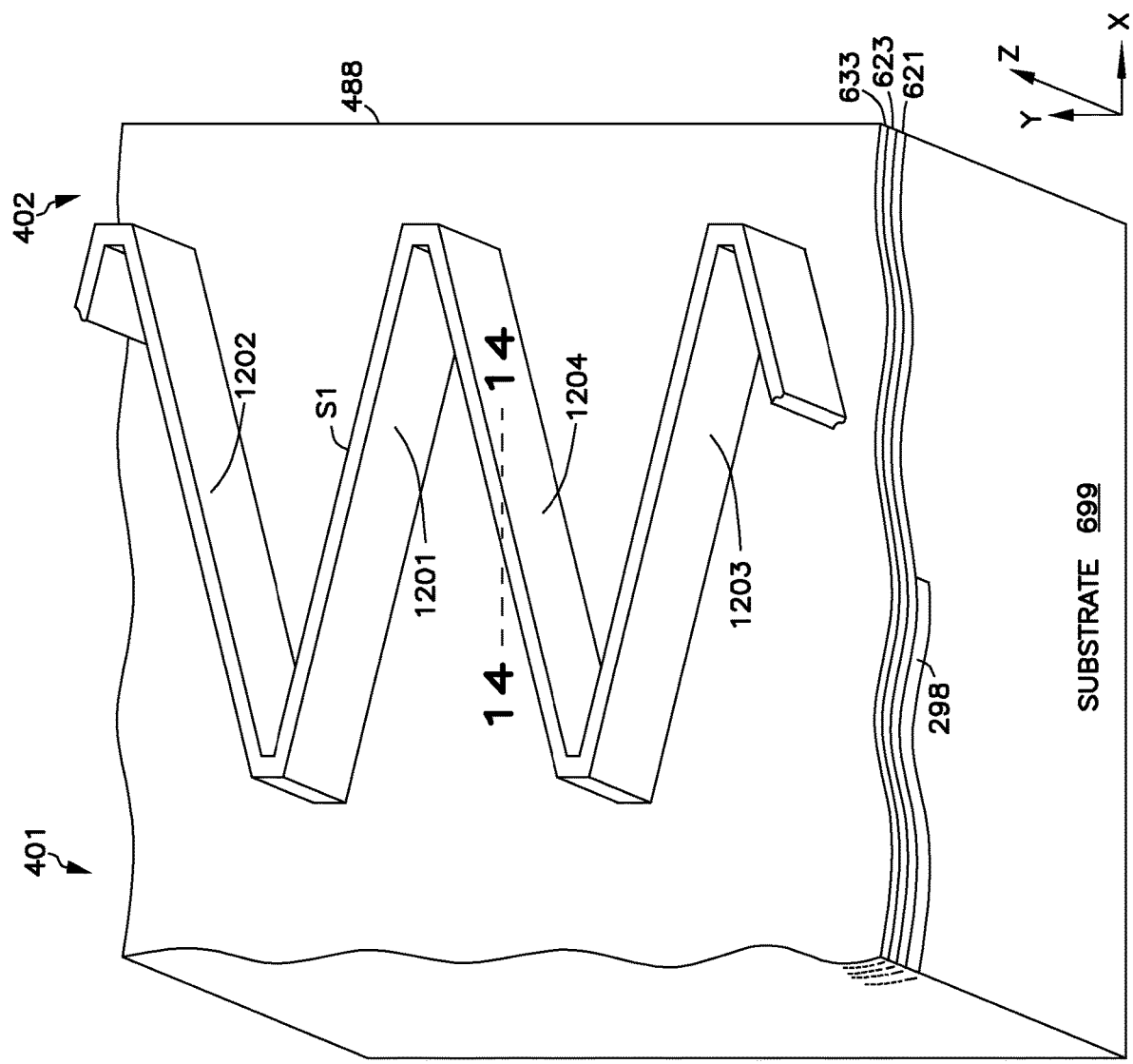
Figure 14:
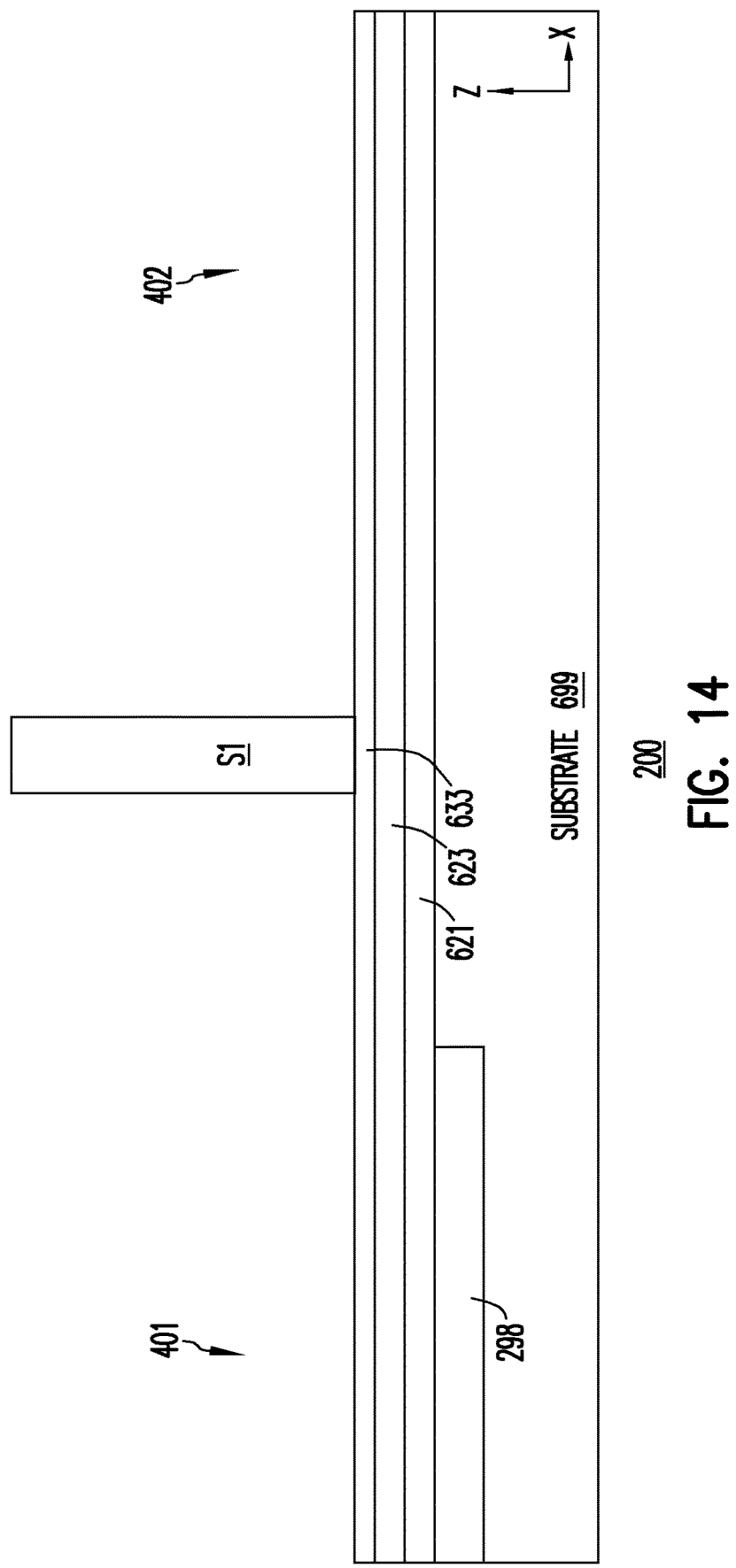

FIG. 12, FIG. 13, and FIG. 14 show different views of memory device 200 after formation of (after forming) spacer structure S1, source 298, etch stop structure 621, and dielectrics 623 and 633 over substrate 699. FIG. 12 shows a top view spacer structure S1 after it is formed at a location between portion (e.g., memory array portion) 401 and a portion (e.g., peripheral portion) 402 of memory device 200. FIG. 13 shows a perspective view of spacer structure S1. FIG. 14 shows a portion of spacer structure S1 along line (e.g., cross-section line) 14-14 of FIG. 13. As described below, additional spacer structures (e.g., spacer structure S2 in FIG. 33 and spacer structure S3 in FIG. 43) can be formed (at different times) over the spacer structure S1. Like spacer structure S3 (FIG. 43), spacer structure S1 in FIG. 12, FIG. 13, and FIG. 14 is an additional dielectric structure different from dielectric structures 411, 412, 413, 414, and 415 (FIG. 4).

As shown in FIG. 12 and FIG. 13, spacer structure S1 can be formed such that portion 401 can be on one side (e.g., left side) of spacer structure S1 and portion 402 can be on the other side (e.g., right side) of spacer structure S1. Spacer structure S1 can be formed to include portions (e.g., vertical panels) having walls (e.g., vertical walls) 1201, 1202, 1203, and 1204 extending outwardly (e.g., in the Z-direction) from substrate 699. The portions (which have walls 1201, 1202, 1203, and 1204) of spacer structure S1 can form a zigzag pattern. Walls 1201 and 1203 can be parallel to each other (e.g., run in the same direction). Walls 1202 and 1204 can be parallel to each other (e.g., run in the same direction).

As shown in FIG. 12, spacer structure S1 can include an angle A between a line 1211 and wall 1201, and angle C between a line 1212 and wall 1202. Lines 1211 and 1212 can be parallel to the X-direction. Angle A can be the same as angle A in FIG. 6D. For example, angle A can be greater than zero and less than 90 degrees. In FIG. 12, angle C can be the same as (e.g., equal to) or different from (e.g., unequal to) angle A. Angle C can be greater than zero and less than 90 degrees.

Forming source 298 (FIGS. 13 and 14) can include depositing a conductive material (e.g., conductively doped polysilicon) over substrate 699, or alternatively doping a portion of substrate 699 with a dopant material. Etch stop structure 621, dielectric 623 (e.g., silicon dioxide), and dielectric 633 (e.g., silicon nitride) can be formed after source 298 is formed. Dielectrics 623 and 633 can be different levels (e.g., separate layers) of dielectric materials (e.g., separate layers of silicon dioxide and silicon nitride).

Spacer structure S1 can be formed after source 298, etch stop structure 621, and dielectrics 623 and 633 are formed over substrate 699. Spacer structure S1 can include (e.g., can be formed from) a dielectric material (e.g., silicon dioxide). Forming spacer structure S1 can include forming a resist material (e.g., a layer of resist material, not shown) over dielectric 633. The resist material can have a height (in the Z-direction) at least equal to a height (in the Z-direction) of a corresponding deck (e.g., deck 311) of memory device 200. Then, forming spacer structure S1 can include exposing a spacer pattern (not shown) that can have a zigzag pattern of spacer structure S1 in the resist material. Then, a vertical sidewall (e.g., zigzag vertical sidewalls similar to wall 1201) can be formed on one side of the resist material. The process can continue with depositing a dielectric material (e.g., silicon dioxide) on the vertical sidewall of the resist material, and removing (e.g., by etching) a portion of the dielectric material to form spacer structure S1 that has walls (e.g., wall 1201) conforming to the vertical sidewall. Then, the process can include removing the resist material, such that spacer structure S1 can be a free-standing structure as shown in FIG. 13.

An alternative process of forming spacer structure S1 can include deposing an initial dielectric material (e.g., silicon dioxide) over dielectric 633, forming a resist pattern over the initial dielectric material. The resist pattern can have a shape (e.g., zigzag pattern) like the shape of spacer structure S1 in FIG. 12. Then, the alternative process can continue with removing (e.g., by dry etching) a portion of the initial dielectric material that is not under the resist pattern. The remaining portion of the initial dielectric material can become spacer structure S1. The alternative process can include removing the resist pattern (which is over spacer structure S1 after spacer structure S1 is formed), such that spacer structure S1 can be a free-standing structure as shown in FIG. 13.

As shown in FIG. 13, spacer structure S1 can be formed such that it can have a height (a dimension in the Z-direction) and thickness (a dimension in parallel to X-Y plane) strong enough to be mechanical stable. Such a structure of spacer structure S1 can allow additional levels (layers) of materials (e.g., the materials shown in FIG. 16) to be formed over spacer structure S1 without collapsing spacer structure S1.

Figure 15:
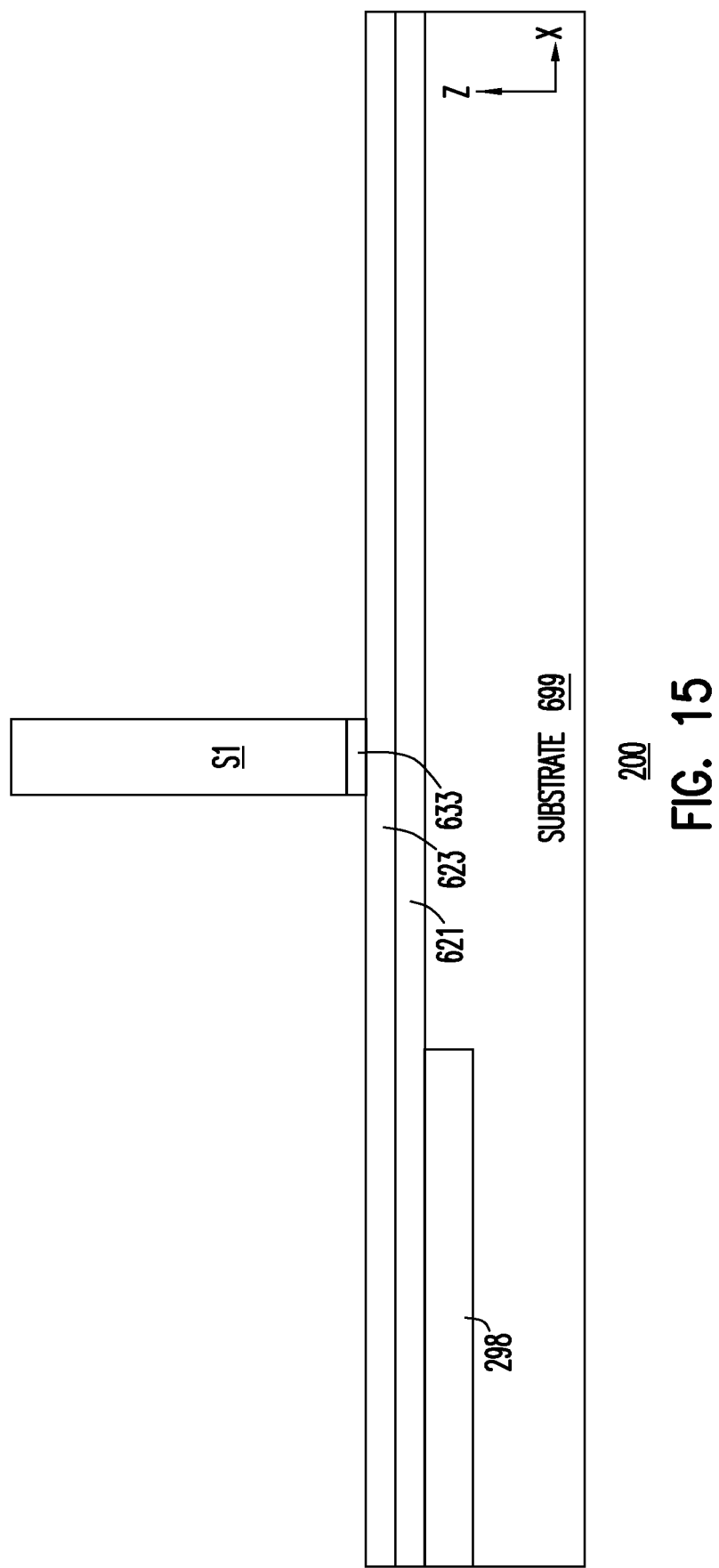

FIG. 15 shows memory device 200 after a portion of dielectric 633 of FIG. 14 is removed, leaving a remaining portion of dielectric 633 under spacer structure S1, as shown in FIG. 15. Removing a portion of dielectric 633 of FIG. 14 can include selectively etching dielectric 633 of FIG. 14, such that the portion of dielectric 633 that is uncovered by (e.g., not underneath) spacer structure S1 can be removed (e.g., etched) and the portion of dielectric 633 that is covered by (e.g., underneath) spacer structure S1 can remain (as shown in FIG. 15).

Figure 16:
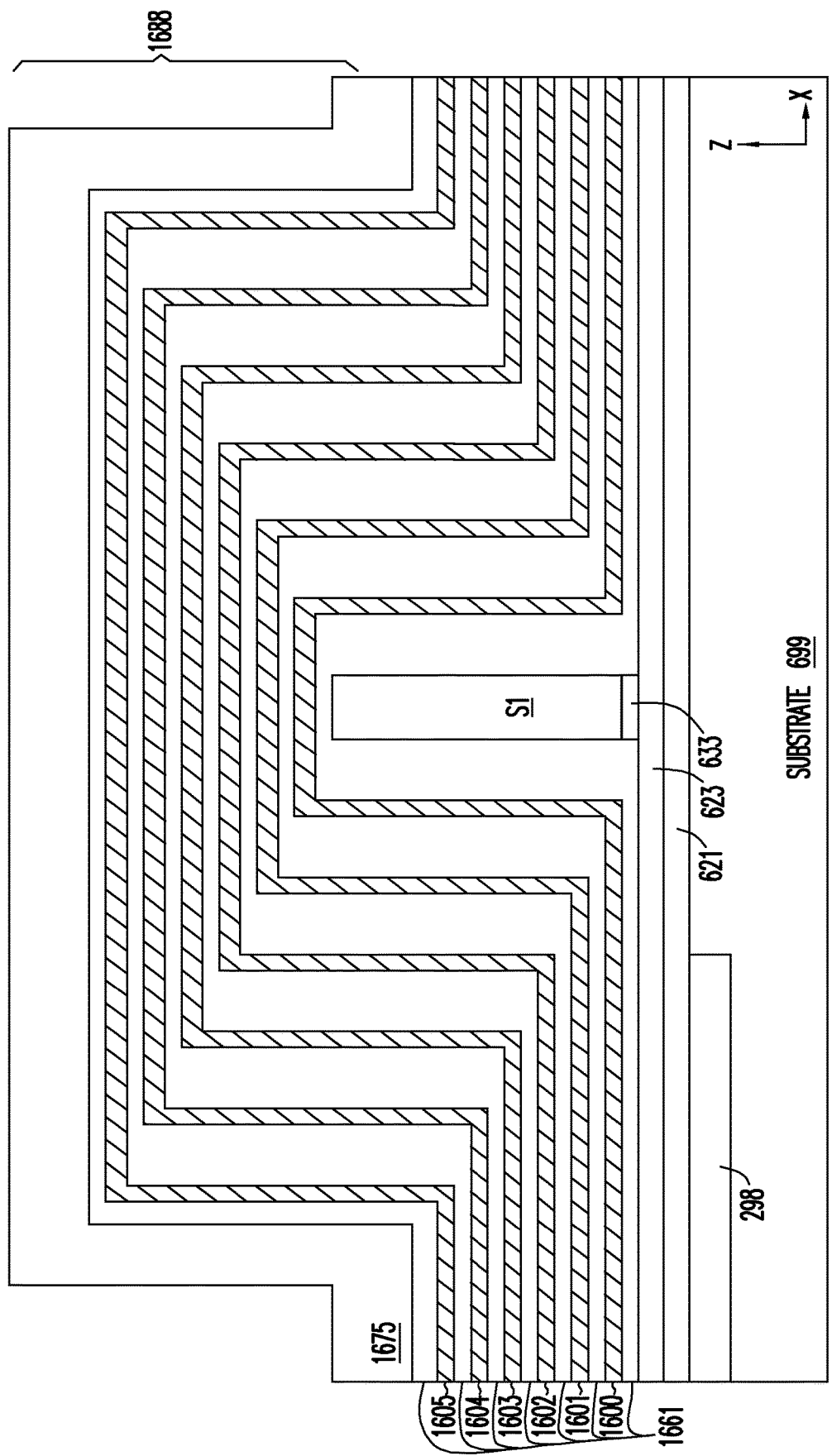

FIG. 16 shows memory device 200 after materials 1600, 1601, 1602, 1603, 1604, and 1605 (1600-1605), materials 1661, and a material 1675 are formed over spacer structure S1 and over dielectric 623. Materials 1600-1605 can include dielectric materials. Materials 1661 can include dielectric materials that are different from materials 1600-1605. For example, materials 1600-1605 can include nitride materials (e.g., silicon nitride) and materials 1661 can include oxide materials (e.g., silicon dioxide). Forming materials 1600-1605 and 1661 can include depositing (e.g., sequentially depositing) different dielectric materials (e.g., alternating levels (e.g., layers) of silicon dioxide and silicon nitride) to form materials 1600-1605 and 1661 as shown in FIG. 16. Material 1675 can include polysilicon or other materials (e.g., dielectric materials). Forming material 1675 can include depositing a material (e.g., polysilicon) over the alternating levels of materials 1600-1605 and 1661.

Material 1675 can be called a stop layer that can be used as a reference location where a subsequent process (described below) of forming memory device 200 can be stopped at material 1675. FIG. 16 shows a portion (e.g., top portion) 1688, which can be removed in a subsequent process.

Figure 17:
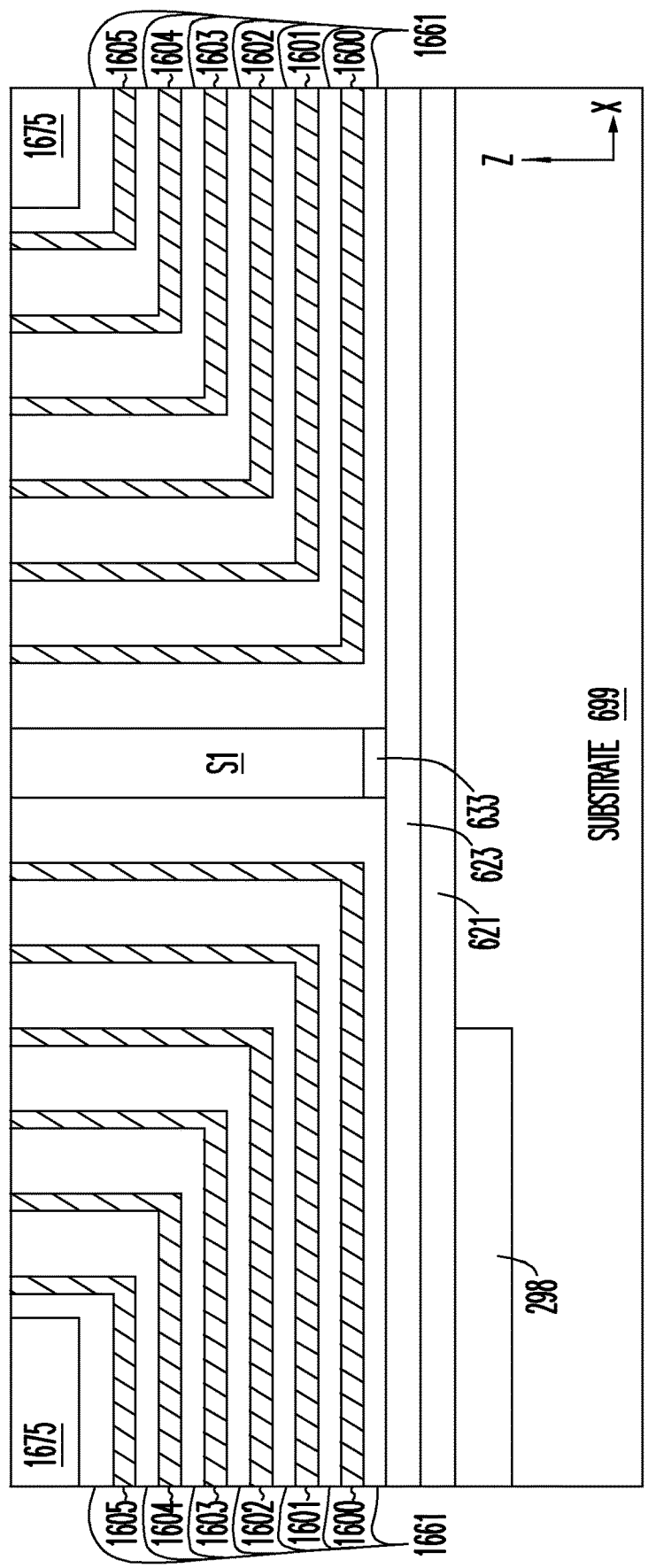

FIG. 17 shows memory device 200 including a remaining portion of materials 1675, 1601-1605, and 1661, and spacer structure S1 after portion 1688 (FIG. 16) is removed. Removing portion 1688 can include a chemical mechanical polishing planarization (CMP) process. The CMP process can stop at a portion of material 1675 as shown in FIG. 17. The processes associated with FIG. 17 can divide materials 1601-1605 and 1661 in to two portions on respective sides of spacer structure S1.

Figure 18:
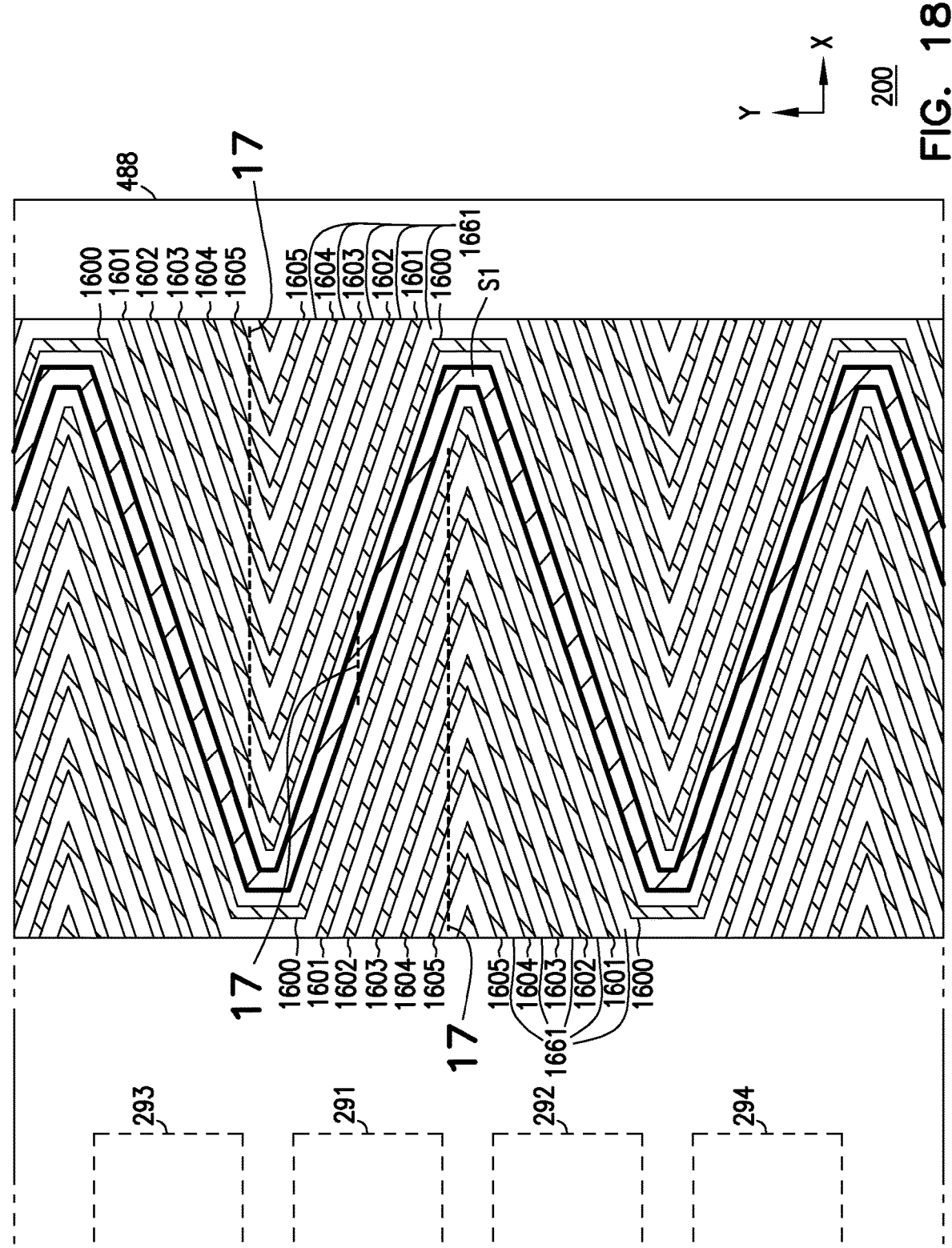

FIG. 18 shows a top view of memory device 200 of FIG. 17. Lines 17 in FIG. 18 indicates the locations of the different portions (e.g., three portions) that are combined (e.g., to create combined cross-sections) and shown in FIG. 17 as one view (for simplicity). As shown in FIG. 18, materials (e.g., silicon nitride) 1600-1605 and materials (e.g., silicon dioxide) 1661 are formed, such that materials 1600-1605 are interleaved with materials 1661. Materials 1600-1605 and 1661 are conformed to the shape (e.g., a zigzag pattern) of spacer structure S1, such that part of materials 1600-1605 and 1661 can include vertical walls (in the Z-direction) that are parallel with respect to portions of spacer structure S1.

Materials 1600-1605 and 1661 are also formed (e.g., blanked) at the locations of blocks 291, 292, 293, and 294. However, only a portion (e.g., portion next to spacer structure S1) of materials 1600-1605 and 1661 are shown in FIG. 18 for simplicity.

Figure 19:
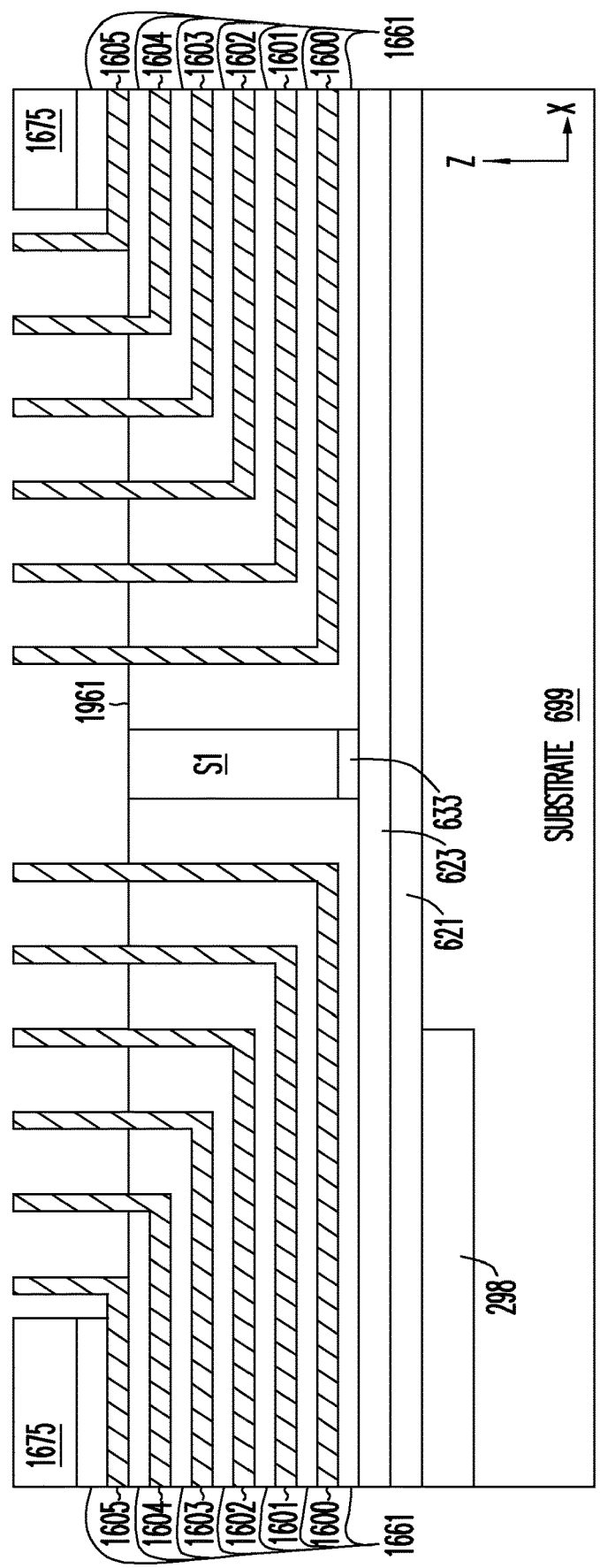

FIG. 19 shows memory device 200 of FIG. 17 after a portion of materials 1661 is removed (e.g., recessed in Z-direction). An etch process can be used to selectively remove a portion (e.g., top portion) of materials 1661. As shown in FIG. 19, the remaining portion of materials 1661 can have a top surface 1961 at the level (in the Z-direction) of the bottom of the material 1605. Material 1605 can be called the topmost material (e.g., topmost level (e.g., topmost tier) of silicon nitride) among materials (e.g., silicon nitride) 1600-1605. Thus, the processes associated with FIG. 19 can include removing a portion of materials 1661, such that a remaining portion of materials 1661 can have a surface (e.g., surface 1961) at the level of the bottom of a topmost level of a dielectric material (e.g., material 1605) among different levels of dielectric materials (e.g., materials 1600-1605).

Figure 20:
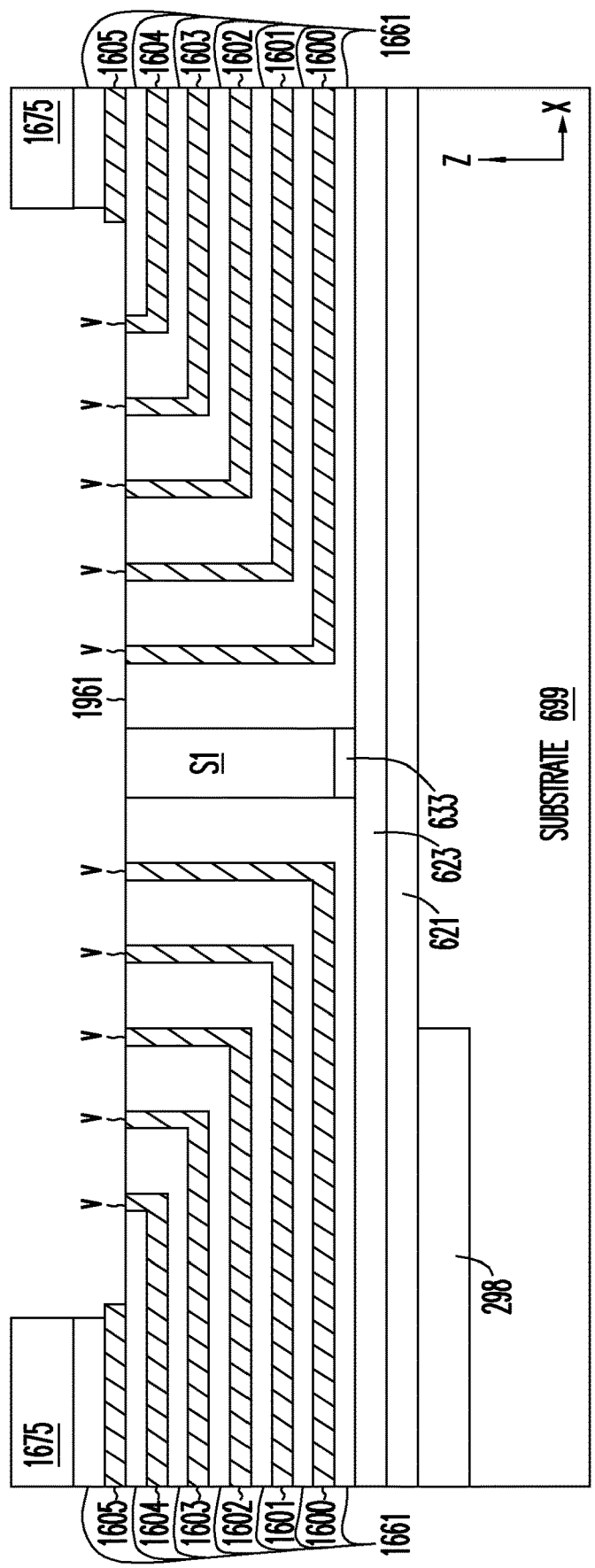

FIG. 20 shows memory device 200 of FIG. 19 after a portion of materials 1600-1605 is removed. An etch process can be used to selectively remove a portion (e.g., top portion above surface 1961) of materials 1600-1605. As shown in FIG. 20, materials 1600-1604 can have respective vertical rails V. In subsequent processes of forming memory device 200, materials 1600-1604 at the locations of vertical rails V can be selectively removed and then replaced with a conductive material (e.g., tungsten) to form respective conductive rails (e.g., conductive rails V0-V4 in FIG. 6A) of memory device 200.

Figure 21:
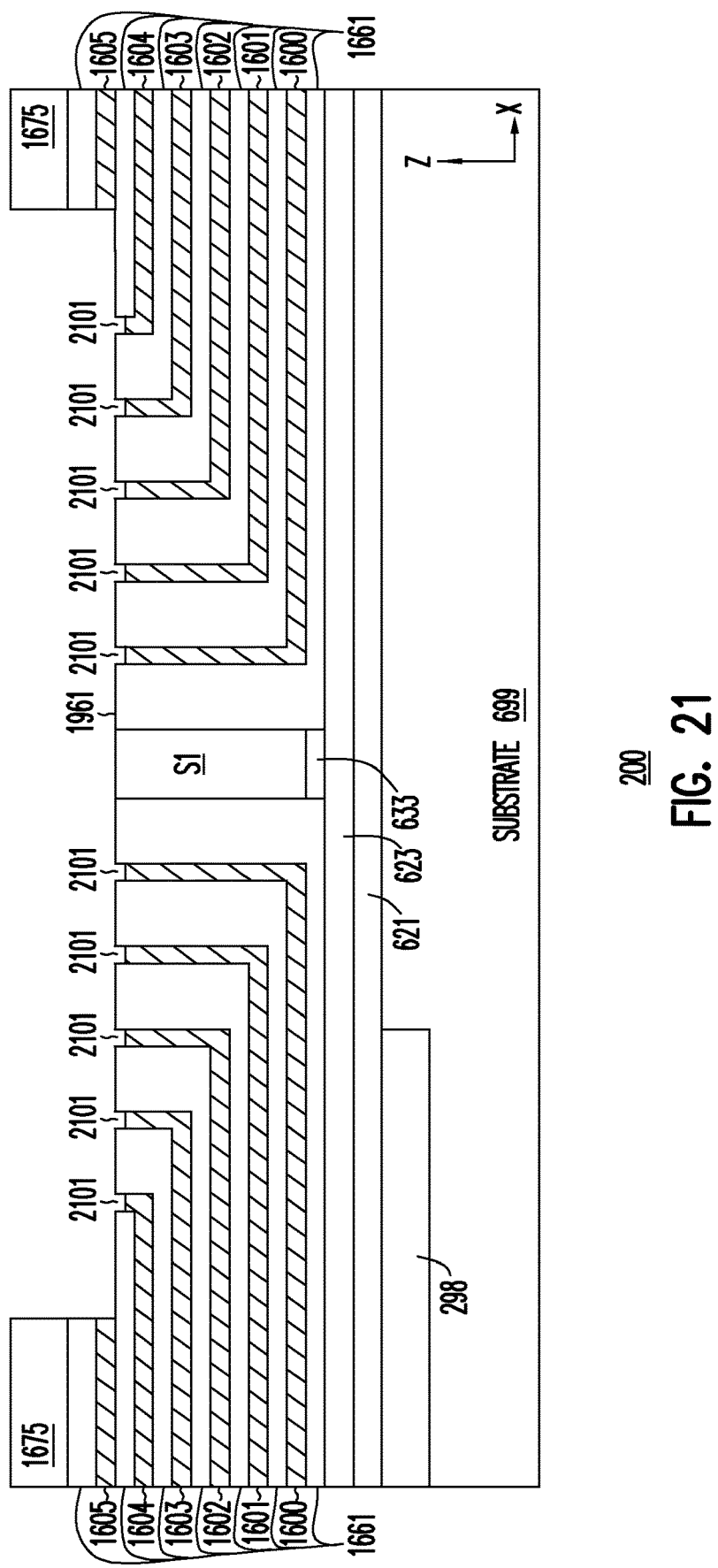

FIG. 21 shows memory device 200 after a portion of materials 1600-1604 at locations 2101 is removed (e.g., recessed in Z-direction). An etch process can be used to selectively remove the portion of materials 1600-1604 at locations 2101.

Figure 22:
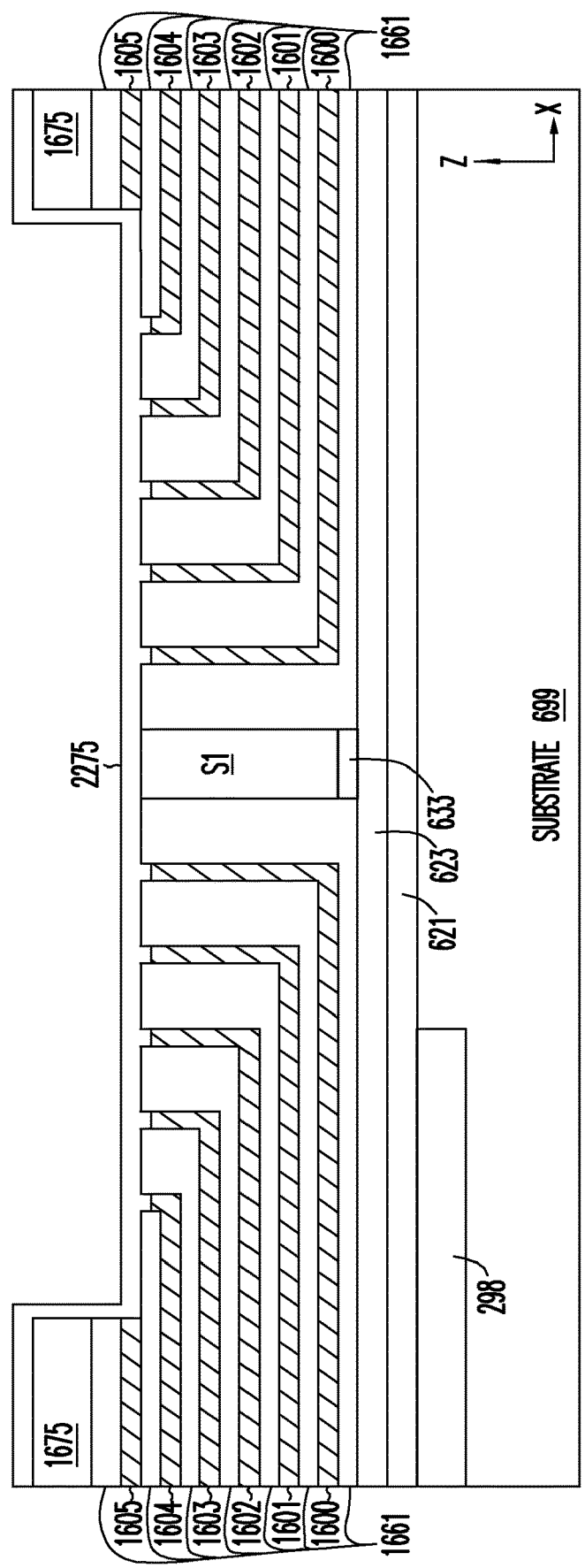

FIG. 22 shows memory device 200 after a material 2275 is formed. Material 2275 can be different from materials (e.g., silicon nitride) 1600-1605 and materials (e.g., silicon dioxide) 1661. For example, material 2275 can include polysilicon. Forming material 2275 can include a depositing a material (e.g., polysilicon) over materials 1600-1605, 1661, and 1675, as shown in FIG. 22.

Figure 23:
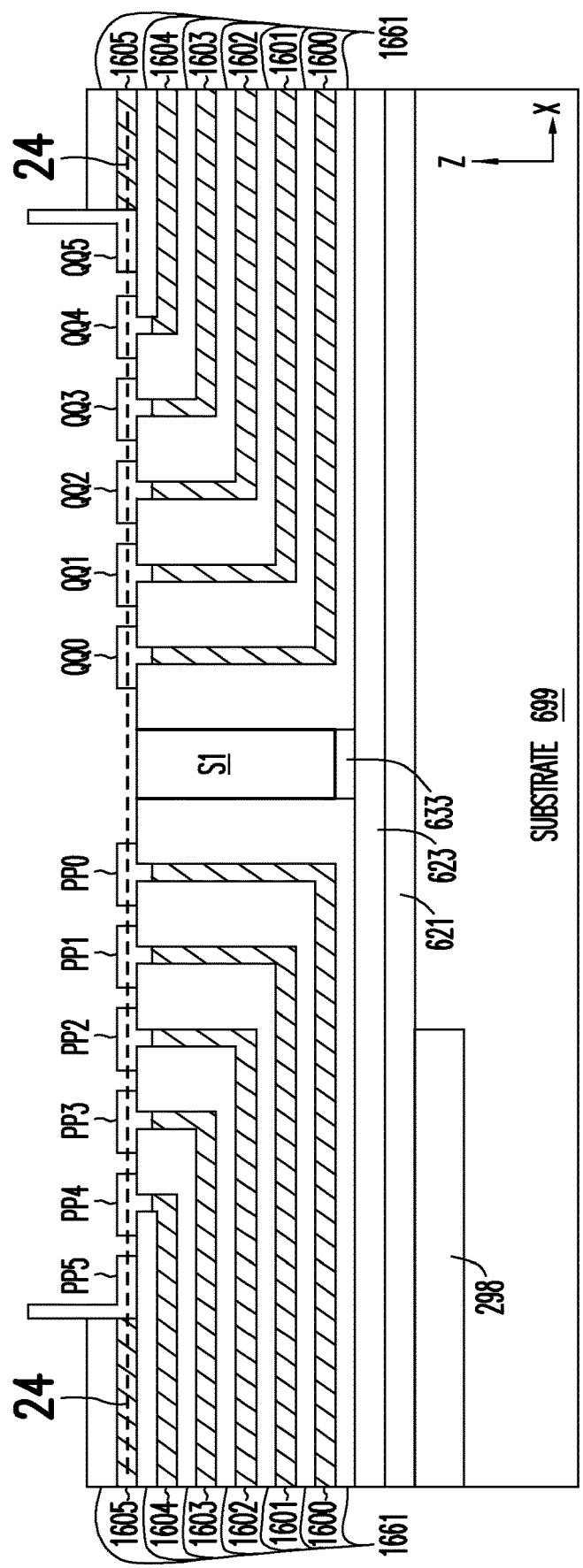

FIG. 23 shows memory device 200 after pad structures PP0, PP1, PP2, PP3, PP4, PP5 (PP0-PP5), QQ0, QQ1, QQ2, QQ3, QQ4, and QQ5 (QQ0-QQ5) are formed. Forming pad structures PP0-PP5 and QQ0-QQ5 can include removing (e.g., patterning) a portion of material 2275 in FIG. 22. The remaining portion of material 2275 forms pad structures PP0-PP5 and QQ0-QQ5 in FIG. 23. In FIG. 23, line 24-24 shows a location of a portion (e.g., cross-section) of memory device 200 that is shown in FIG. 24.

Figure 24:
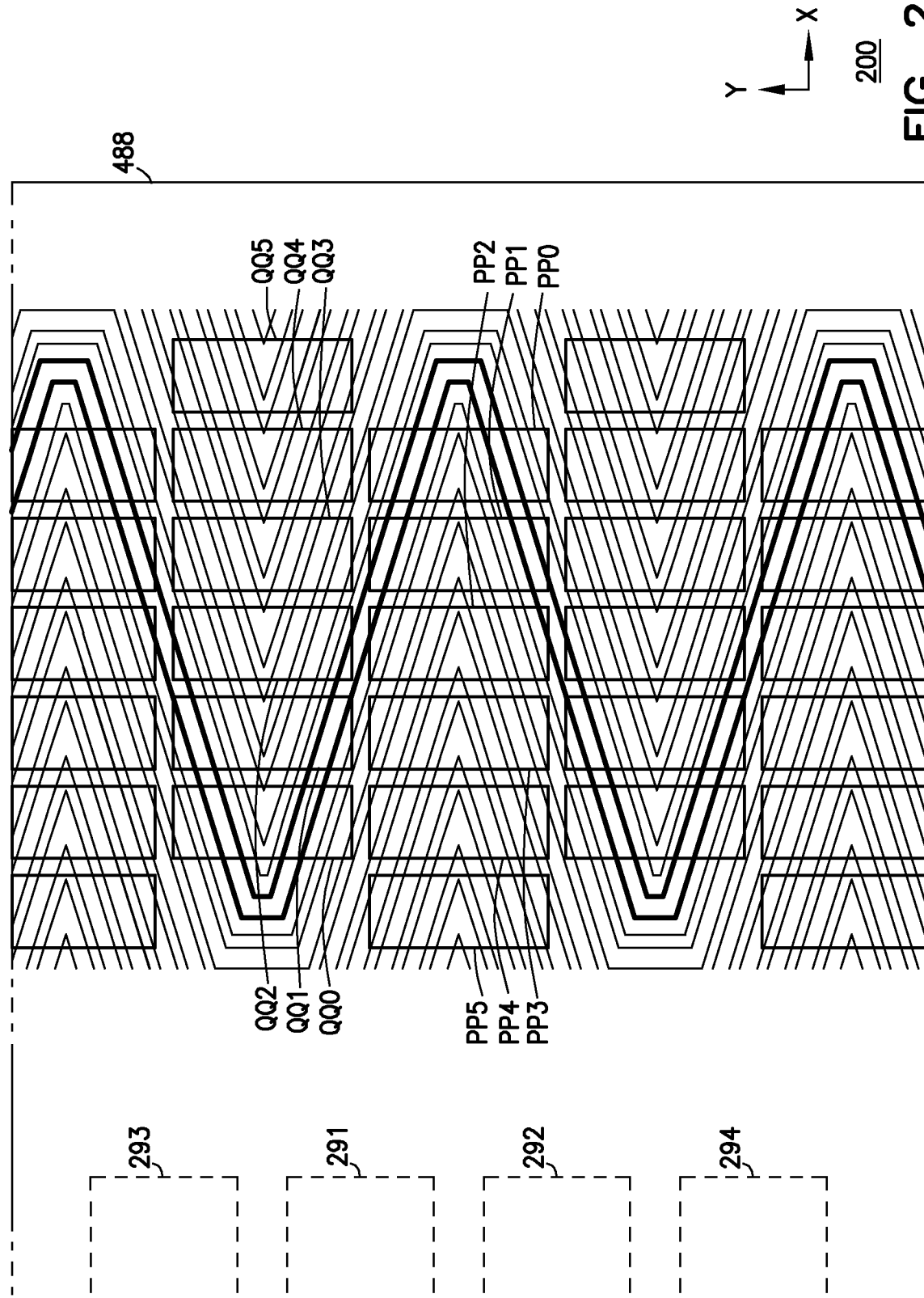

FIG. 24 shows a top view of a portion (e.g., cross-section) of memory device 200 at line 24-24 in FIG. 23 including pad structures PP0-PP5 and QQ0-QQ5 that are formed over (e.g., on top of) materials 1600-1605 and 1661. As shown in FIG. 24, each of pad structures PP0-PP5 and QQ0-QQ5 has a rectangular shape. FIG. 24 shows each of pad structures PP0-PP5 and QQ0-QQ5 (and the other pad structures (other rectangular boxes, not labeled)) having a rectangular shape as an example. However, each of pad structures PP0-PP5 and QQ0-QQ5 (and the other pad structures) can have a non-rectangular shape (e.g., a polygon and non-rectangular shape) as described in more detail with reference to FIG. 27, FIG. 27B, and FIG. 27C.

Figure 25:
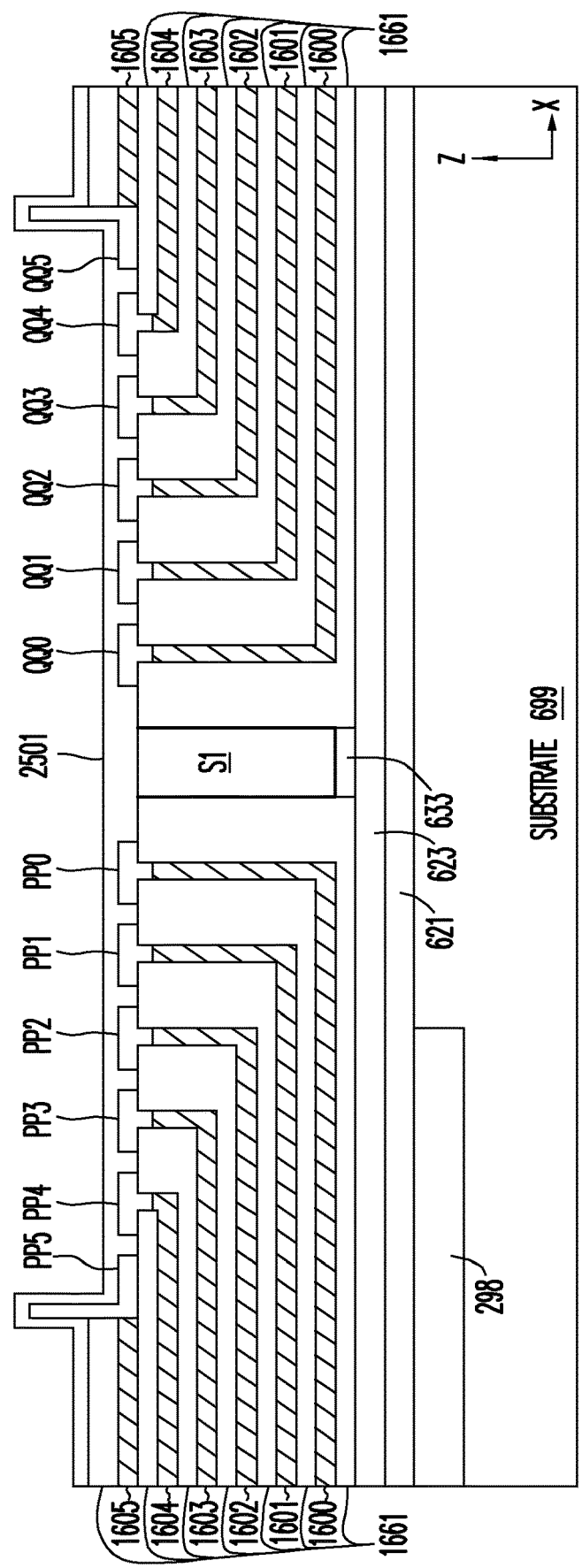

FIG. 25 shows memory device 200 after a material 2501 is formed. Material 2501 can include a dielectric material (e.g., silicon dioxide). Forming material 2501 can including depositing a dielectric material (e.g., silicon dioxide) over pad structures PP0-PP5 and QQ0-QQ5, and spacer structure S1 of memory device 200.

Figure 26A:
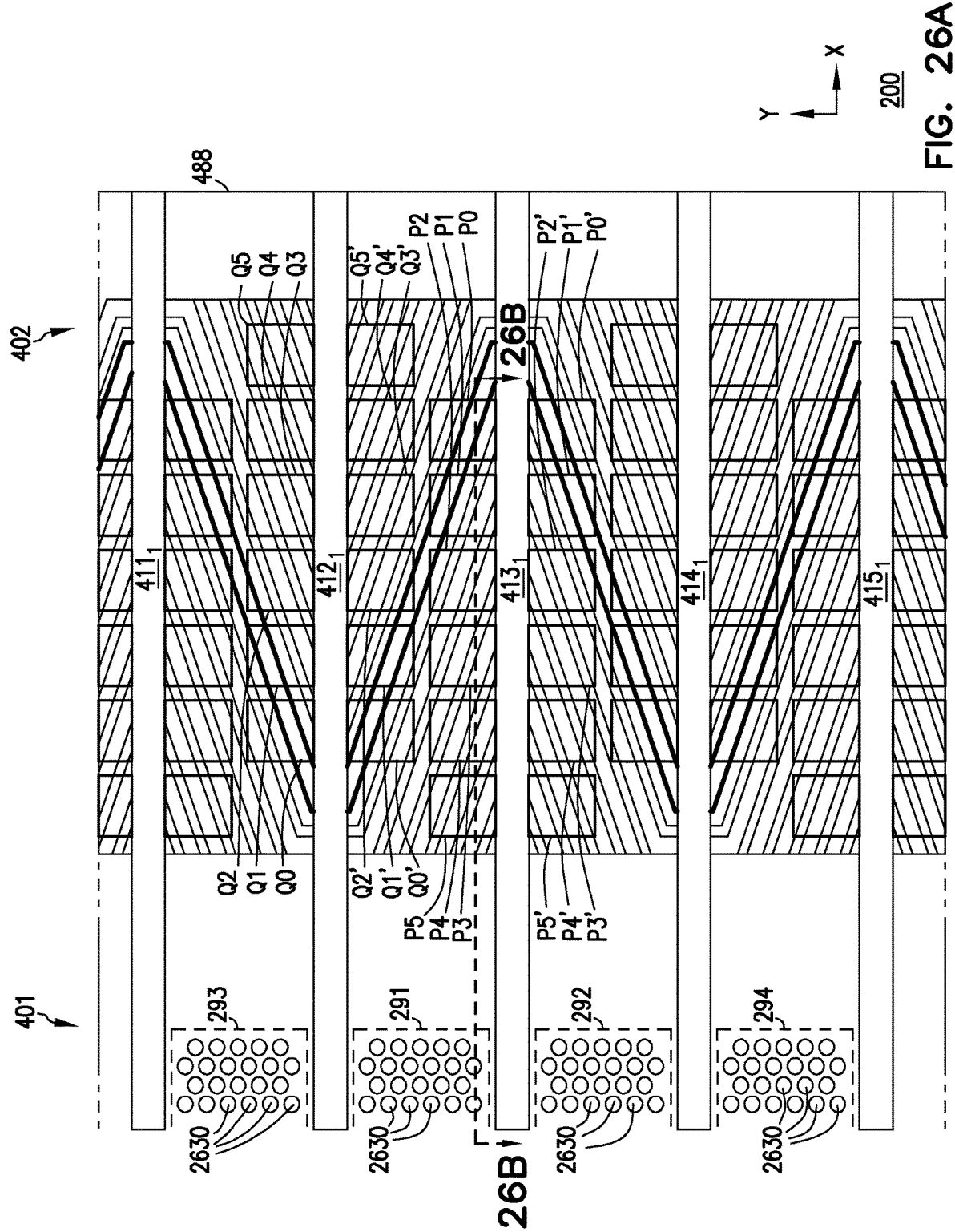
Figure 26B:
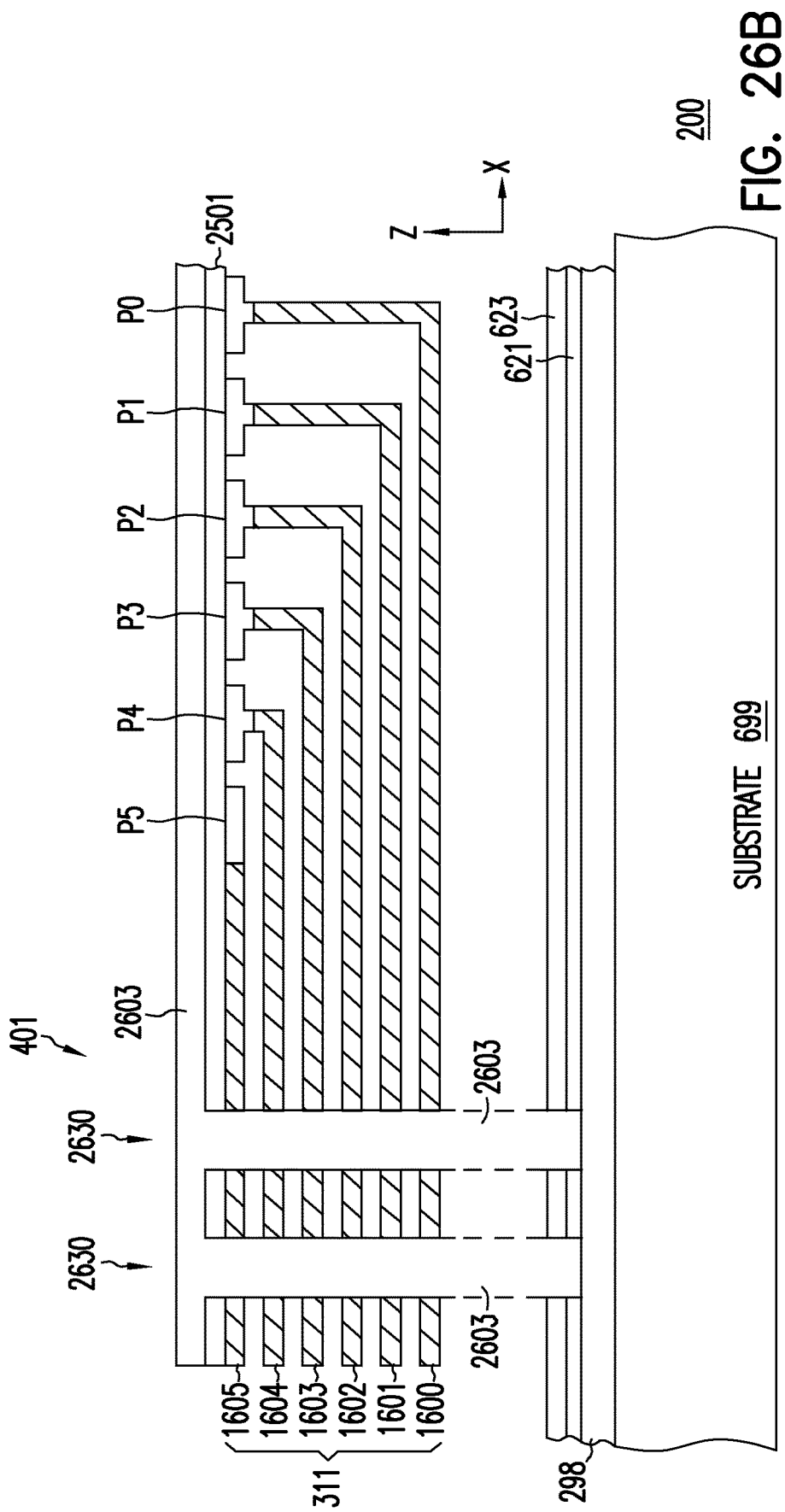

FIG. 26A shows a top view of memory device 200 after formation of pillar structures (e.g., holes or openings) 2630; slits (e.g., trenches or cuts) $411_1$, $412_1$, $413_1$, $414_1$, and $415_1$; conductive pads P0, P1, P2, P3, P4, P5 (P0-P5), P0', P1', P2', P3', P4', and P5' (P0'-P5'), Q0, Q1, Q2, Q3, Q4, and Q5 (Q0-Q5), Q0', Q1', Q2', Q3', Q4', and Q5'(Q0'-Q5'). Pillar structures 2630 can form portions (e.g., portions at deck 311) of respective pillars 530 (FIG. 6). As described above with reference to FIG. 6, each of pillars 530 can be part of a memory cell string (e.g., memory cell string 230 in FIG. 6) of memory device 200. In FIG. 26A, line 26B-26B shows a portion (e.g., a cross-section) of memory device 200 that is shown in FIG. 26B.

In FIG. 26A, the locations of slits $411_1$, $412_1$, $413_1$, $414_1$, and $415_1$ shown can be part of the locations of dielectric structures 411, 412, 413, 414, and 415, respectively, shown in FIG. 4 and FIG. 11. As shown in FIG. 26A, slits $411_1$, $412_1$, $413_1$, $414_1$, and $415_1$ can be formed in portion (e.g., memory array portion) 401 and portion (e.g., peripheral portion) 402 of memory device 200. Slits $411_1$, $412_1$, $413_1$, $414_1$, and $415_1$ can be formed using an etch process to remove the materials (e.g., a portion of materials 1600-1605 and 1661) at the locations of slits $411_1$, $412_1$, $413_1$, $414_1$, and $415_1$. Each of slits $411_1$, $412_1$, $413_1$, $414_1$, and $415_1$ can have a length in X-direction from portion 401 to portion 402. Each of slits $411_1$, $412_1$, $413_1$, $414_1$, and $415_1$ can have a depth (a height) in the Z-direction, such that the bottom of each of slits $411_1$, $412_1$, $413_1$, $414_1$, and $415_1$ may be at etch stop structure 621.

In FIG. 26A, conductive pads P0-P5 and P0'-P5' can be formed from pad structures PP0-PP5 (FIG. 24) when slit $413_1$ is formed. For example, as shown in FIG. 26A, forming slit $413_1$ can remove (e.g., cut) a portion (e.g., the middle) of each of pad structures PP0-PP5 (FIG. 24) at the location of slit $413_1$. A remaining portion of pad structures PP0-PP5 on one side of slit $413_1$ (in the Y-direction) can form conductive pads P0-P5. Another remaining portion of pad structures PP0-PP5 on the other side (in the Y-direction) of slit $413_1$ can form conductive pads P0'-P5'. FIG. 26A shows conductive pads P0-P5 and P0'-P5' having a specific shape (e.g., a rectangular shape or "I" shape) as an example. However, some or all of conductive pads P0-P5 and P0'-P5' can have a different shape (e.g., an L shape (or an L-like shape)) as shown in FIG. 6G through FIG. 6I. FIG. 27A, FIG. 27B, FIG. 27C, FIG. 27D, and FIG. 27E (described in more detail below) show pattern structures that can be used to form the shape of conductive pads P0-P5 and P0'-P5' in FIG. 26A.

Similarly, conductive pads Q0-Q5 and Q0'-Q5' in FIG. 26A can be formed from pad structures QQ0-QQ5 (FIG. 24) when slit $412_1$ is formed. For example, as shown in FIG. 26A, forming slit $412_1$ can remove (e.g., cut) a portion (e.g., the middle) of each of pad structures QQ0-QQ5 (FIG. 24) at the location of slit $412_1$. A remaining portion of pad structures QQ0-QQ5 on one side (in the Y-direction) of slit $412_1$ can form conductive pads Q0-Q5. Another remaining portion of pad structures QQ0-QQ5 on the other side (in the Y-direction) of slit $412_1$ can form conductive pads Q0'-Q5'. Like conductive pads P0-P5 and P0'-P5', conductive pads Q0-Q5 and Q0'-Q5' can have a different shape (e.g., the shape shown in FIG. 6G through FIG. 6I).

FIG. 26B shows a portion of memory device 200 along line 26B-26B in FIG. 26A. As shown in FIG. 26B, pillar structures 2630 can have respective lengths extending in the Z-direction through materials (e.g., silicon nitride) 1600-1605 and materials (e.g., silicon dioxide) 1661. Forming pillar structures 2630 can include removing (e.g., by etching) materials 1600-1605 and 1661 at the locations of pillar structures 2630 to form voids (e.g., holes or openings) at pillar structures 2630. Then, the processes associated with FIG. 26B can include forming (e.g., depositing) a material (e.g., sacrificial material) 2603. Material 2603 can fill pillar structures 2630. Material 2603 can include a material (or a combination of materials) that can be selectively removed (e.g., etched) relative to materials 1600-1605 (e.g., silicon nitride) and materials 1661 (e.g., silicon dioxide). Examples for material 2603 include silicate glass (e.g., Borophosphosilicate glass (BPSG)), tungsten, and aluminum oxide.

FIG. 27A, FIG. 27B, FIG. 27C, FIG. 27D, and FIG. 27E show different patterns (e.g., reticles) 2705A, 2705B, 2705C, 2705D, and 2705E, respectively, that can be used to form different structures (e.g., shapes) of the conductive pads (e.g., conductive pads P0-P5, P0'-P5', Q0-Q5, and Q0'-Q5' of FIG. 26A) of memory device 200. One of patterns 2705A, 2705B, 2705C, 2705D, and 2705E can be selected to form the structures of the conductive pads. The selection can be based on variation that may occur in the locations of the vertical rails (e.g., vertical rails V in FIG. 20) in the processes associated with FIG. 20. Such a variation can be determined from a measurement that can be performed after formation of vertical rails V in FIG. 20. The measurement can provide information that indicates the measured locations of vertical rails V in FIG. 20. The measured locations of vertical rails V can be compared with target locations (e.g., expected locations) of vertical rails V. The result from the comparison can be used to select one of the patterns 2705A, 2705B, 2705C, 2705D, and 2705E to form the structures of the conductive pads (e.g., conductive P0-P5, P0'-P5', Q0-Q5, and Q0'-Q5' of FIG. 26A) of memory device 200.

In FIG. 27A, FIG. 27B, FIG. 27C, FIG. 27D, and FIG. 27E, the locations of vertical rails V in patterns 2705A, 2705B, 2705C, 2705D, and 2705E can be based on the measured locations of vertical rails V in FIG. 20. The location of conductive contacts C can be the locations of some of conductive contacts (e.g., C0-C5 in FIG. 5 and FIG. 6A) of memory device 200 that will be formed after formation of conductive pads (e.g., conductive pads P0-P5 in FIG. 26A) of memory device 200. The locations of conductive contacts C in FIG. 27A, FIG. 27B can be predetermined (e.g., fixed) locations. Pad patterns P27A, P27B, P27C, P27D, and P27E can be used to form conductive pads (e.g., conductive pads P0-P5 in FIG. 26A) of memory device 200.

As described above, the processes associated with FIG. 20 can include measuring the locations of vertical rails V to obtain information that can be used to determine an offset (e.g., a distance) of the locations of vertical rails V relative to the locations of conductive contacts C. For example, the measured locations of vertical rails V in FIG. 20 can be compared with target locations (e.g., expected locations) of vertical rails V. Information from the result of the comparison can be used to determine whether there is a variation (e.g., an offset) in the location of a particular vertical rail V relative to a target location (e.g., an expected or predetermined location) of that particular vertical rail V. The target location of each vertical rail V can be relative to a reference location (e.g., reference coordinate in the X-Y plane). Line 2727 in FIG. 27A, FIG. 27B, FIG. 27C, FIG. 27D, and FIG. 27E can be part of such a reference location. Information (e.g., variations) from the result of the comparison can be recorded and used (e.g., feedforward) to generate one of patterns 2705A, 2705B, 2705C, 2705D, and 2705E. The generated pattern (e.g., one of patterns 2705A, 2705B, 2705C, 2705D, and 2705E) based on the measurement of the locations of vertical rails V can be used to form conductive pads P0-P5, P0'-P5', Q0-Q5, and Q0'-Q5' in FIG. 26A.

In the example shown in FIG. 27A, the locations (e.g., measured locations) of vertical rails V may align with line 2727 (e.g., part of a reference location). This can indicate that the locations (e.g., measured locations) of vertical rails V are the same (e.g., substantially the same) as expected locations, such that the offset (offset from a reference location) can be relatively small (or zero). In this example, pattern 2705A can be selected to form the conductive pads (e.g., conductive pads P0-P5, P0'-P5', Q0-Q5, and Q0'-Q5' in FIG. 26A) of memory device 200. Thus, in this example, the structures of the conductive pads can have the structures (e.g., shapes) of pad patterns P27A of pattern 2705A of FIG. 27A. FIG. 27A shows an equal distance between the locations of adjacent (neighbor) vertical rails V. However, the distance between the locations of different adjacent vertical rails can be different.

In the example of FIG. 27B, the locations (e.g., measured locations) of vertical rails V may shift in one direction (e.g., shift right) from line 2727 (e.g., part of a reference location) as shown in FIG. 27B. In this example, pattern 2705B can be selected to form the conductive pads (e.g., conductive pads P0-P5, P0'-P5', Q0-Q5, and Q0'-Q5' in FIG. 26A) of memory device 200. Thus, in this example, the structures of the conductive pads can have the structures (e.g., shapes) of pad patterns P27B of pattern 2705B of FIG. 27B. FIG. 27B shows an equal distance between the locations of adjacent (neighbor) vertical rails V. However, the distance between the locations of different adjacent vertical rails can be different, depending on the variations in the shift (e.g., shift right) of vertical rails V in FIG. 20. For example, in FIG. 27B, distance D1 can correspond to an offset (relatively line 2727) between the location of contact C and the location of vertical rail V within a corresponding pad pattern P272B. This offset (e.g., distance D1) can be called an offset in a C-V pair (offset in the locations of contact C and a corresponding vertical rail V). FIG. 27B shows an example where the offset (e.g., distance D1) in one C-V pair can be the same as the offset in another C-V pair. However, the offset in one C-V pair can be different (e.g., unequal distance) from the offset in another C-V pair, as shown in the example of FIG. 27E (described in more detail below with reference to FIG. 27E).

In the example of FIG. 27C, the locations (e.g., measured locations) of vertical rails V may shift in another direction (e.g., shift left) from line 2727 (e.g., part of a reference location) as shown in FIG. 27C. In this example, pattern 2705C can be selected to form the conductive pads (e.g., conductive pads P0-P5, P0'-P5', Q0-Q5, and Q0'-Q5' in FIG. 26A) of memory device 200. Thus, in this example, the structures of the conductive pads can have the structures (e.g., shapes) of pad patterns P27C of pattern 2705C of FIG. 27C. FIG. 27C shows an equal distance between the locations of adjacent (neighbor) vertical rails V. However, the distance between the locations of different adjacent vertical rails can be different, depending on the variations in the shift (e.g., shift left) of the vertical rails V in FIG. 20. For example, FIG. 27C shows an example where the offset (e.g., distance D2) in one C-V pair can be the same as the offset in another C-V pair. However, the offset in one C-V pair can be different (e.g., unequal distance) from the offset in another C-V pair, as shown in the example of FIG. 27D.

FIG. 27D shows an example where the offset in one C-V pair can be different (e.g., unequal distance) from the offset in another C-V pair. The reasons for the different offsets can be caused by thickness variation (e.g., in the X-direction) among the materials (e.g., materials 1600-1605 in FIG. 16) and thickness variation (e.g., in the X-direction) among the materials (e.g., materials 1661 in FIG. 16). Such variations can be processive and multiplied during forming (e.g., during sequential deposition) of one material (e.g., among material 1600-1605 and 1661) to the next material (e.g., among material 1600-1605 and 1661). These variations can cause the distances among vertical rails V (FIG. 20), which are formed based on materials 1600-1605, to vary in the same processive and multiplied manner. Thus, in comparison with a reference (e.g., known) location (e.g., line 2727 associated with contact C in FIG. 27D) for each vertical rail V, offsets among C-V pairs can be processive and multiplied. For example, in FIG. 27D, the offset in a C-V pair can correspond to one of distances D3, D4, D5, D6, and D7. As shown in FIG. 27D, distances D3, D4, D5, D6, and D7 are different (unequal) among each other (e.g., different in a processive and multiplied manner). Thus, the offset (e.g., distance D3) in one C-V pair can be different from the offset (e.g., distance D4) in another C-V pair. Therefore, as shown in FIG. 27D, the structures (e.g., shapes) of pad patterns P27D of pattern 2705D can be different from among each other (e.g., pad patterns P27D have different shapes). Thus, the structures (e.g., shapes) of the conductive pads (e.g., conductive pads P0-P5 or conductive pads Q0-Q5, which can be patterned based on pad patterns P27D) in the same deck (deck 311) of memory device 200 can have the shapes of pad patterns P27D of FIG. 27D. FIG. 27D shows an example where the locations of vertical rails V having offsets in one direction relative to a reference location (e.g., to the left of reference line 2727). However, the locations of vertical rails V can have offsets in another direction (e.g., opposite direction (e.g., to the right of line 2727) relative to a reference location, as shown in FIG. 27E.

FIG. 27E shows another example where the offset in one C-V pair can be different (e.g., unequal distance) from the offset in another C-V pair. The offset in a C-V pair can correspond to one of distances D8, D9, D10, D11, and D12. As shown in FIG. 27E, distances D8, D9, D10, D11, and D12 are different (unequal) from among each other (e.g., unequal distances in a processive and multiplied manner). Thus, the offset (e.g., distance D8) in one C-V pair can be different from the offset (e.g., distance D9) in another C-V pair. Therefore, as shown in FIG. 27E, the structures (e.g., shapes) of pad patterns P27E can be different from among each other (e.g., pad patterns P27E have different shapes). Thus, the structures (e.g., shapes) of the conductive pads (e.g., conductive pads P0-P5 or conductive pads Q0-Q5, which can be patterned based on pad patterns P27E) in the same deck (deck 311) of memory device 200 can have the shapes of pad patterns P27E of FIG. 27E.

As described above, the locations of vertical rails V in FIG. 20 can be measured and compared with expected locations. Based on the comparison, one of patterns 2705A, 2705B, 2705C, 2705D, and 2705E can be generated and used to form the conductive pads (e.g., conductive pads P0-P5, P0'-P5', Q0-Q5, and Q0'-Q5' in FIG. 26A) of memory device 200.

As shown in FIG. 6A, decks 311, 312, and 313 have different conductive pads P0-P5, P6-P11, and P12-P17, respectively. Thus, different patterns (among patterns 2705A, 2705B, 2705C, 2705D, and 2705E) can be used to form the conductive pads for different decks, depending on the variations of vertical rails V of decks 311, 312, and 313. However, the same pattern (among patterns 2705A, 2705B, 2705C, 2705D, and 2705E) can be used to form the conductive pads for decks 311, 312, and 313 if decks 311, 312, and 313 have the same variation in the vertical rails.

Figure 28:
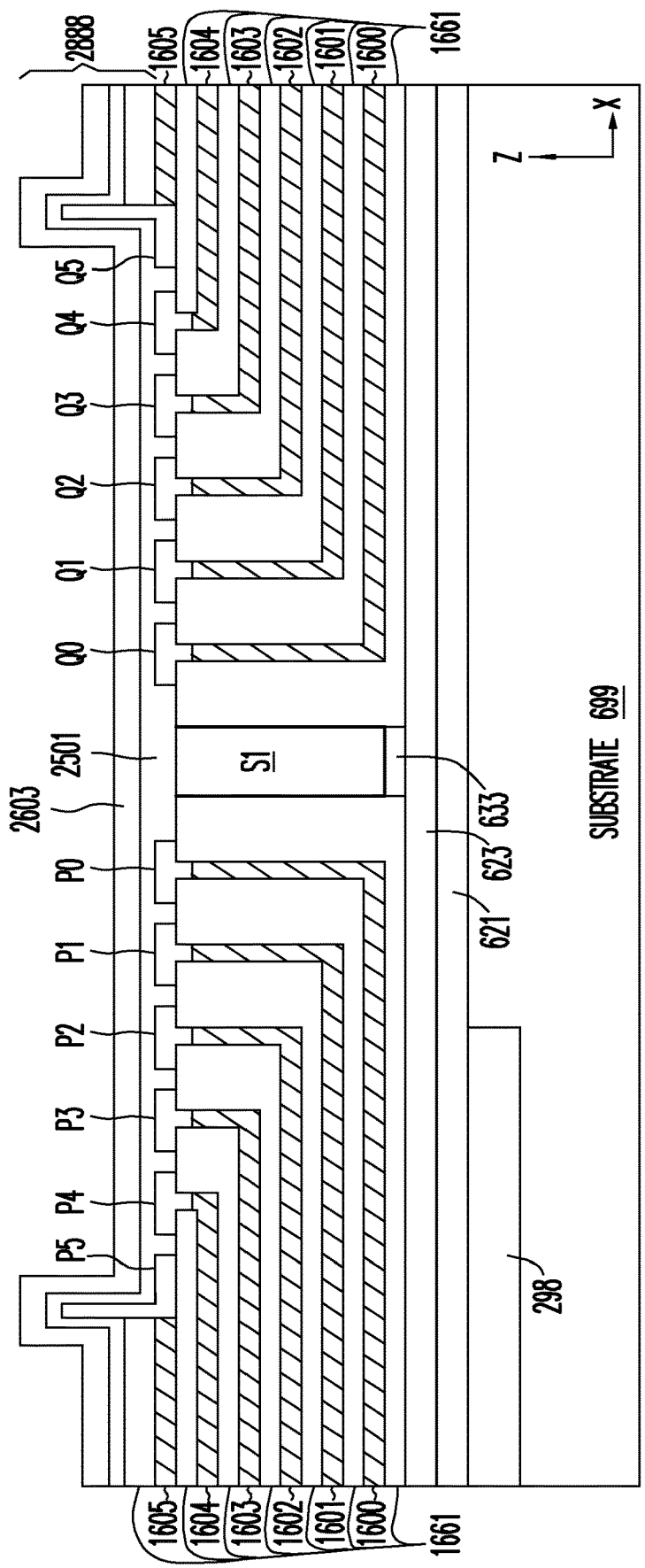

FIG. 28 shows another view of memory device 200 of FIG. 26B including spacer S1 and conductive pads P0-P5 and Q0-Q5. FIG. 28 shows a portion (e.g., top portion) 2888, which can be removed in a subsequent process.

Figure 29:
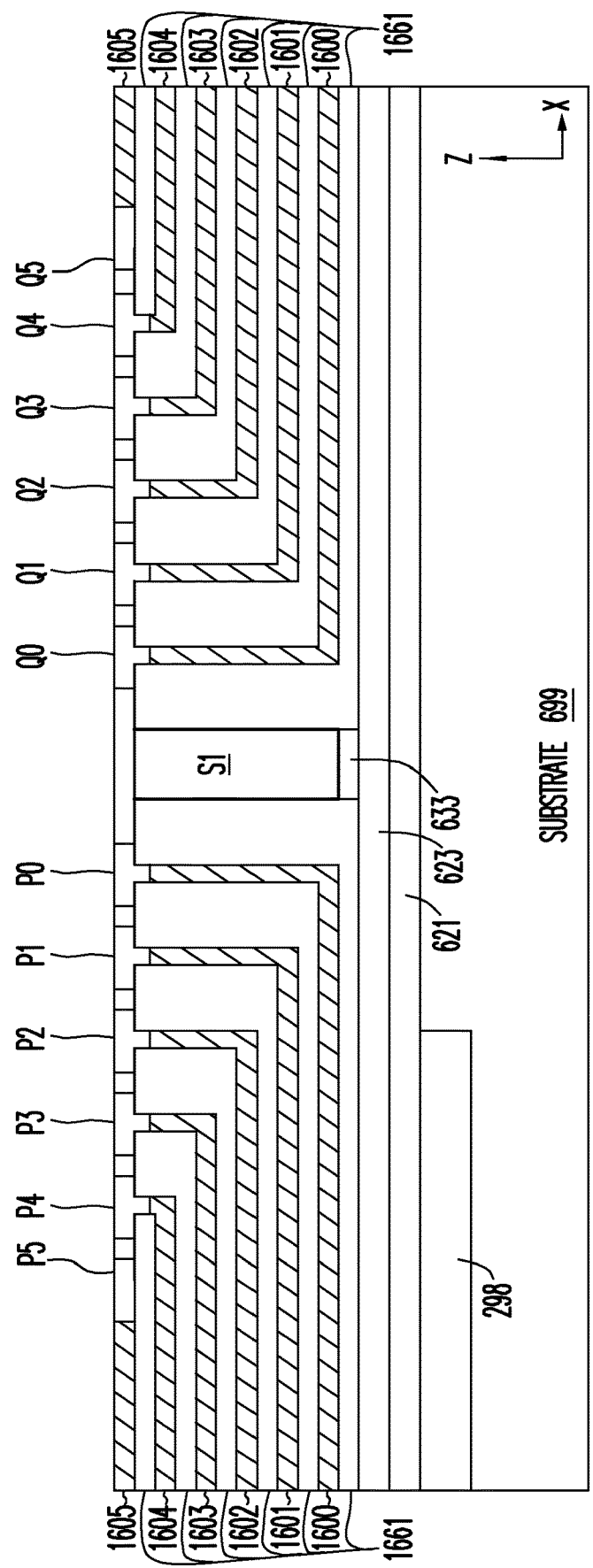

FIG. 29 shows memory device 200 after portion 2888 (FIG. 28) is removed. Removing portion 2888 can include a CMP process. The CMP process can stop at conductive pads P0-P5 and Q0-Q5 and materials 1605.

Figure 30:
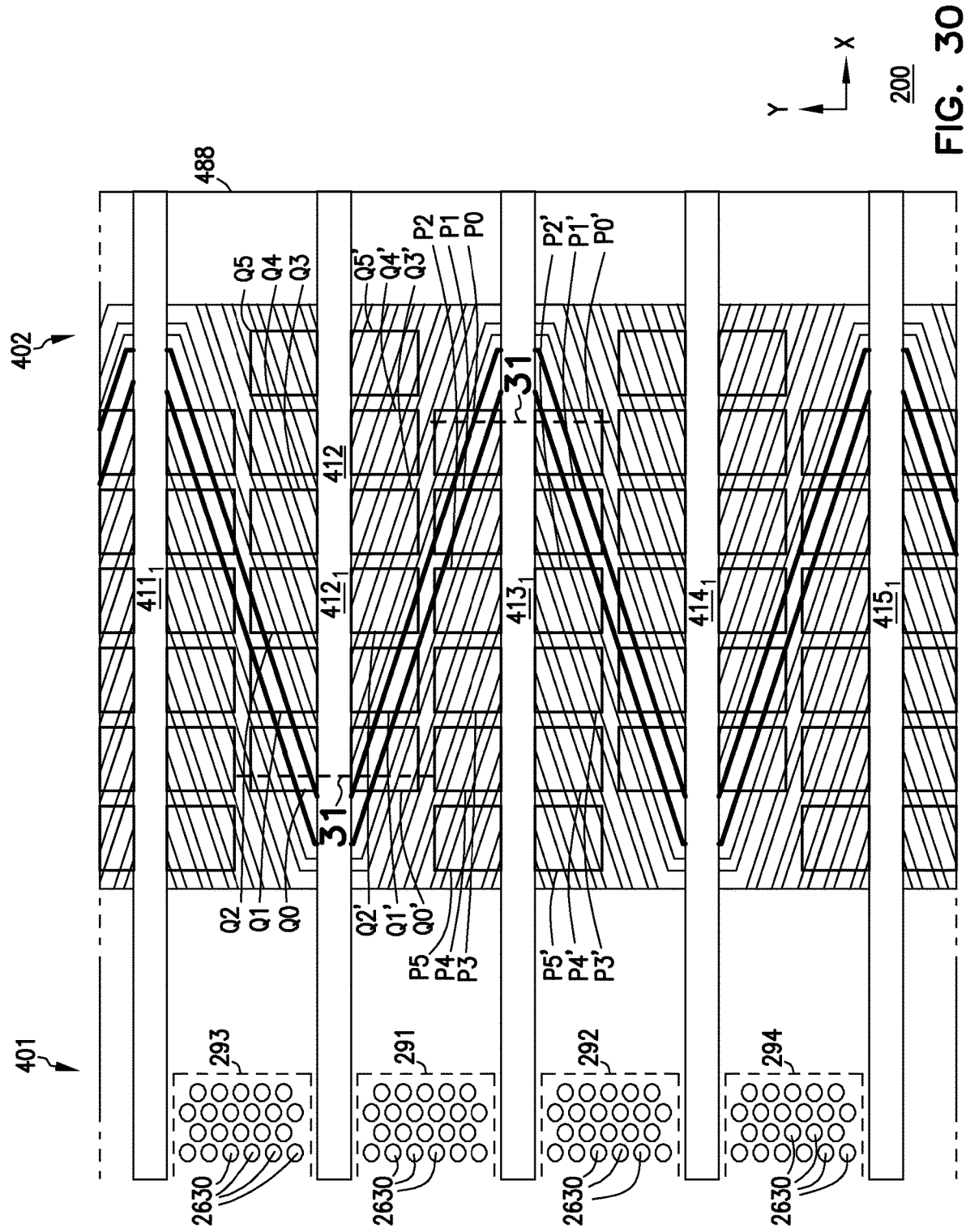

FIG. 30 shows a top view of a portion of memory device 200 of FIG. 29. In FIG. 30, lines 31 show locations of portions (e.g., cross-sections) of memory device 200 that is shown in FIG. 31.

Figure 31:
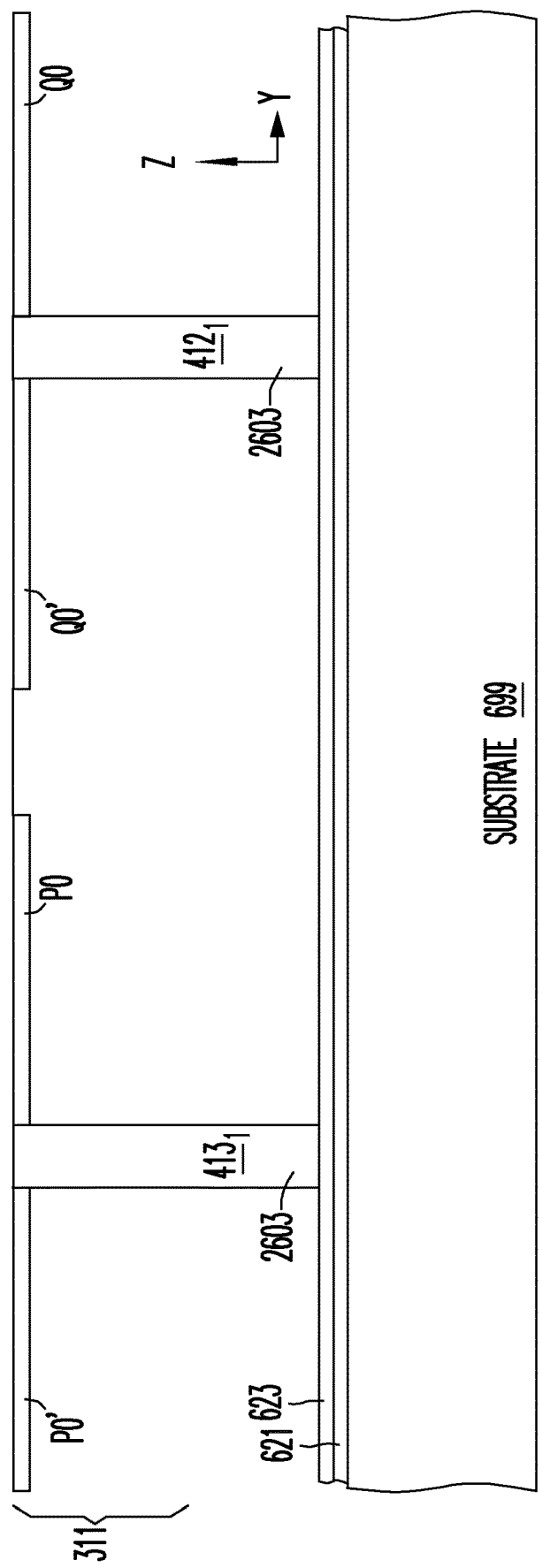

FIG. 31 shows portions (e.g., cross-sections) of memory device 200 at lines 31 in FIG. 30 that are combined (e.g., to create combined cross-sections) and shown in FIG. 31 as one view (for simplicity). Spacer structure S1 and some other elements along lines 31 in FIG. 30 are not shown in FIG. 31. The portions of memory device 200 shown in FIG. 31 can be part of deck 311 viewed in the Y-Z direction.

Figure 32:
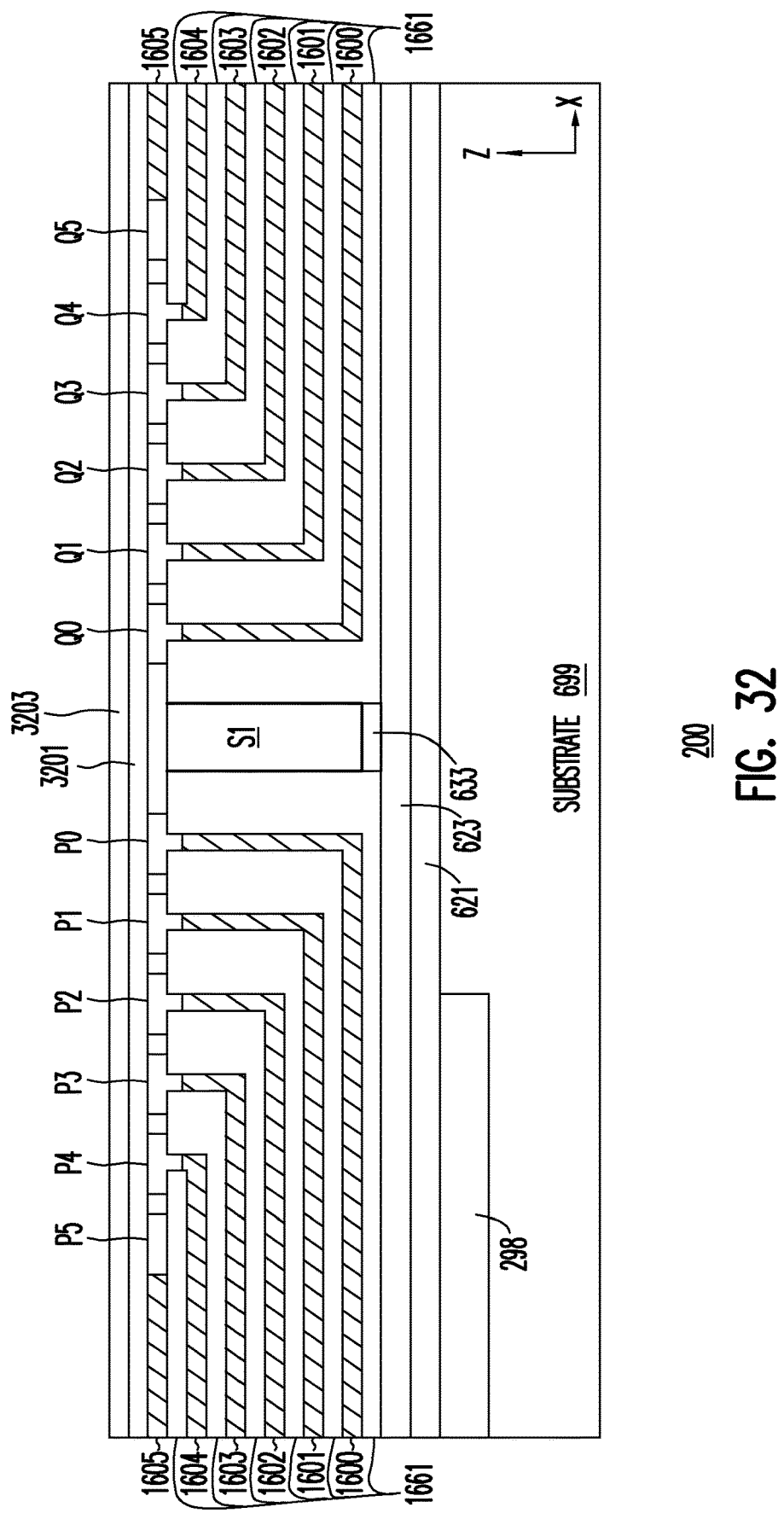

FIG. 32 shows memory device 200 after materials 3201 and 3203 are formed (e.g., formed by deposition processes). Materials 3201 and 3203 can include different dielectric materials. For example, material 3201 can include silicon dioxide and material 3203 can include silicon nitride.

The processes described above with reference to FIG. 12 through FIG. 32 can form a portion of memory device 200 including elements for a deck (e.g., a lower deck, such as deck 311 in FIG. 6A) of memory device 200. Some or all of the above-described processes can be repeated to form at least one additional deck (e.g., a middle deck and a higher deck). For example, the following description describes formation of two more decks, such as decks 312 and 313 (shown in FIG. 6A).

FIG. 33 through FIG. 42 show different views of memory device 200 during processes of forming another deck (e.g., a middle deck, such as deck 312) of memory device 200.

FIG. 42 through FIG. 65 show different views of memory device 200 during processes of forming another deck (e.g., a higher deck, such as deck 313) of memory device 200.

Figure 33:
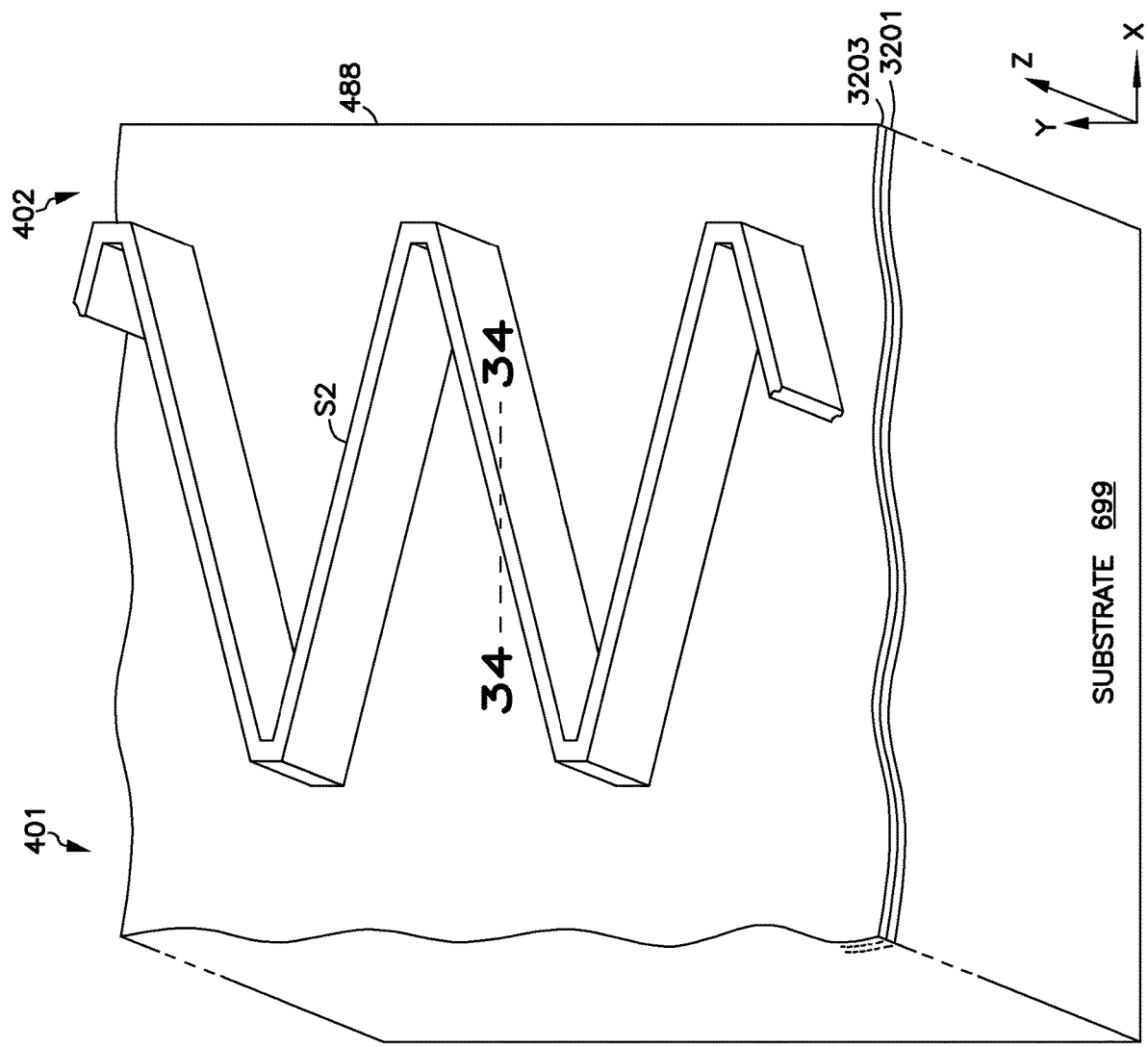
FIG. 33 through 42 show different views of structures during processes of forming a second deck of the memory device of FIG. 2 through FIG. 11 including structures of conductive paths in the second deck, according to some embodiments of the invention.

As shown in FIG. 33, spacer structure S2 is formed over material 3203 of memory device 200. Spacer structure S2 can include (e.g., can be formed from) a dielectric material (e.g., silicon dioxide). As shown in FIG. 33, spacer structure S2 can have a shape (e.g., zigzag shape) similar to (or identical to) the shape of spacer structure S1 (FIG. 13). For example, spacer structure S2 can be formed to include portions (e.g., vertical panels) having walls (e.g., vertical walls) in the Z-direction, and angles A, B, and C (not labeled) similar to angles A, B, and C of spacer structure S1 (FIG. 12 and FIG. 13). Spacer structure S2 can be formed in processes similar to the processes of forming spacer structure S1. The location of spacer structure S2 relative to portion (e.g., memory array portion) 401 and portion (e.g., peripheral portion) 402 of memory device 200 can be similar to (or identical to) the location of spacer structure S1 (FIG. 12 and FIG. 13) relative to portions 401 and 402. For example, spacer structure S2 can be formed such that it can be aligned with spacer structure S1 in the X-Y directions. Like spacer structures S3 (FIG. 4) and S1 (FIG. 12), spacer structure S2 is an additional dielectric structure different from dielectric structures 411, 412, 413, 414, and 415 (FIG. 4). In FIG. 33, line 34-34 shows a portion (e.g., a cross-section) of spacer structure S2 that is shown in FIG. 34.

Figure 34:
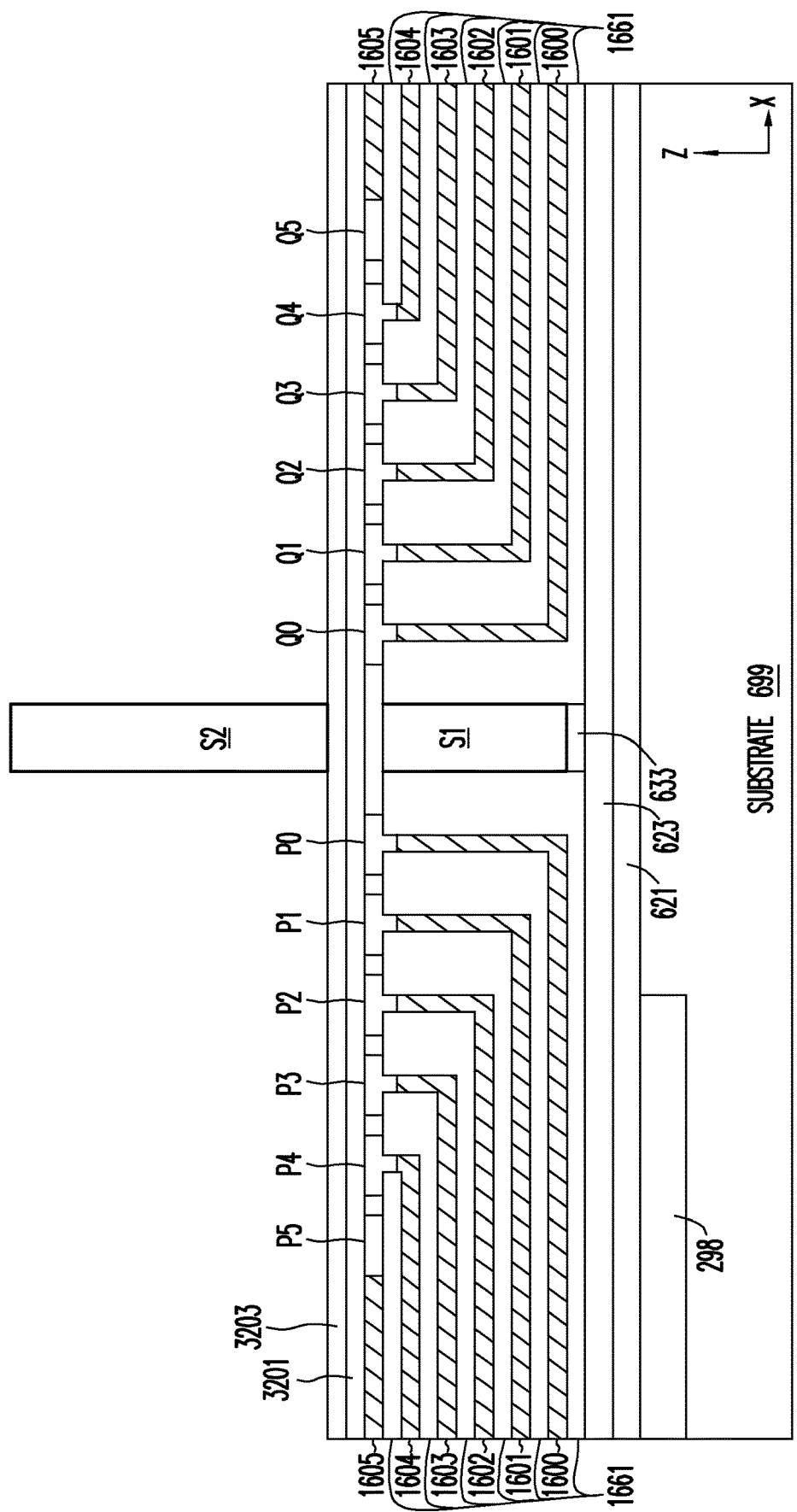

FIG. 34 shows a side view of memory device 200 including a portion of spacer structure S2 along line 34-34 of FIG. 33.

Figure 35:
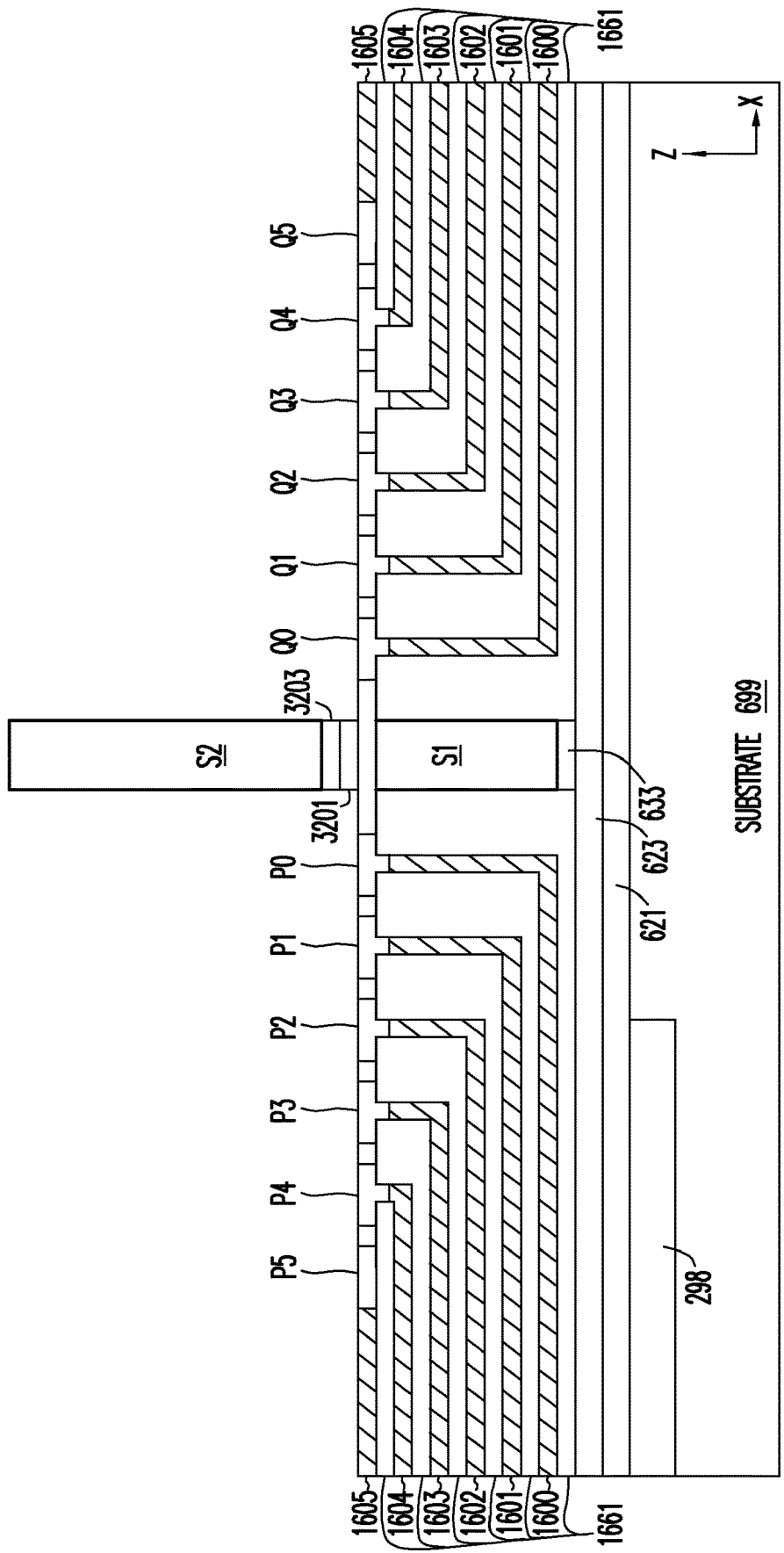

FIG. 35 shows memory device 200 after a portion of each of materials 3201 and 3203 of FIG. 34 is removed leaving a remaining portion of each of materials 3201 and 3203, as shown in FIG. 35. Removing a portion of material 3203 of FIG. 34 can include selectively etching material 3203 of FIG. 34, such that the portion of material 3203 that is uncovered by (e.g., not underneath) spacer structure S2 can be removed (e.g., etched) and the portion of material 3203 that is covered by (e.g., underneath) spacer structure S2 can remain (as shown in FIG. 35). After a portion of material 3203 is removed, a portion of material 3201 can be removed. Removing a portion of material 3201 of FIG. 34 can include selectively etching material 3201 of FIG. 34, such that the portion of material 3201 that is uncovered by (e.g., not underneath) spacer structure S2 can be removed (e.g., etched) and the portion of material 3201 that is covered by (e.g., underneath) spacer structure S2 can remain (as shown in FIG. 35).

Figure 36:
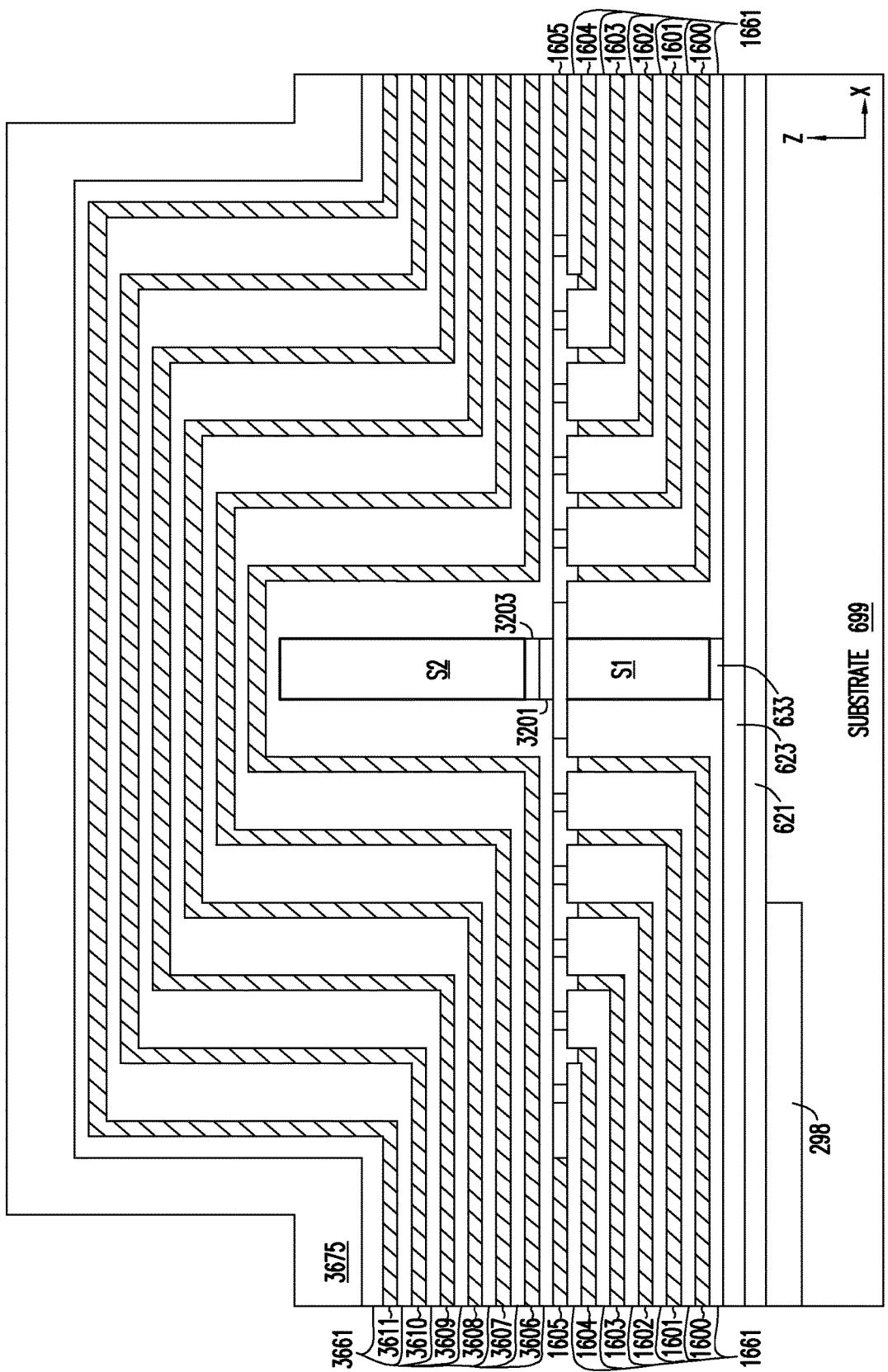

FIG. 36 shows memory device 200 after materials 3606, 3607, 3608, 3609, 3610, and 3611 (3606-3611), materials 3661, and a material 3675 are formed over spacer structure S2 and over other elements (e.g., conductive pads P0-P5 and Q0-Q5, not labeled) of memory device 200. Materials 3606-3611 and materials 3661 can include different dielectric materials. For example, materials 3606-3611 can include nitride materials (e.g., silicon nitride) and materials 3661 can include oxide materials (e.g., silicon dioxide $SiO_2$). Forming materials 3606-3611 and 3661 can include depositing (e.g., sequentially depositing) different dielectric materials (e.g., alternating levels (e.g., layers) of silicon dioxide and silicon nitride) to form materials 3606-3611 and 3661 as shown in FIG. 36. Material 3675 can include polysilicon or other materials (e.g., dielectric materials). Forming material 3675 can include depositing a material (e.g., polysilicon) over the alternating levels of materials 3606-3611 and 3661.

Figure 37:
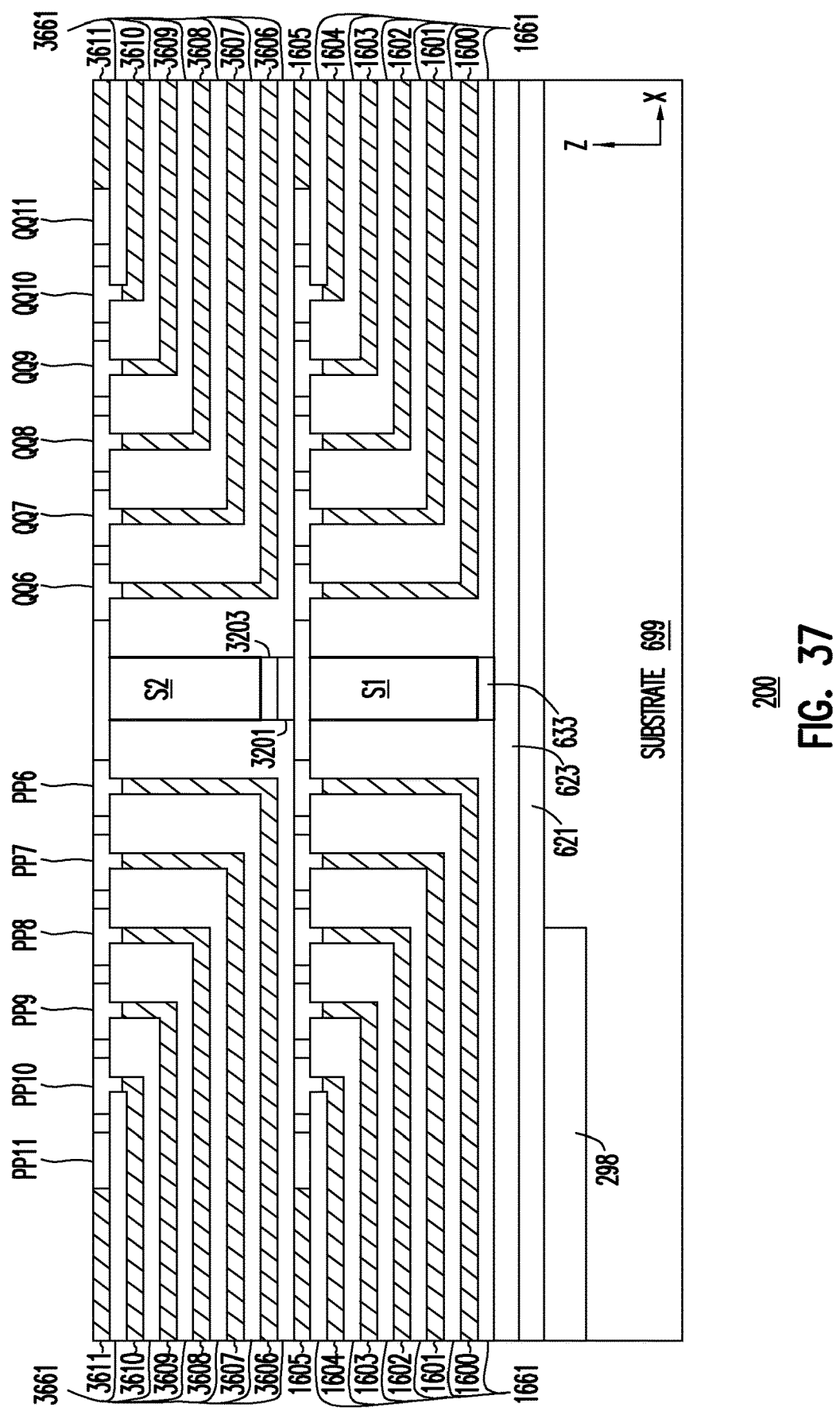

FIG. 37 shows memory device 200 after pad structures PP6, PP7, PP8, PP9, PP10, and PP11 (PP6-PP11), QQ6, QQ7, QQ8, QQ9, QQ10, and QQ11 (QQ6-QQ11) are formed.

Figure 38:
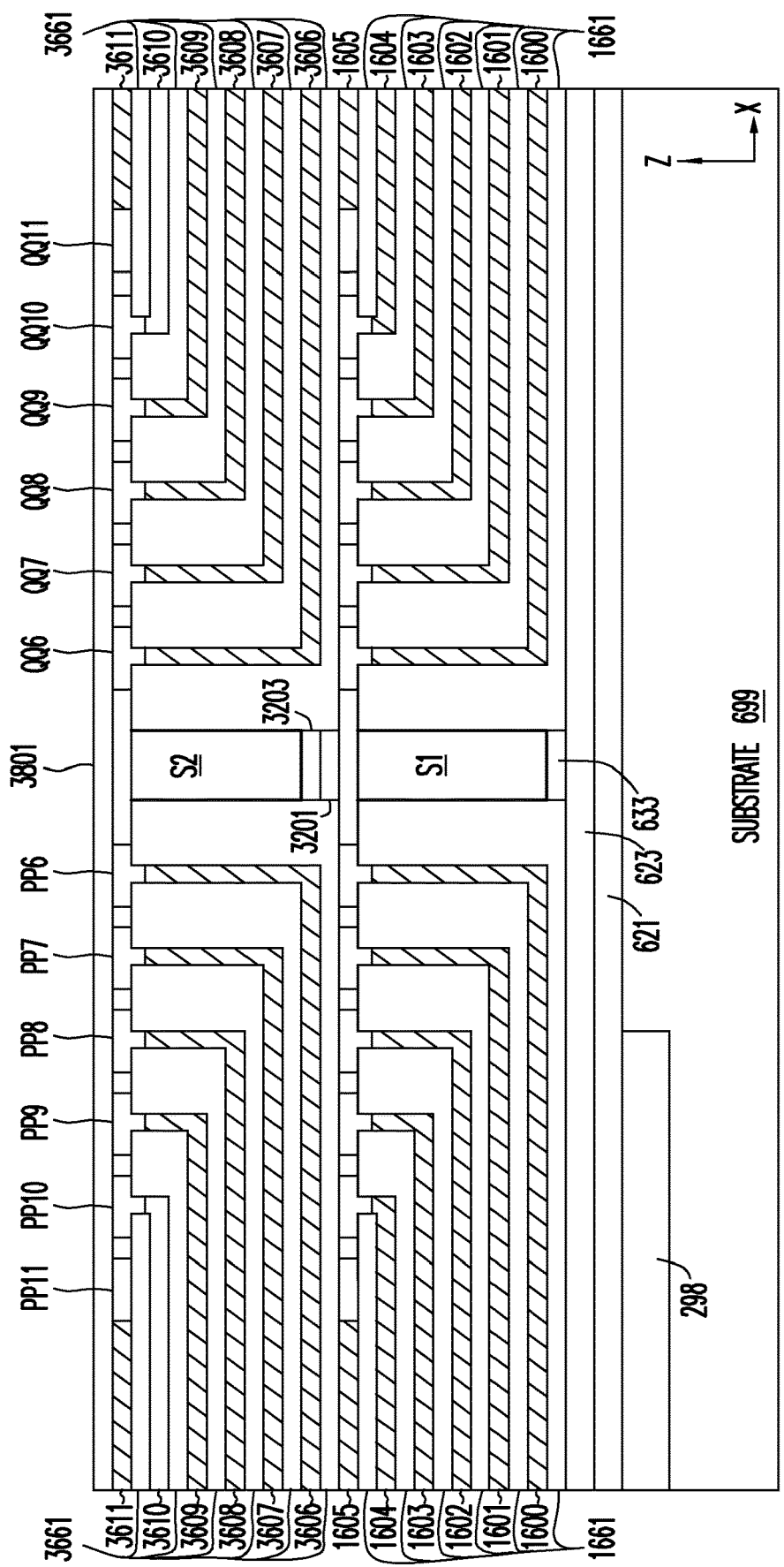

FIG. 38 shows memory device 200 after material 3801 is formed (e.g., formed by deposition). Material 3801 can include silicon dioxide.

Figure 39A:
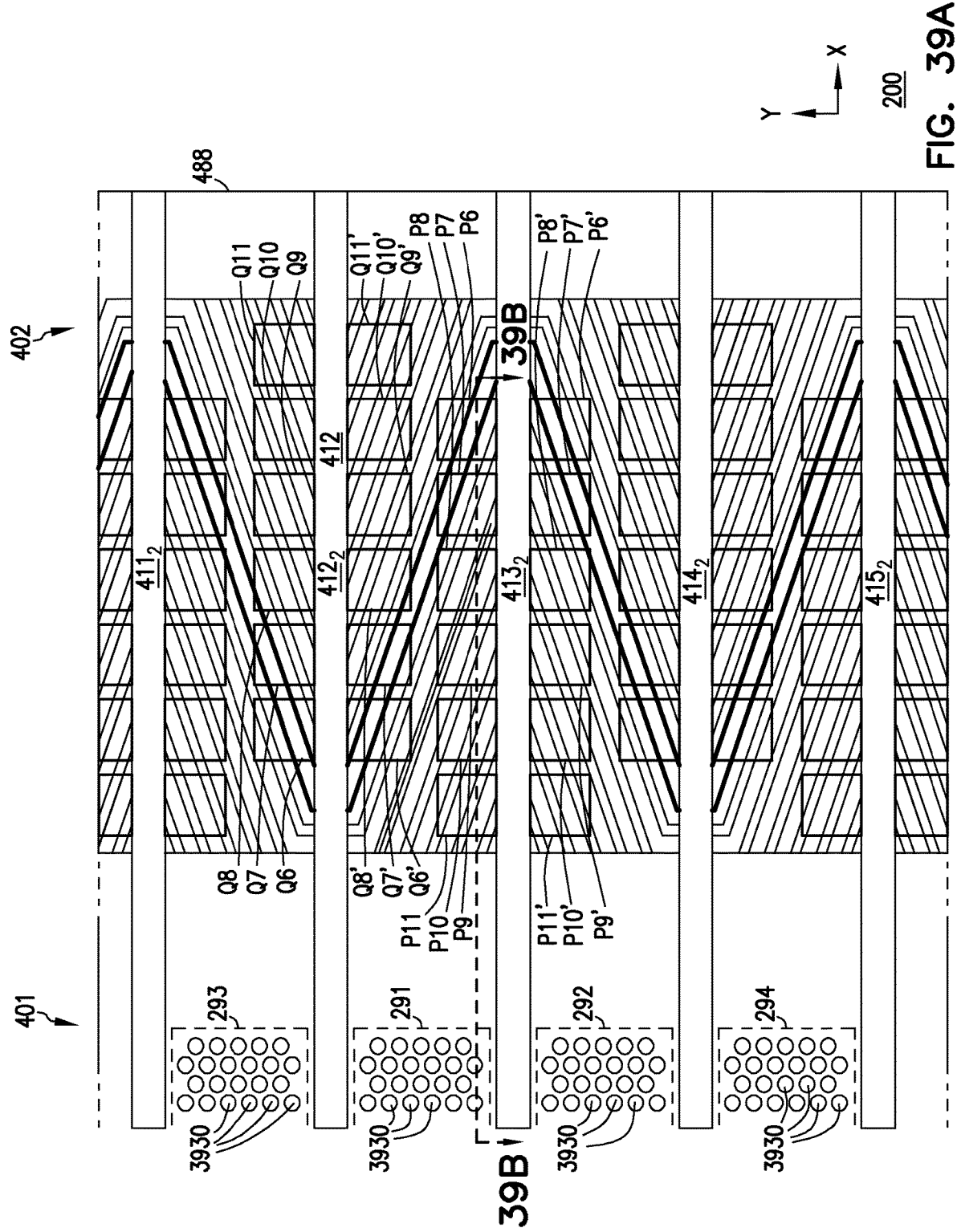

FIG. 39A shows a top view of memory device 200 after formation of conductive pads P6, P7, P8, P9, P10, and P11 (P6-P11), P6', P7', P8', P9', P10', and P11' (P6'-P11'), Q6, Q7, Q8, Q9, Q10, and Q11 (Q6-Q11), Q6', Q7', Q8', Q9', Q10', and Q11' (Q6'-Q11'), pillar structures (e.g., holes or openings) 3930, and slits e.g., trenches or cuts) $411_2$, $412_2$, $413_2$, $414_2$, and $415_2$. Pillar structures 3930 can be aligned with (e.g., formed directly over) pillar structures 2630 (FIG. 27A). Pillar structures 3930 can form portions (e.g., portions at deck 312) of respective pillars 530 (FIG. 6A).

As shown FIG. 39A, slits $411_2$, $412_2$, $413_2$, $414_2$, and $415_2$ can be formed in portion (e.g., memory array portion) 401 and portion (e.g., peripheral portion) 402 of memory device 200. Slits $411_2$, $412_2$, $413_2$, $414_2$, and $415_2$ can be aligned over (e.g., formed directly over) slits $411_1$, $412_1$, $413_1$, $414_1$, and $415_1$ in FIG. 26A. Thus, the location of slits $411_2$, $412_2$, $413_2$, $414_2$, and $415_2$ in FIG. 39A can also be part of the locations of dielectric structures 411, 412, 413, 414, and 415, respectively, shown in FIG. 4 and FIG. 11.

Slits $411_2$, $412_2$, $413_2$, $414_2$, and $415_2$ can be formed using an etch process to remove the materials (e.g., a portion of materials 3606-3611 and 3661) at the locations of slits $411_2$, $412_2$, $413_2$, $414_2$, and $415_2$. Each of $411_2$, $412_2$, $413_2$, $414_2$, and $415_2$ can have a length in X-direction from portion 401 to portion 402. Each of slits $411_2$, $412_2$, $413_2$, $414_2$, and $415_2$ can have a depth (a height) in the Z-direction, such that the bottom of each of slits $411_2$, $412_2$, $413_2$, $414_2$, and $415_2$ may be at material 2603 (FIG. 31) that was filled in slits $411_1$, $412_1$, $413_1$, $414_1$, and $415_1$ in the processes associated with FIG. 26B through FIG. 31.

In FIG. 39A, conductive pads P6-P11 and P6'-P11' can be formed from pad structures PP6-PP11 (FIG. 38) when slit $413_2$ is formed. For example, as shown in FIG. 39A, forming slit $413_2$ can remove (e.g., cut) a portion (e.g., the middle) of each of pad structures PP6-PP11 at the location of slit $413_2$. A remaining portion of pad structures PP6-PP11 on one side of slit $413_2$ can form conductive pads P6-P11. Another remaining portion of pad structures PP6-PP11 on the other side of slit $413_2$ can form conductive pads P6'-P11'.

Similarly, conductive pads Q6-Q11 and Q6'-Q11' can be formed from pad structures QQ6-QQ11 (FIG. 38) when slit $412_2$ is formed. For example, as shown in FIG. 39A, forming slit $412_2$ can remove (e.g., cut) a portion (e.g., the middle) of each of pad structures QQ6-QQ11 at the location of slit $412_2$. A remaining portion of pad structures QQ6-QQ11 on one side of slit $412_2$ can form conductive pads Q6-Q11. Another remaining portion of pad structures QQ6-QQ11 on the other side of slit $412_2$ can form conductive pads Q6'-Q11'. In FIG. 39A, line 39B-39B shows a portion (e.g., a cross-section) of memory device 200 that is shown in FIG. 39B.

FIG. 39B shows a portion of memory device 200 along line 39B-39B of FIG. 39A. As shown in FIG. 39B, pillar structures 3930 can have respective lengths extending in the Z-direction through materials (e.g., silicon nitride) 3606-3611 and materials (e.g., silicon dioxide) 3661. As shown in FIG. 39B, pillar structures 3930 can be aligned with (e.g., formed directly over) pillar structures 2630 (labeled in FIG. 26B). Forming pillar structures 3930 can include removing (e.g., by etching) materials 3606-3611 and 3661 at the locations of pillar structures 3930 to form voids (e.g., holes or openings) at pillar structures 3930.

The processes associated with FIG. 39A and FIG. 39B can also include forming contact structures CP0, CP0', CQ0, and CQ0' including liners 3921 (described below with reference to FIG. 40).

After formation of pillar structures 3930 (FIG. 39B) and contact structures CP0, CP0', CQ0, and CQ0' (FIG. 40), the processes associated with FIG. 39A and FIG. 39B can include forming (e.g., depositing) a material (e.g., sacrificial material) 3903. Material 3903 can fill pillar structures 3930 (FIG. 39B). Material 3903 can be similar to or the same as material 2603. For example, material 3903 can include a material (or a combination of materials) that can be selectively removed (e.g., etched) relative to materials 3606-3611 (e.g., silicon nitride) and materials 3661 (e.g., silicon dioxide). Examples for material 3903 include silicate glass (e.g., Borophosphosilicate glass (BPSG)), tungsten, and aluminum oxide.

Figure 40:
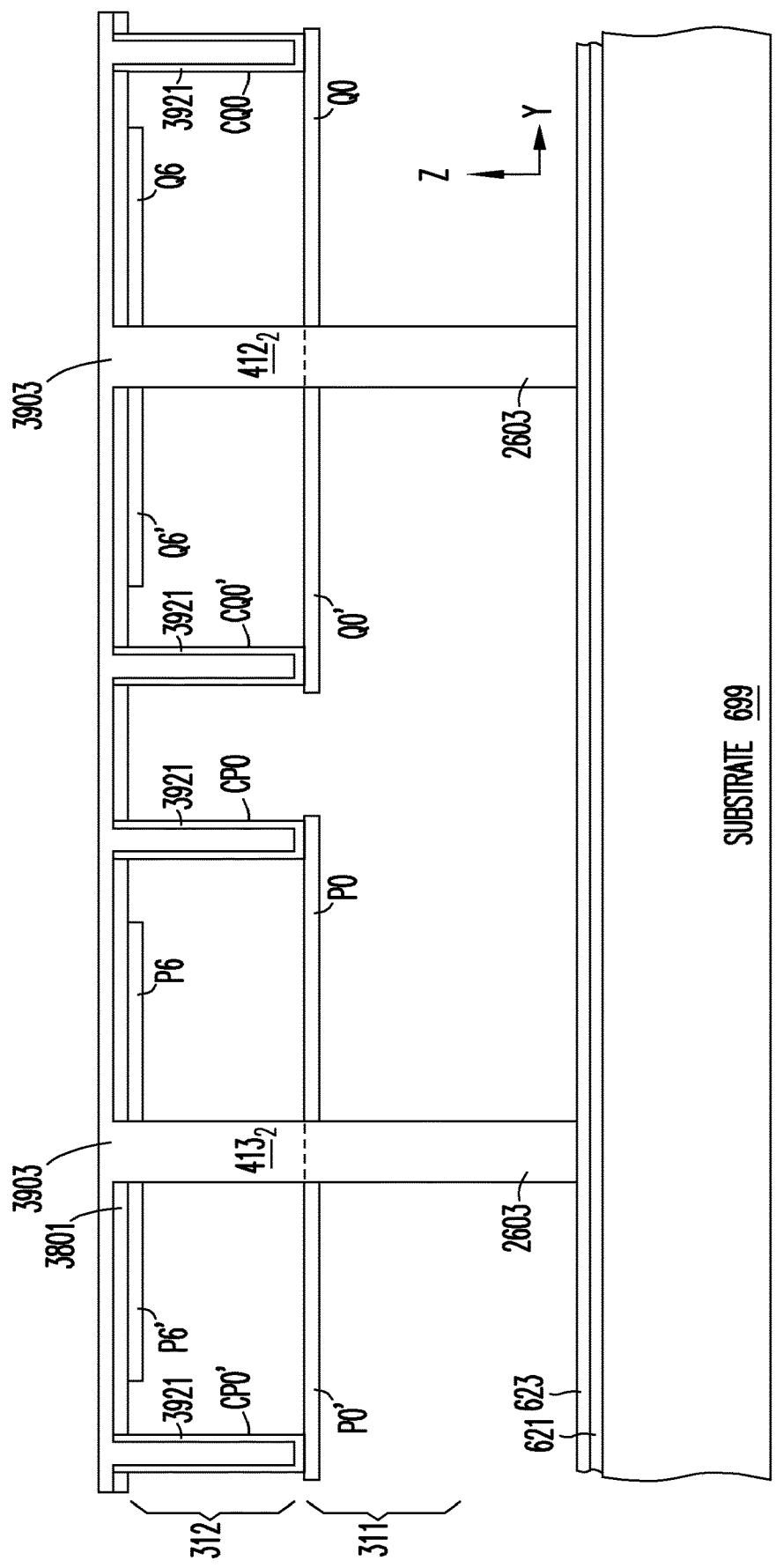

FIG. 40 shows portions (e.g., cross-sections) of memory device 200 of FIG. 39B in the Y-Z direction. The portions of memory device 200 shown in FIG. 40 can be part of decks 311 and 312 viewed in the Y-Z direction. Forming contact structures CP0, CP0', CQ0, and CQ0' (FIG. 40) can include removing (e.g., by etching) a dielectric material at the locations of contact structures CP0, CP0', CQ0, and CQ0' to form openings (e.g., holes) at the locations of contact structures CP0, CP0', CQ0, and CQ0'. The openings expose portions of conductive pads P0, P0', Q0, and Q0' at the locations of contact structures CP0, CP0', CQ0, and CQ0'. Then, a dielectric material (e.g., silicon dioxide) can be formed (e.g., deposited) in the openings (e.g., sidewalls of the openings), such that the dielectric material can form liners (e.g., relatively thin layers of silicon dioxide) 3921 in the openings at the locations of contact structures CP0, CP0', CQ0, and CQ0'. After liners 3921 are formed, material 3903 (as described above with reference to FIG. 39B) can be formed and fill contact structures CP0, CP0', CQ0, and CQ0', as shown in FIG. 40.

Other contact structures (not shown) can also be formed when contact structures CP0, CP0', CQ0, and CQ0' are formed. The other contact structures can be formed over other conductive pads (e.g., conductive pads P1-P5, P1'-P5', Q1-Q5, and Q1'-Q5' in FIG. 28). As described below, subsequent processes can be performed to form conductive contacts at contact structures CP0, CP0', CQ0, and CQ0' and the other contact structures.

Figure 41:
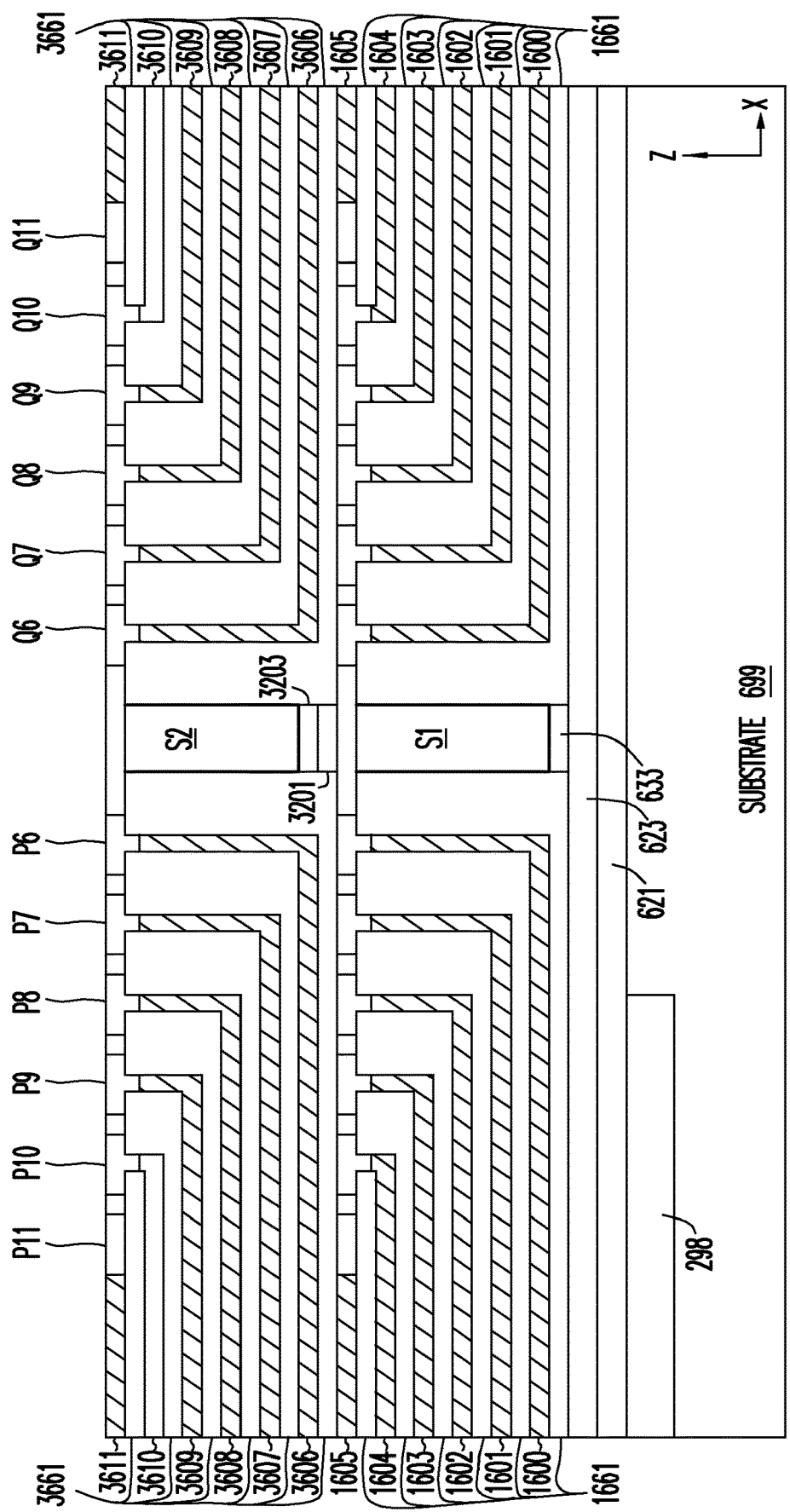

FIG. 41 shows memory device 200 after materials 3801 and 3903 (FIG. 39B and FIG. 40) are removed (e.g., by a CMP process).

Figure 42:
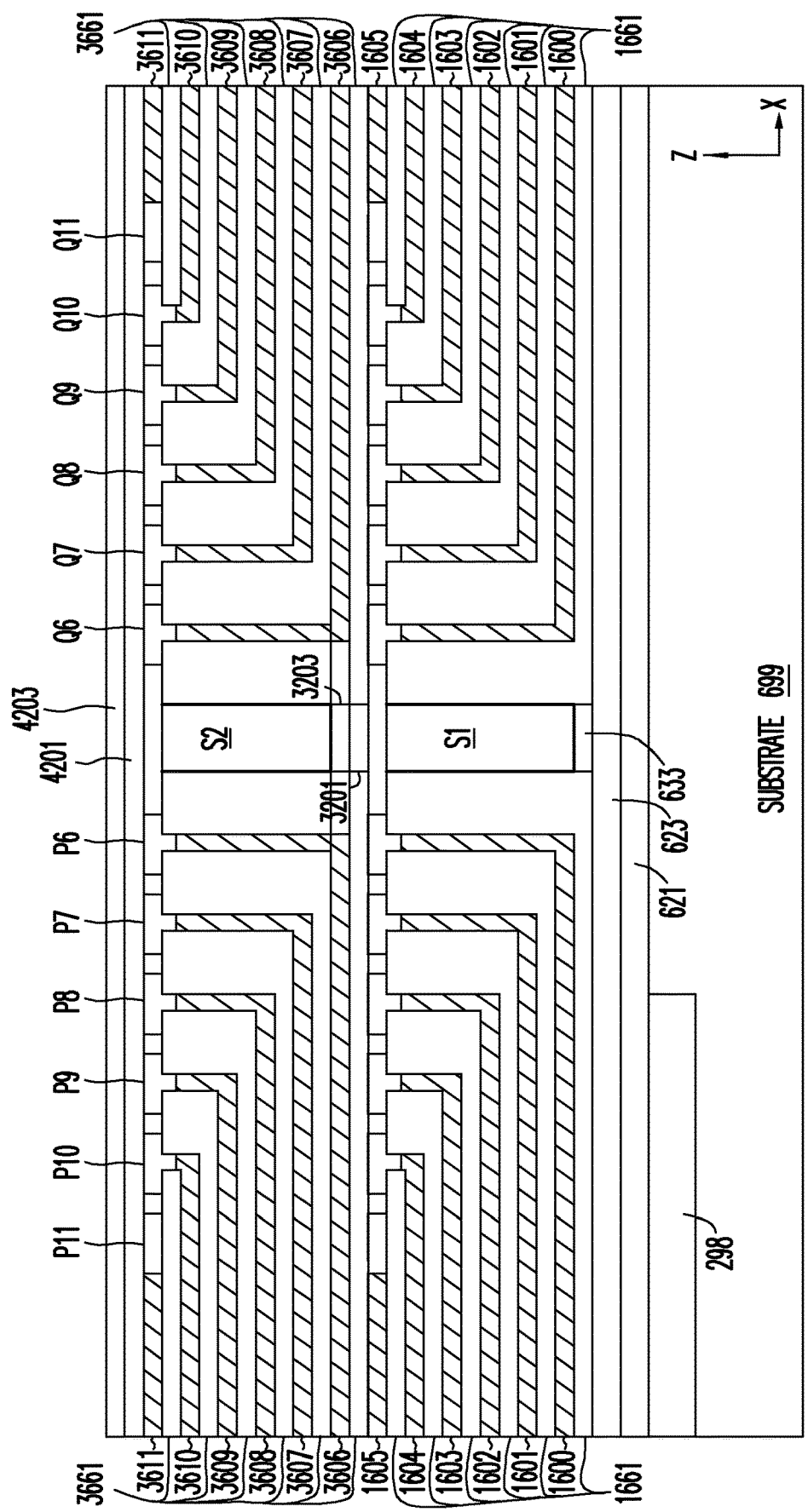

FIG. 42 shows memory device 200 after materials 4201 and 4203 are formed (e.g., formed by deposition processes). Materials 4201 and 4203 can include different dielectric materials. For example, material 4201 can include silicon dioxide and material 4203 can include silicon nitride.

Figure 43:
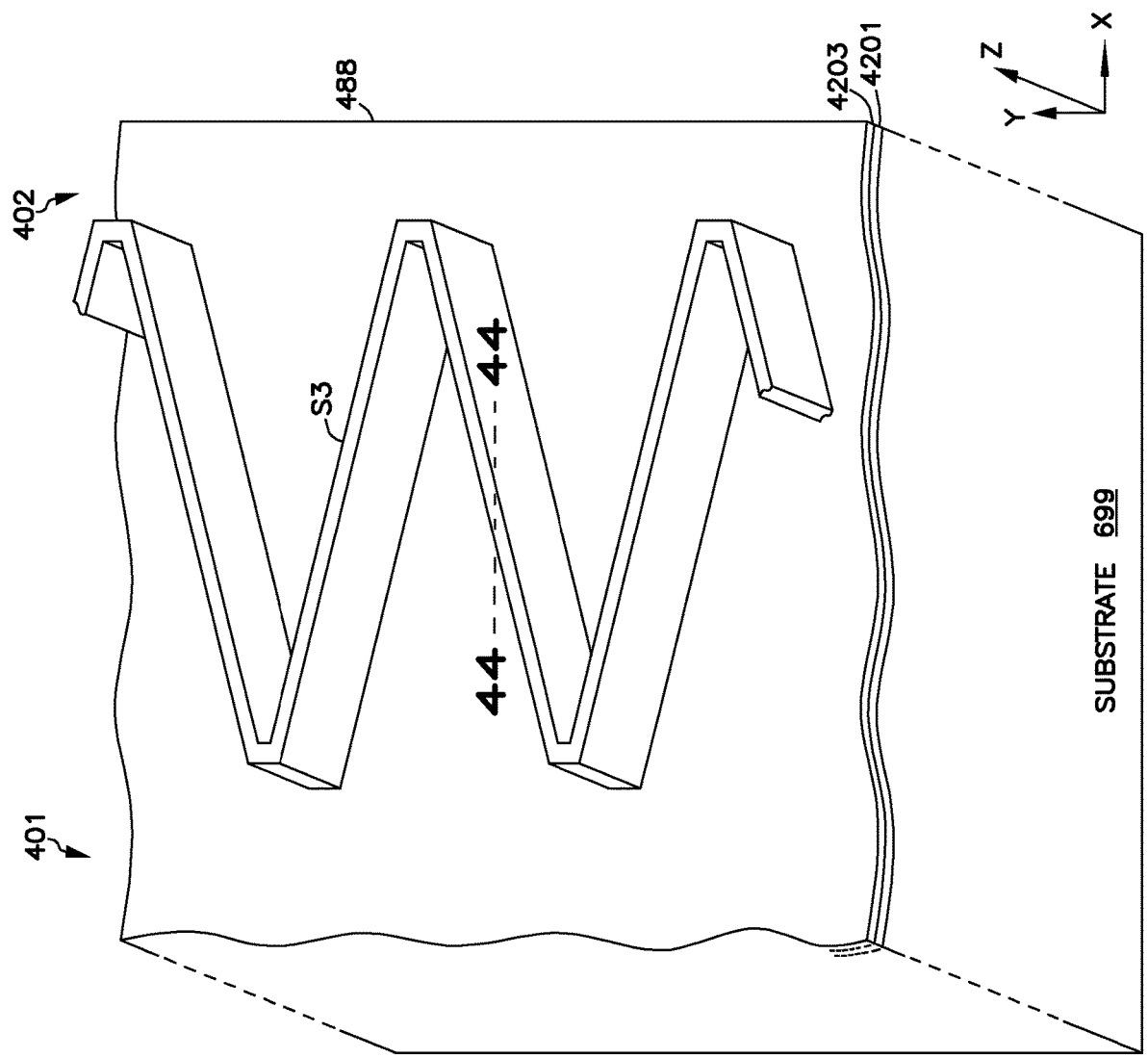

FIG. 43 shows memory device 200 after spacer structure S3 is formed over material 3903. Spacer structure S3 can be formed in processes similar to the processes of forming spacer structure S1 (FIG. 13) and spacer structure S2 (FIG. 33). For example, spacer structure S3 can be formed to include portions (e.g., vertical panels) having walls (e.g., vertical walls) in the Z-direction, and angles A, B, and C (not labeled) similar to angles A, B, and C of spacer structure S1 (FIG. 12 and FIG. 13). Spacer structure S3 can include a dielectric material (e.g., silicon dioxide) and can have a shape (e.g., zigzag shape) similar to (or identical to) the shape of spacer structure S1 and spacer structure S2. The location of spacer structure S3 relative to portion (e.g., memory array portion) 401 and portion (e.g., peripheral portion) 402 of memory device 200 can be similar to (or identical to) the locations of spacer structures S1 and S2 relative to portions 401 and 402. For example, spacer structure S3 can be formed such that it can be aligned with spacer structure S2 in the X-Y directions. In FIG. 43, line 44-44 shows a portion (e.g., a cross-section) of spacer structure S3 that is shown in FIG. 44.

Figure 44:
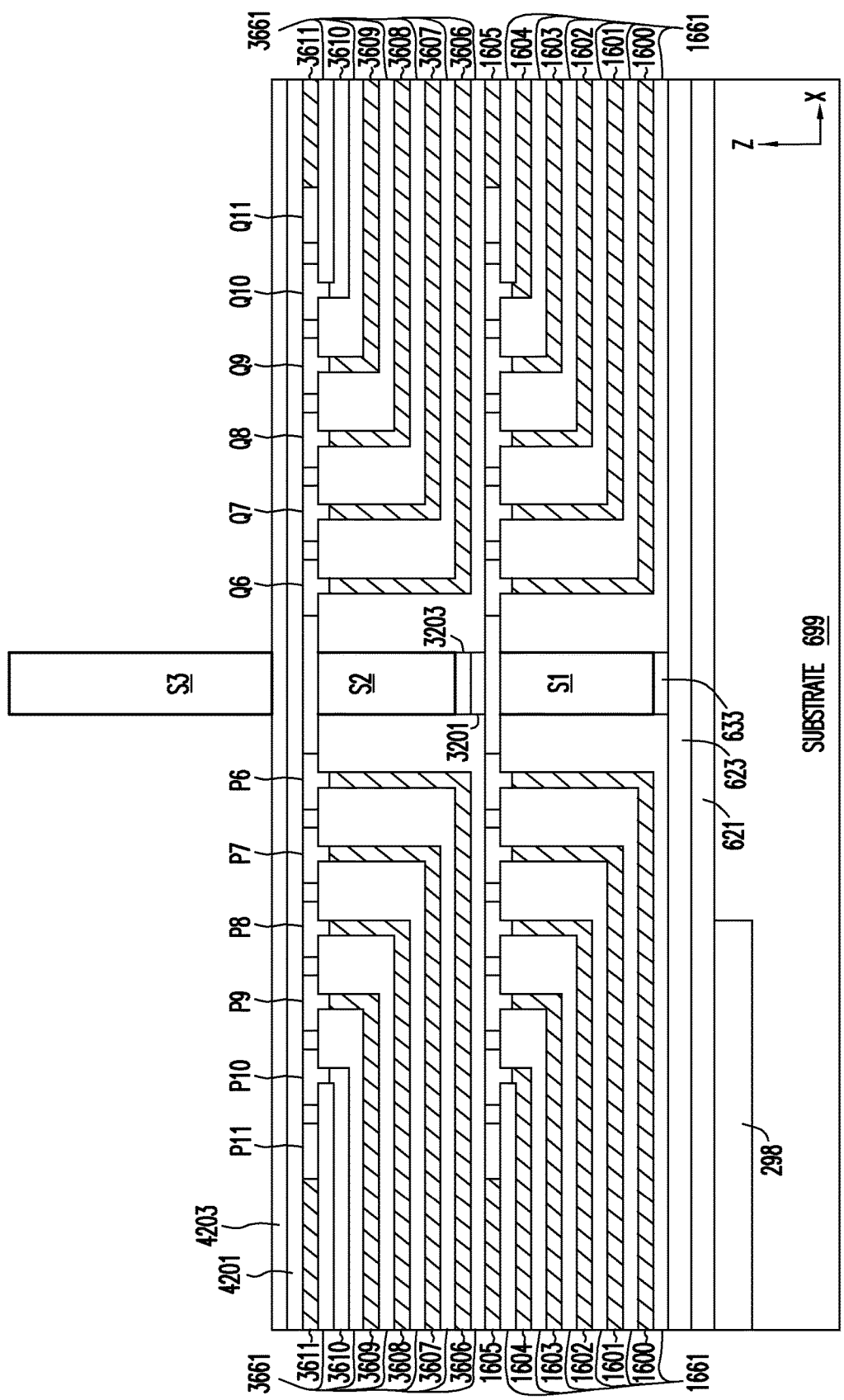

FIG. 44 shows a side view of memory device 200 including a portion of spacer structure S3 along line 44-44 of FIG. 43.

Figure 45:
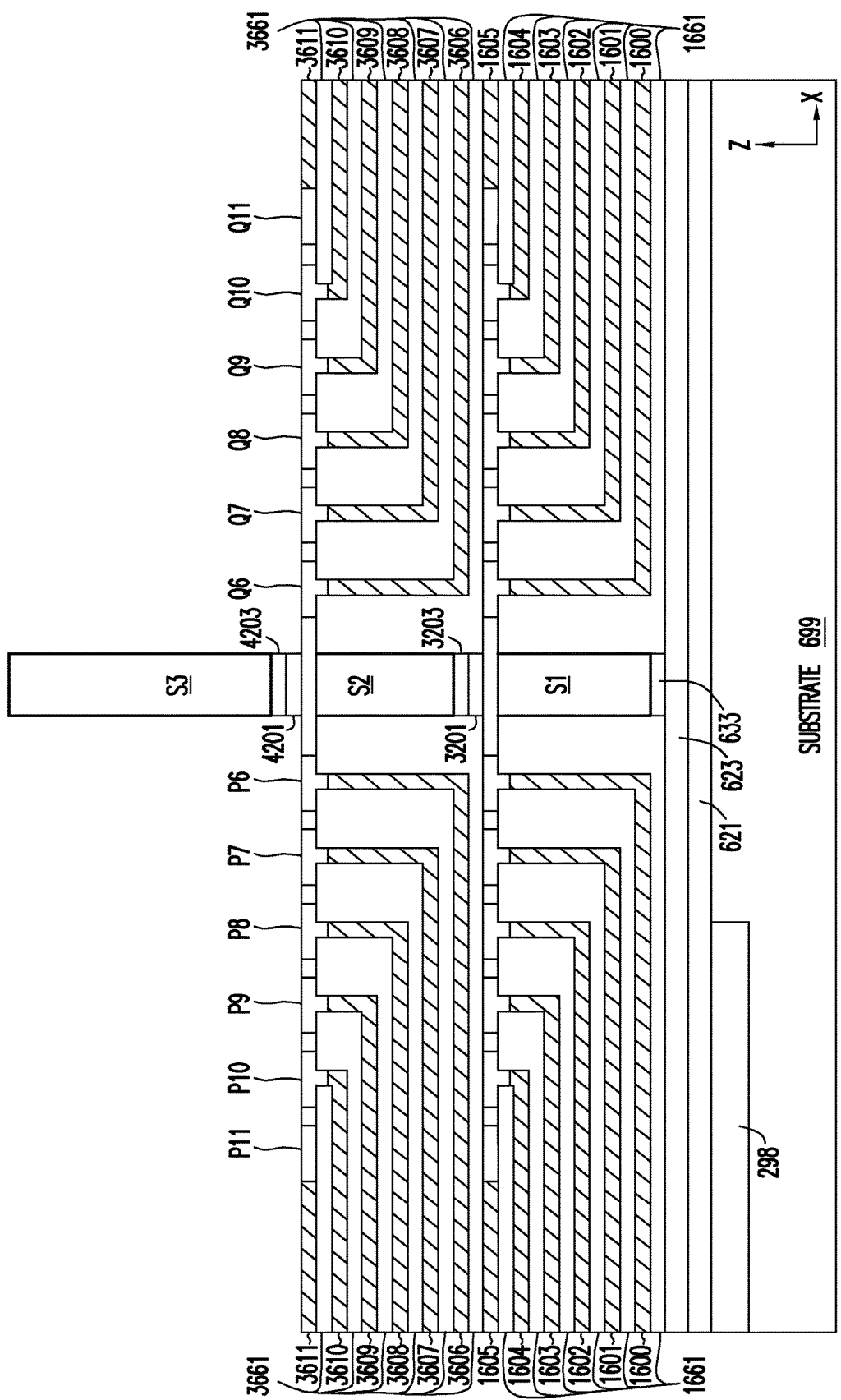

FIG. 45 shows memory device 200 after a portion of each of materials 4201 and 4203 is removed, leaving a remaining portion of each of materials 4201 and 4203, as shown in FIG. 45. Removing portions of materials 4201 and 4203 can include selectively etching materials 4201 and 4203, such that the portions of materials 4201 and 4203 that are uncovered by (e.g., not underneath) spacer structure S3 can be removed (e.g., etched) and the portions of materials 4201 and 4203 that are covered by (e.g., underneath) spacer structure S3 can remain (as shown in FIG. 42).

Figure 46:
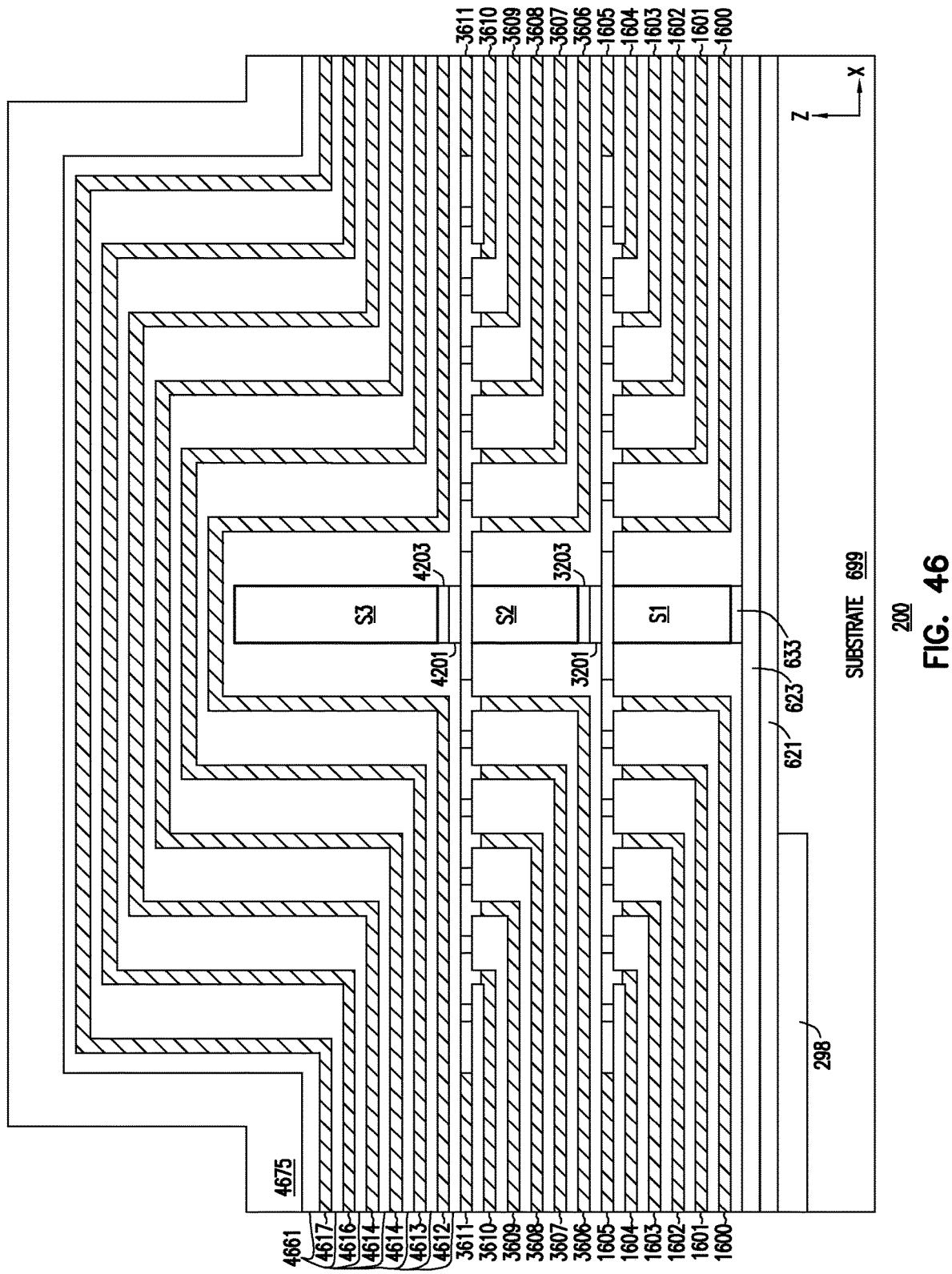

FIG. 46 shows memory device 200 after materials 4612, 4613, 4614, 4615, 4616, and 4617 (e.g., silicon nitride), materials 4661 (e.g., silicon dioxide), and a material (e.g., polysilicon) 4675 are formed over spacer structure S3 and over other elements (e.g., conductive pads P6-P11 and Q6-Q11, not labeled) of memory device 200.

Figure 47:
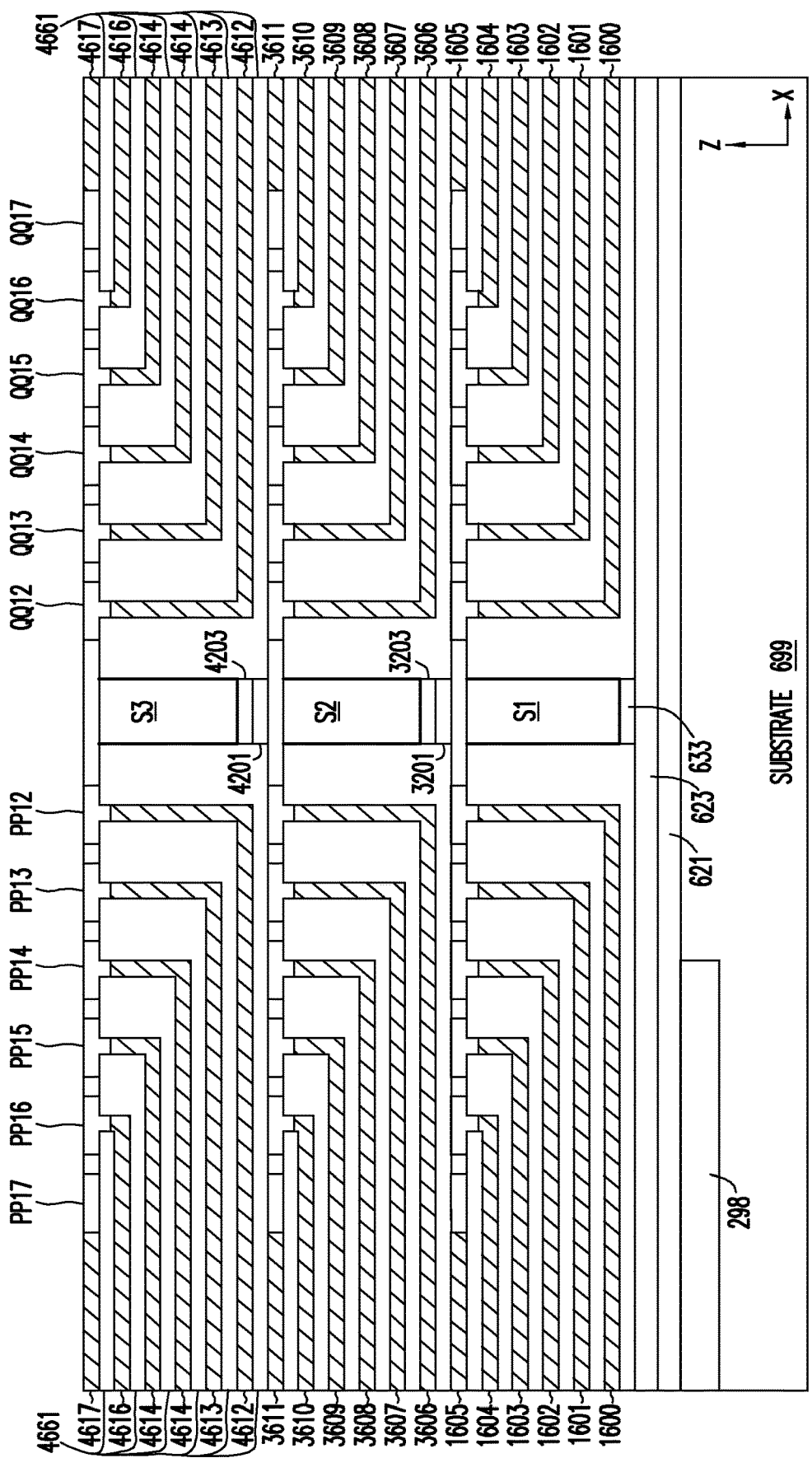

FIG. 47 shows memory device 200 after pad structures PP12, PP13, PP14, PP15, PP16, PP17 (PP12-PP17), QQ12, QQ13, QQ14, QQ15, QQ16, and QQ17 (QQ12-QQ17) are formed. In subsequent processes of forming memory device 200, a portion of each of pad structures PP12-PP17 and QQ12-QQ17 can be removed (e.g., patterned) to form conductive pads P12-P17 (FIG. 6A) and Q12-Q17 (FIG. 9).

Figure 48:
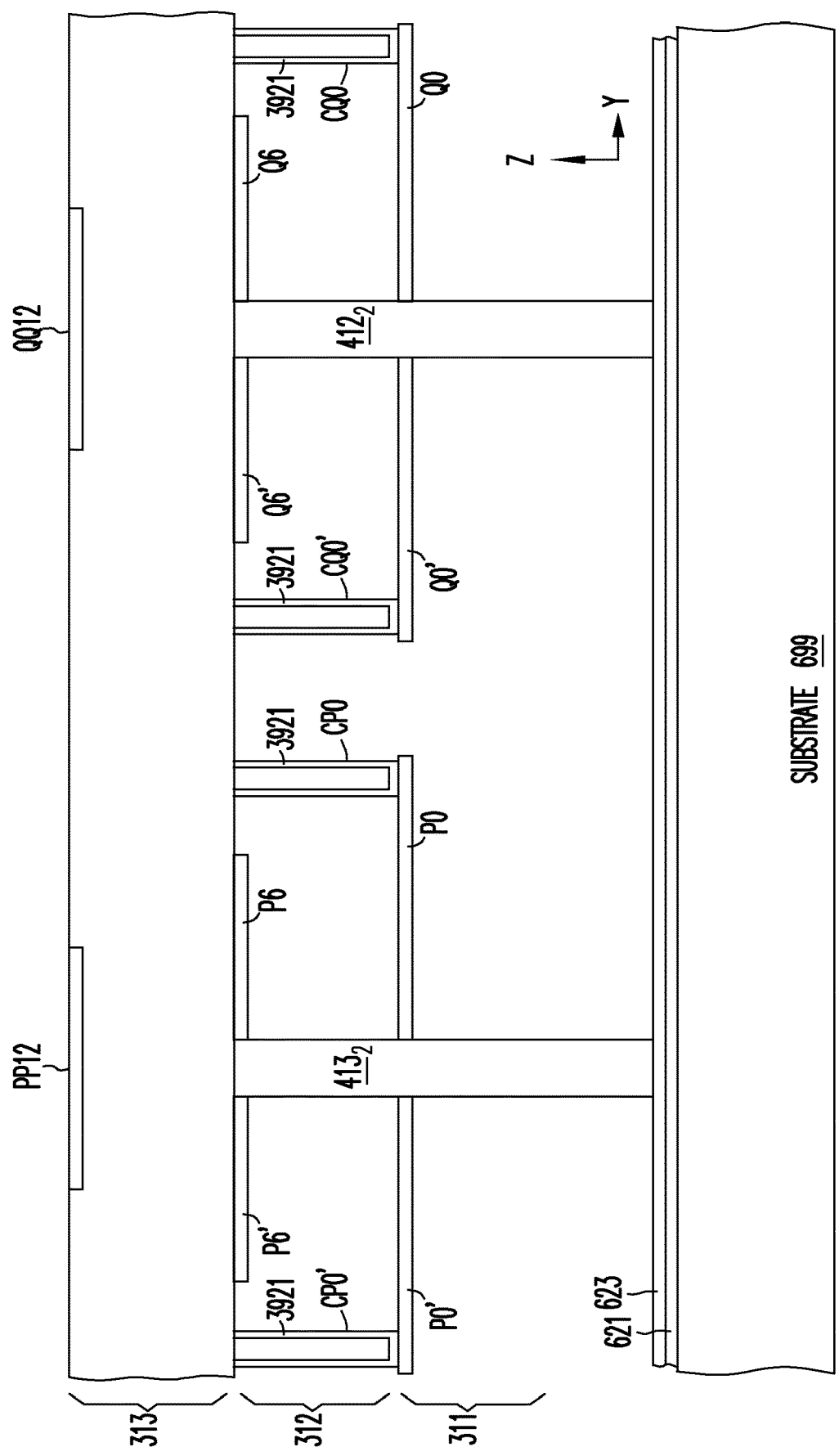

FIG. 48 shows portions (e.g., cross-sections) of memory device 200 of FIG. 47 in the Y-Z direction. The portions of memory device 200 shown in FIG. 48 can be part of decks 311, 312, and 313 viewed in the Y-Z direction.

Figure 49:
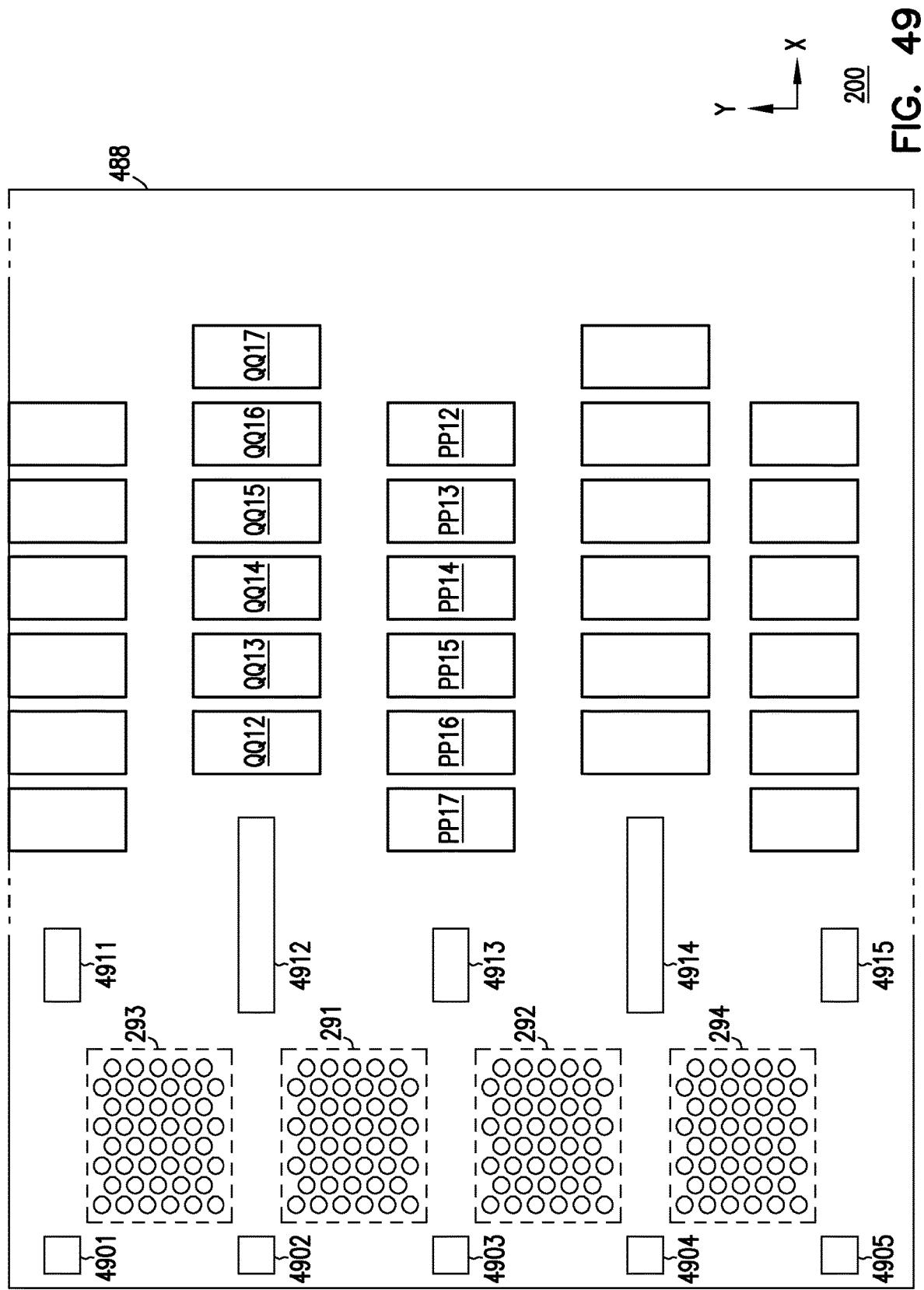

FIG. 49 shows a top view of memory device 200 of FIGS. 47 and 48 after formation of support structures (e.g., regions filled with dielectric material (e.g., silicon dioxide) 4901, 4902, 4903, 4904, and 4905, and isolation structures (e.g., regions filled with a dielectric material (e.g., silicon dioxide)) 4911, 4912, 4913, 4914, and 4915. Support structures 4901-4905 and isolation structures 4911-4915 are formed such that their structures also extend in the Z-direction through decks 311, 312, and 313. The processes associated with FIG. 49 can include removing localized materials (e.g., sacrificial materials) 2603 and 3903 at the locations of support structures 4901-4905 and isolation structures 4911-4915 and then fill those locations with a dielectric material (e.g., silicon dioxide). Isolation structures 4911-4915 can provide isolation between the materials (e.g., materials 1600-1605, 3606-3611, and 4612-4617) at portion (e.g., memory array area) 401 and the materials (e.g., materials 1600-1605, 3606-3611, and 4612-4617) at portion (e.g., peripheral portion) 402 during processes (e.g., FIG. 59) of removing (e.g., exhuming) materials 1600-1605, 3606-3611, and 4612-4617 at portion 401.

Figure 50:
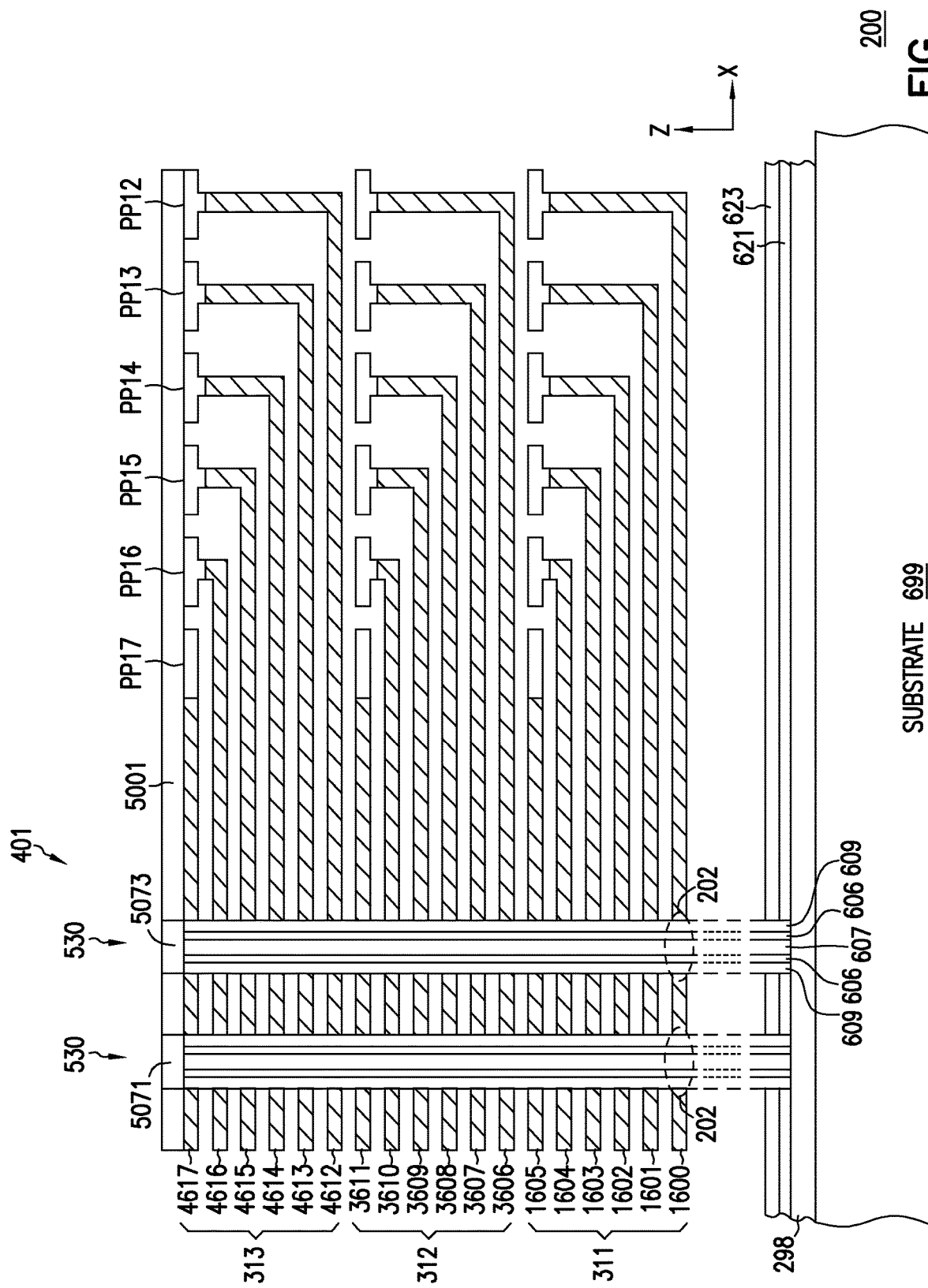

FIG. 50 shows memory device 200 of FIG. 49 after pillars 530 are formed. Forming pillars 530 can include removing (e.g., by etching) materials 4612-4617 and materials 4661 (not labeled in FIG. 49, but labeled in FIG. 46) to form voids (e.g., holes or openings) at the portion of pillars 530 in deck 313, and removing (e.g., exhuming) materials (e.g., sacrificial materials) 2603 and 3903 (FIG. 39B). Then, additional processes can be performed to form structures 606, 607, and 609 that can form part of memory cells 202. Although structure (e.g., a conductive channel) 606 can provide electrical connection between a respective pillar 530 and source 298, an additional conductive structure (e.g., source contact, not shown) may be formed between (and contacting) structure 606 and source 298. The conductive structure can be formed before structure 606 of a respective pillar 530 is formed. The processes associated with FIG. 50 can form material (e.g., silicon dioxide) 5001 and pillar contacts (e.g., drain contacts) 5071 and 5073 at respective pillars 530. In subsequent processes, conductive paths (not shown) can be formed to provide electrical connections from pillar contacts 5071 and 5073 to respective data lines (e.g., data lines $270_1$ and $270_3$, respectively, in FIG. 5).

As mentioned above, at least one drain select transistor (e.g., drain select transistor $261_0$ in FIG. 2) may be formed (e.g., in portion 682 in FIG. 6A). For simplicity, the processes associated with FIG. 50 omit the formation of such a drain select transistor (e.g., which can be formed over material 4617) in order not to obscure the embodiments described herein.

Figure 51:
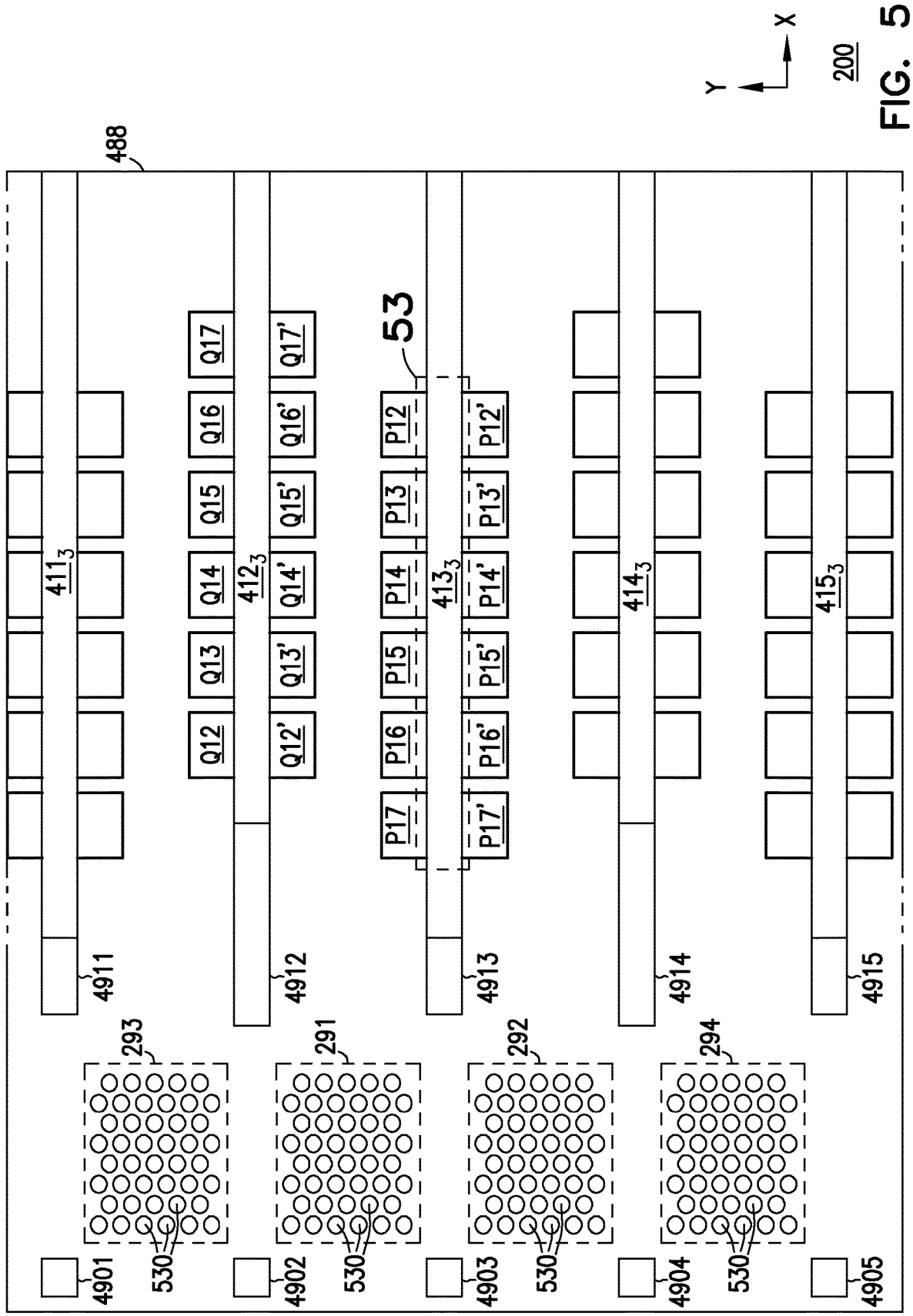

FIG. 51 shows a top view of memory device 200 after formation of slits $411_3$, $412_3$, $413_3$, $414_3$, and $415_3$, and conductive pads P12, P13, P14, P15, P16, and P17 (P12-P17), P12', P13', P14', P15', P16', and P17' (P12'-P17'), Q12, Q13, Q14, Q15, Q16, and Q17 (Q12-Q17), Q12', Q13', Q14', Q15', Q16', and Q17' (Q12'-Q17'). Slits $411_3$, $412_3$, $413_3$, $414_3$, and $415_3$ can be aligned over (e.g., formed directly over) slits $411_2$, $412_2$, $413_2$, $414_2$, and $415_2$ (FIG. 26A), respectively, and aligned over slits $411_1$, $412_1$, $413_1$, $414_1$, and $415_1$ (FIG. 39A), respectively. Thus, the location of slits $411_3$, $412_3$, $413_3$, $414_3$, and $415_3$ in FIG. 51 can also be part of the locations of dielectric structures 411, 412, 413, 414, and 415, respectively, shown in FIG. 4 and FIG. 11.

Slits $411_3$, $412_3$, $413_3$, $414_3$, and $4153$ can be formed using an etch process to remove the materials (e.g., a portion of materials 4612-4617 and 4661) at the locations of slits $411_3$, $412_3$, $413_3$, $414_3$, and $415_3$.

In FIG. 51, conductive pads P12-P17 and P12'-P17' can be formed from pad structures PP12-PP17 (FIG. 49) when slit $413_3$ is formed in the processes associated with FIG. 51. For example, as shown in FIG. 51, forming slit $413_3$ can remove (e.g., cut) a portion (e.g., the middle) of each of pad structures PP12-PP17 (FIG. 49) at the location of slit $413_3$. A remaining portion of pad structures PP12-PP17 on one side of slit $413_3$ can form conductive pads P12-P17. Another remaining portion of pad structures PP12-PP17 on the other side of slit $413_3$ can form conductive pads P12'-P17'.

Similarly, conductive pads Q12-Q17 and Q12'-Q17' can be formed from pad structures QQ12-QQ17 (FIG. 49) when slit $412_3$ is formed is formed in the processes associated with FIG. 51. For example, as shown in FIG. 51, forming slit $412_3$ can remove (e.g., cut) a portion (e.g., the middle) of each of pad structures QQ12-QQ17 (FIG. 49) at the location of slit $412_3$. A remaining portion of pad structures QQ12-QQ17 on one side of slit $412_3$ can form conductive pad Q12-Q17. Another remaining portion of pad structures QQ12-QQ17 on the other side of slit $412_3$ can form conductive pad Q12'-Q17'. A portion 53 in FIG. 51 is shown in more detail in FIG. 53.

Figure 52:
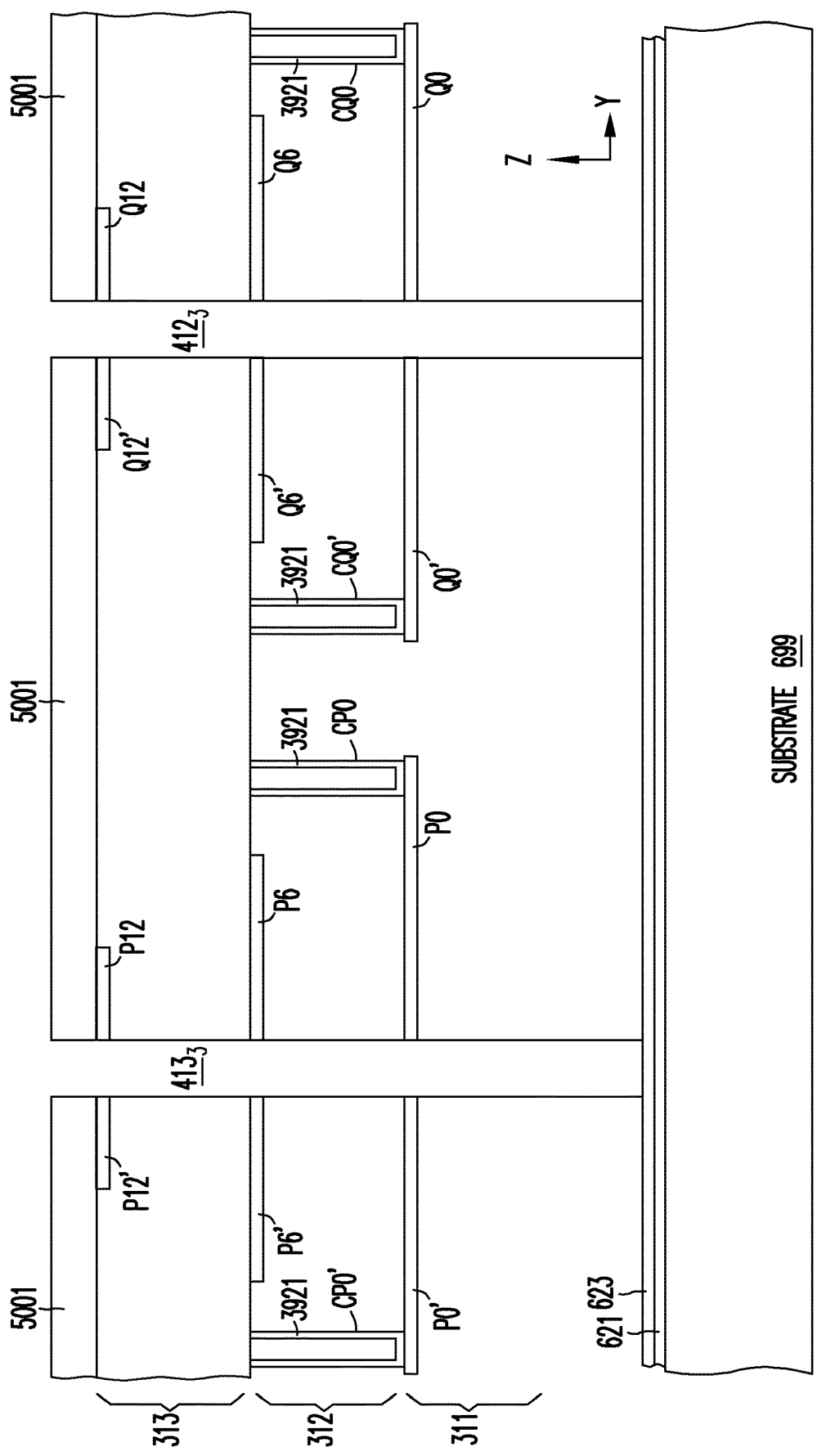

FIG. 52 shows another view of memory device 200 of FIG. 51 including slits $412_3$ and $413_3$. The processes associated with FIG. 51 can include removing (e.g., exhuming) materials (e.g., sacrificial materials) 2603 and 3903 (FIG. 40). Thus, as shown in FIG. 52, slits $412_3$ and $413_3$ can be unfilled with a material. Although not shown in FIG. 52, the processes associated with FIG. 51 can include removing (e.g., exhuming) materials (e.g., sacrificial materials) 2603 and 3903 (FIG. 40) at other slits (e.g., slits 411₃, 414₃, and 415₃, not shown in FIG. 52).

FIG. 53 shows a portion 53 of FIG. 51 including slit 413₃. In FIG. 53, the same materials are illustrated by the same hatch pattern. For simplicity, only some of the materials in FIG. 53 are labeled. Materials (e.g., silicon nitride) 4612-4617 and materials (e.g., silicon dioxide) 4661 are the same materials that were formed over spacer structure S3 in the processes associated with FIG. 42. Conductive pads P12-P17 and P12'-P17' (which are located over materials 4612-4617 and 4661) are not shown in FIG. 53.

FIG. 54 shows memory device 200 after removing (e.g., etching) of portions of materials 4661 (e.g., silicon dioxide) at locations 5401. The processes associated with FIG. 54 can include etching (in the Z-direction) portions of materials 4661 at deck 312 (below deck 313) and portion of material 4661 at deck 311 (below deck 312).

Although not shown in FIG. 54, the processes associated with FIG. 54 can also including removing (e.g., etching) portions of materials (e.g., silicon dioxide) 3661 and 1661 (at decks 312 and 311, respectively) at slit 413₃ at locations similar to locations 5401 (in the Z-direction). The same processes associated FIG. 54 can also be performed (performed currently) at other slits (e.g., 411₃, 414₃, and 415₃ in FIG. 51) to remove portions of materials 4661, 3661, and 1661 at respective locations (similar to locations 5401) at the other slits.

Figure 55B:
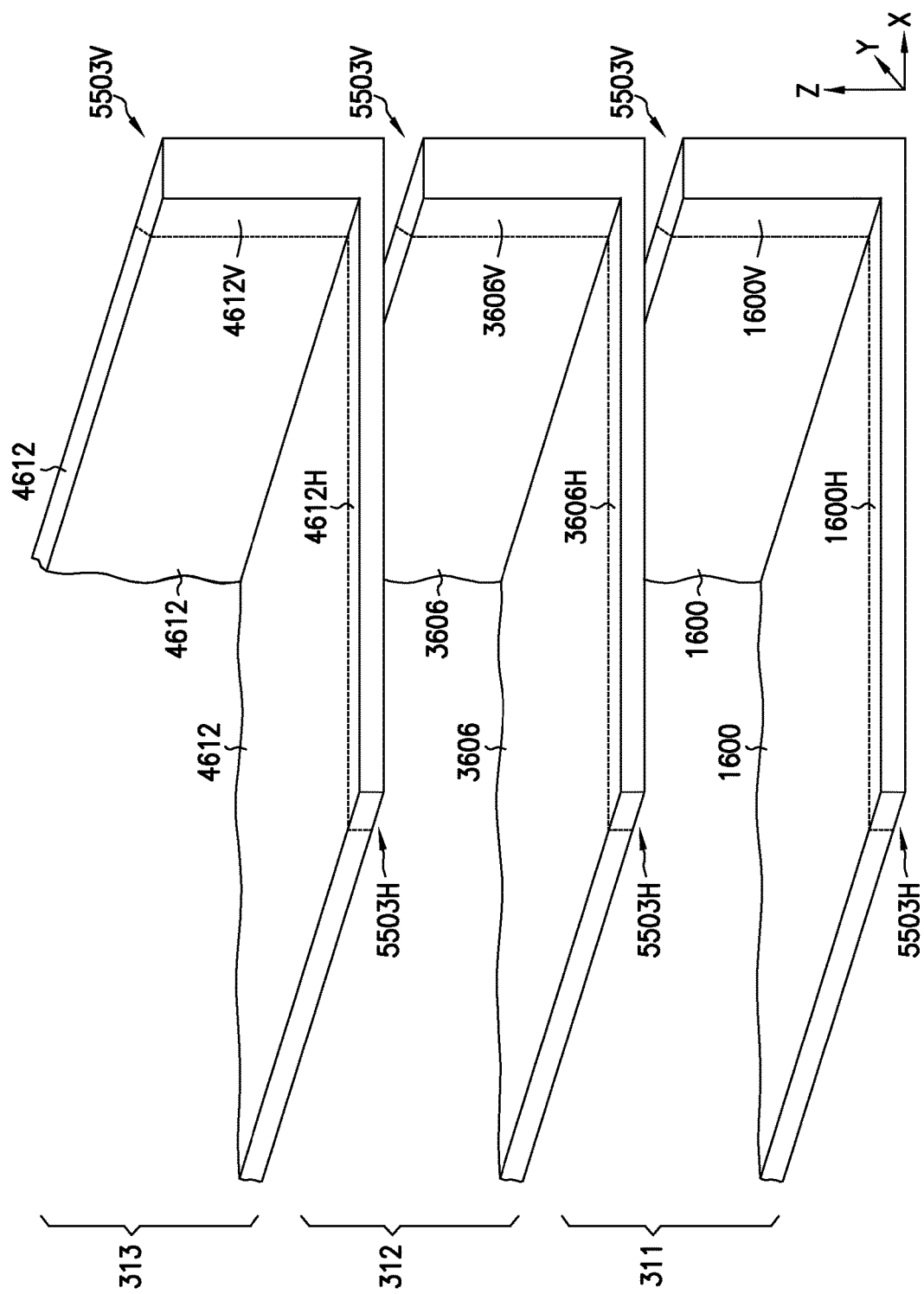

FIG. 55A shows memory device 200 after portions of materials 4612-4617 (e.g., silicon nitride) are removed (e.g., etched) at locations 5503V. FIG. 55B shows materials 1600, 3606, and 4612 in deck 311, 312, and 313, respectively, before the portions at locations 5503V and 5503H are removed in the processes associated with FIG. 55A. For simplicity, FIG. 55B does not show materials 1601-1605, 3607-3611, and 4613-4017 of decks 311, 312, and 313, respectively. However, materials 1601-1605, 3607-3611, and 4613-4017 (not shown in FIG. 55B) also have portions at locations similar to locations 5503V and 5503H that are also removed in the processes associated with FIG. 55A.

In FIG. 55B, portions 4612V and 4612H are parts (e.g., relatively small parts) of vertical and horizontal portions, respectively, of material 4612. Portions 3606V and 3606H are parts (e.g., relatively small parts) of vertical and horizontal portions, respectively, of material 3606. Portions 4612V and 4612H are parts (e.g., relatively small parts) of vertical and horizontal portions, respectively, of material 1600. Portions 4612V, 4612H, 3606V, 3606H, 1600V, and 1600H (which have sidewall portions exposed to slit 411₃ in FIG. 55A) can be removed (e.g., by a selective etch process) in the processes associated with FIG. 55A. Other materials among materials 1600-1605, 3606-3611, and 4612-4617 (not shown in FIG. 55B) also have vertical and horizontal portions (similar to portions 4612V, 4612H, 3606V, 3606H, 1600V, and 1600H) and are also removed in the in the processes associated with FIG. 55A.

The processes associated with FIG. 55A can include selectively removing (e.g., using a wet etch) vertical portions (e.g., portion 4612V) of materials 4612-4617 that are exposed to slit 411₃ to form recesses (e.g., empty spaces) at locations 5503V. The recesses at locations 5503V (recesses having lengths in the Z-direction) can be formed, such that mechanical stability of materials 4661 adjacent locations 5503V can be maintained (e.g., to avoid materials 4661 adjacent locations 5503V from collapsing). Further, the recesses at locations 5503V can be formed to have enough room (space) for a conductive material (e.g., conductive material 6185 in FIG. 61) to be filled in a subsequent process (e.g., in the processes associated with FIG. 61). Such a conductive material (e.g., conductive material 6185 in FIG. 61) can form vertical conductive rails (conductive rails V12-V16 and other conductive rails of FIG. 6A).

The processes associated with FIG. 55A can also including selectively removing part of vertical portions (e.g., portion 3606V in FIG. 55B) of materials 3606-3611 of deck 312 that are exposed to slit 411₃ to form recesses at respective locations 5503V in deck 312. Similarly, the processes associated with FIG. 55A can also including selectively removing part of vertical portions (e.g., portion 1600V in FIG. 55B) of materials 1600-1605 of deck 311 that are exposed to slit 411₃ to form recesses at respective locations 5503V in deck 311. The recesses at locations 5503V at decks 311 and 312 can also be filled with a material (e.g., conductive material 6185 in FIG. 61) to form vertical conductive rails (conductive rails V0-V4 and V6-V11) in decks 311 and 312.

The same processes associated FIG. 55A can also be performed (performed currently) at other slits (e.g., 411₃, 414₃, and 415₃ in FIG. 51) to remove parts of vertical portions of materials 4612-4617, 3606-3611, and 1600-1605 that are exposed to the other slits to form to form recesses at respective locations (similar to locations 5503V) at the other slits.

The processes associated with FIG. 55A can also remove parts of horizontal portions (e.g., portions 4612H, 3606H, and 1600H) of materials 4612-4617, 3606-3611, and 1600-1605 that are exposed at slits 411₃ (and at the other slits 412₃, 412₃, 414₃, and 415₃ in FIG. 51) to form recesses (e.g., empty spaces) at locations 5503H (FIG. 55B). The recesses formed at locations 5503H can also be filled with a material (e.g., conductive material 6185 in FIG. 61) to form horizontal conductive rails (e.g., conductive rails H0, H6, H10 and other conductive rails shown in FIG. 6A and FIG. 6B) in decks 311, 312, and 313.

The other portions (the horizontal and vertical portions adjacent the respective vertical and horizontal portions at locations 5403V and 5404H in FIG. 55B) of materials 1600-1605, 3606-3611, and 4612-4617 are not removed in the processes associated with FIG. 55A and can remain in the completed structure of memory device 200. For simplicity, the remaining portions of materials 1600-1605, 3606-3611, and 4612-4617 (after the processes associated with FIG. 55A) are not shown in other figures of the completed memory device 200. For example, the remaining portions of materials 1600-1605, 3606-3611, and 4612-4617 (after the processes associated with FIG. 55A) are not shown in FIG. 6A and FIG. 6B of the completed memory device 200.

As shown in FIG. 55A, angle B can indicate angle between the walls of two adjacent portions of spacer structure S3. Angle B in FIG. 55A can be the same as angle B of spacer structure S3 (in the completed structure of memory device 200) shown in FIG. 4 and spacer structure S3 (during the processes of forming the structure of memory device 200).

FIG. 56 shows memory device 200 after a material (e.g., polysilicon) 5675 is formed. As shown in FIG. 56 material 5675 can fill slit 413₃ including locations 5503V (FIG. 53A and FIG. 55B) and locations 5503H (FIG. 55B). Material 5675 can form a protecting structure (e.g., barrier) that can protect the remaining portions (shown in FIG. 55A) of materials 1600-1605, 3606-3611, and 4612-4617) at portion 402 from being removed (e.g., exhumed) when materials 1600-1605, 3606-3611, and 4612-4617 at portion 401 is removed (e.g., removed in the processes associated with FIG. 59).

FIG. 57 shows memory device 200 after a material (e.g., silicon nitride) 5703 is formed in slit 413₃. In alternative processes of forming memory device 200, the process of forming material 5703 can be skipped (not performed).

FIG. 58 shows a top view of memory device 200 after the processes associated with FIG. 56 are performed. For simplicity, the remaining portion of materials 4612-4617 (shown in FIG. 56) is omitted from FIG. 58.

FIG. 59 shows portion 401 of memory device 200 after materials (e.g., silicon nitride) 1600-1605, 3606-3611, and 4612-4617 in portion 401 are removed (e.g., exhumed) from locations 5900 through 5917 (5900-5917).

Figure 60:
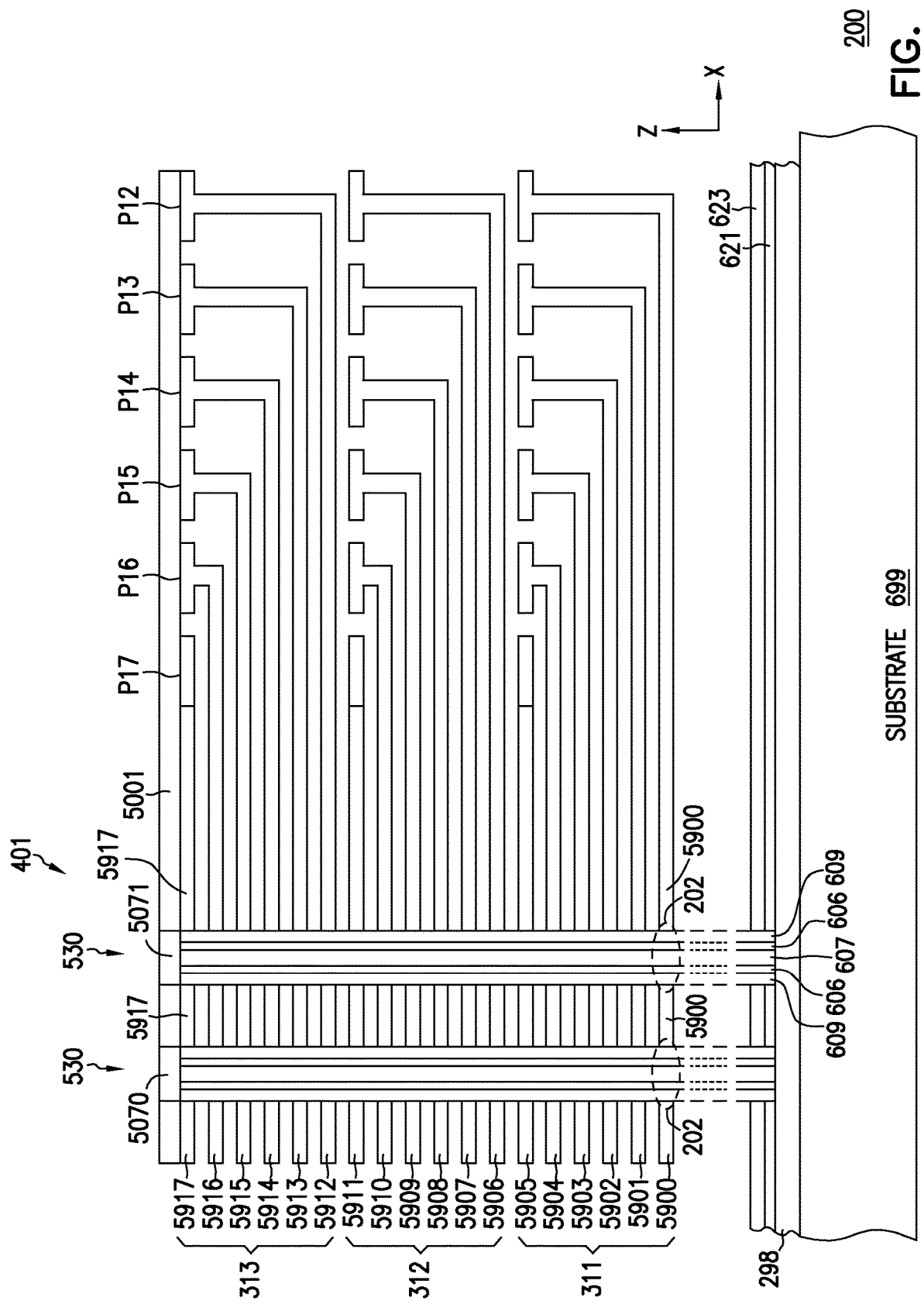

FIG. 60 shows memory device 200 after material (e.g., polysilicon) 5675 and materials (e.g., polysilicon) from conductive pads P0-P17 is removed.

Figure 61:
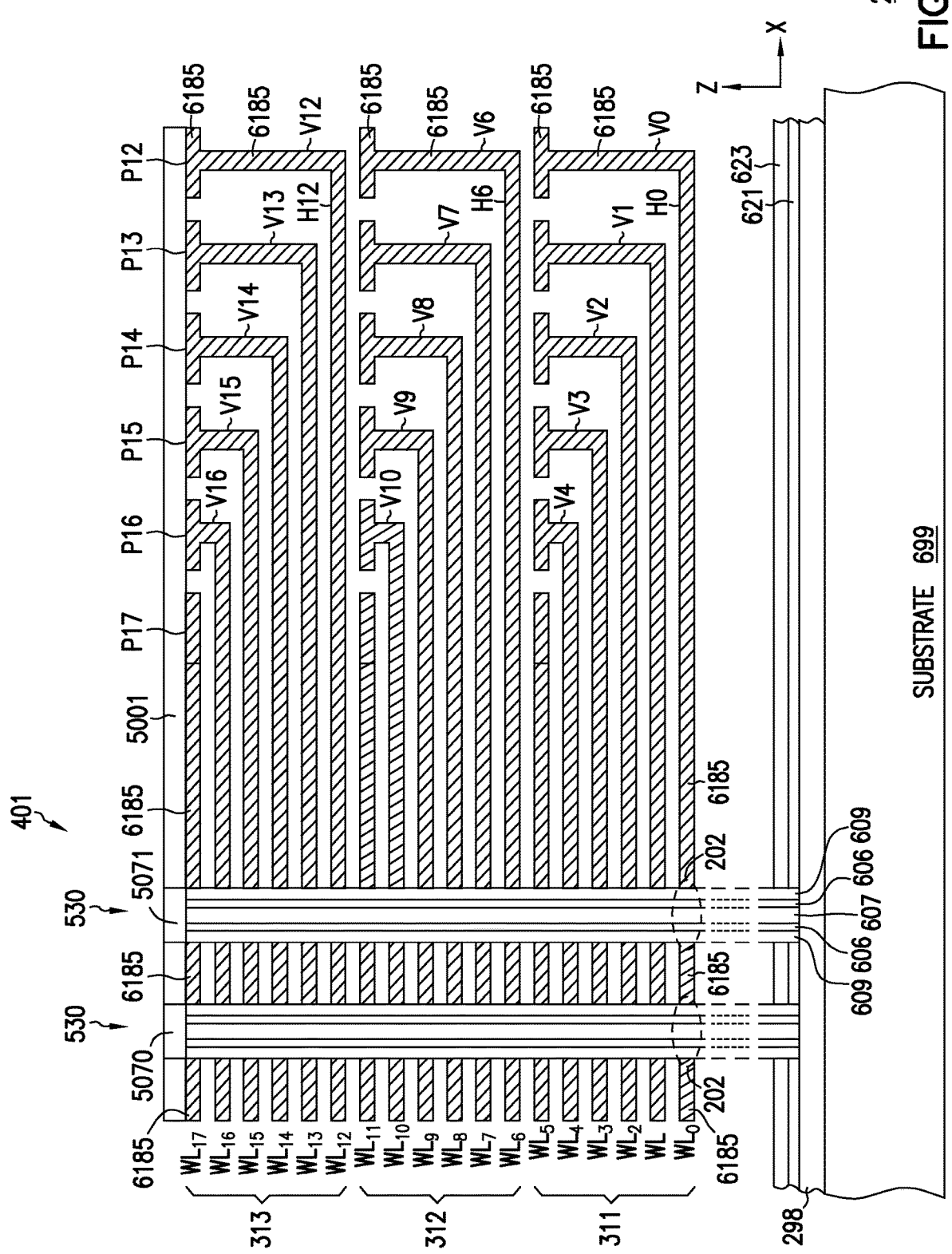

FIG. 61 shows memory device 200 after a conductive material (or materials) 6185 is formed. Conductive material 6185 can include a single material or multiple materials. For example, conductive material 6185 can include tungsten. In another example, material 6185 can include multiple layers of aluminum oxide, titanium nitride, and tungsten. In this example, aluminum oxide, titanium nitride, and tungsten can be formed (e.g., deposited) one at a time. For example, processes associated with FIG. 61 can include depositing aluminum oxide, depositing titanium nitride conformal to aluminum oxide, and then depositing tungsten (or other suitable conductive material) conformal to titanium nitride.

As shown in FIG. 61 control gates 250₀-250₁₇ (associated with signals WL₀-WL₁₇), the horizontal conductive rails (e.g., conductive rails H0, H6, and H12 and other conductive rails (not labeled)), the vertical conductive rails (e.g., conductive rails V0-V4, V6-V10, and V12-V16), and the conductive pads (e.g., conductive pads P12-P17 and other conductive pads (not labeled)) can have the same material 6185 (e.g., tungsten) or same materials (e.g., aluminum oxide, titanium nitride, and tungsten).

Figure 62:
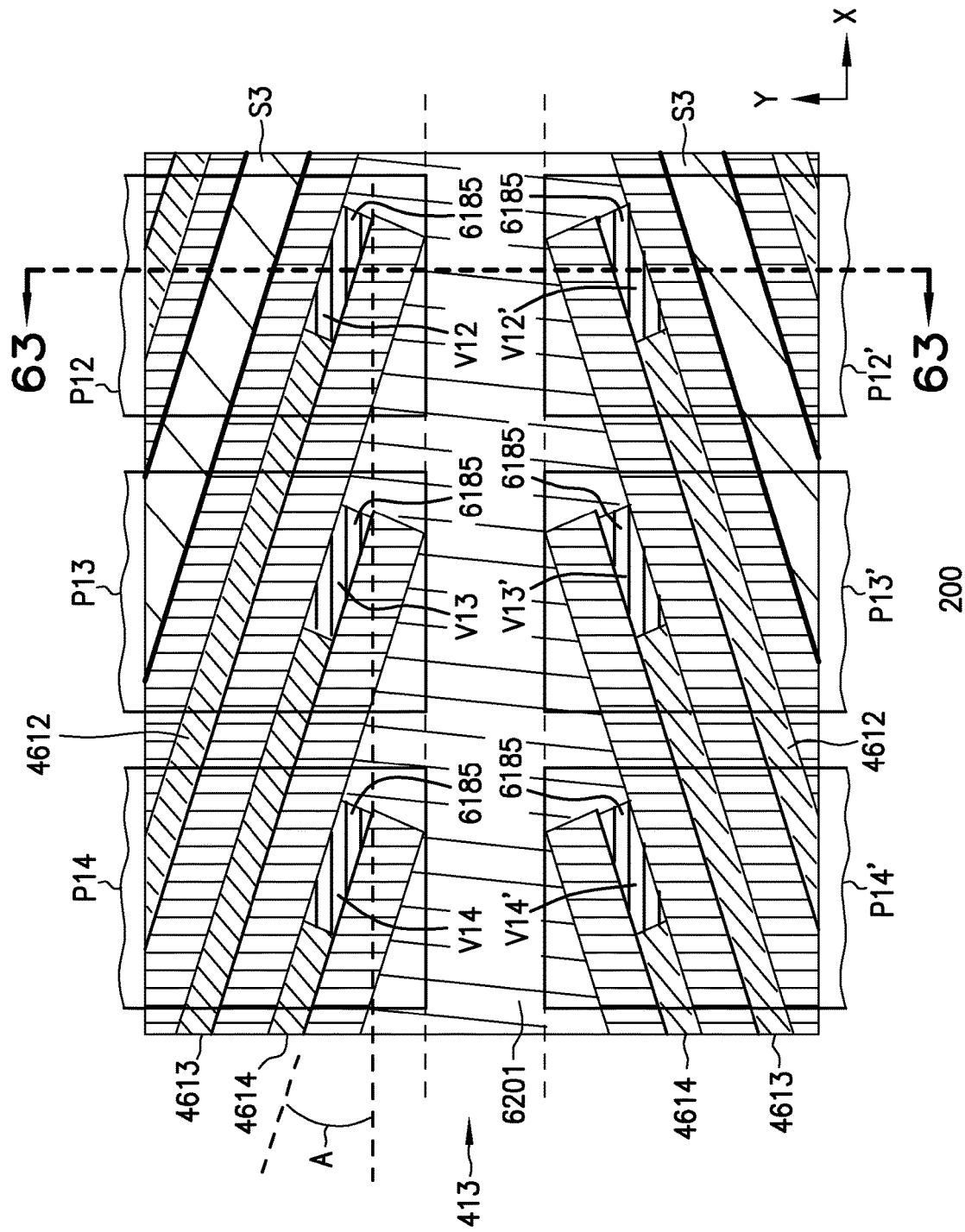
Figure 63:
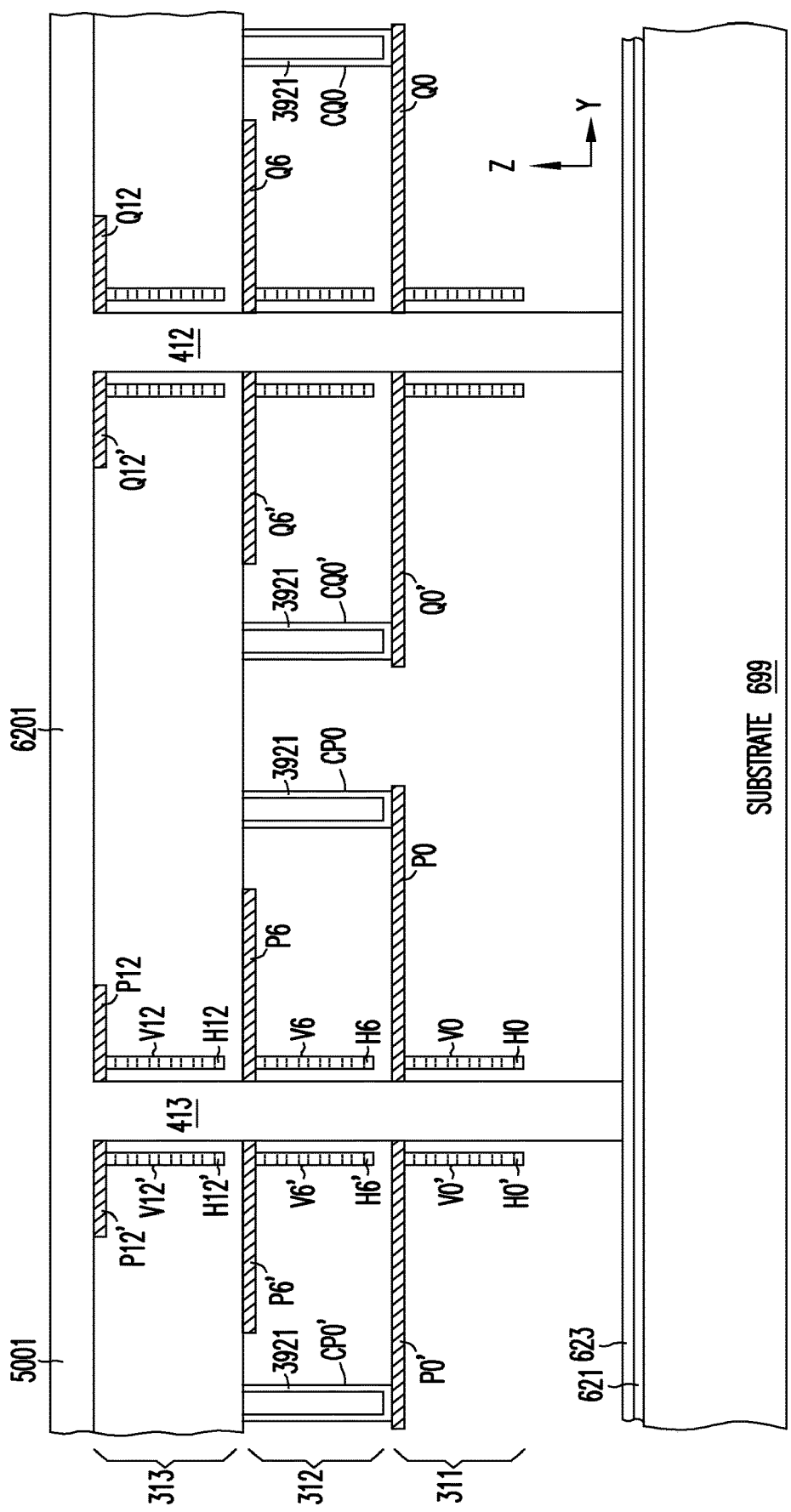

FIG. 62 shows a top view of memory device 200 of FIG. 61 including portions of material 6185 at some of the vertical conductive rails (e.g., conductive rails V12, V13, V14 (also shown in FIG. 61), V12', V13', and V14' (not shown in FIG. 61)). The locations of portions of material 6185 shown in FIG. 62 are the same as respective locations 5503V in FIG. 55A. In FIG. 62, the remaining portions of materials 4612, 4613, and 4614 are the same as the remaining portions of materials 4612, 4613, and 4614 in the processes associated with FIG. 55A. In FIG. 62, line 63-63 shows a location (e.g., cross-section) of a portion of memory device 200 that is shown in FIG. 63.

FIG. 62 also shows memory device 200 dielectric structure 413 is formed. Forming dielectric structure 413 can include filling slit 413₃ with a material 6201. Material 6201 can be formed after material 6185 is formed in the processes associated with FIG. 61. Material 6201 in dielectric structure 413 can include a dielectric material (e.g., silicon dioxide).

FIG. 62 also shows some of the conductive pads (e.g., conductive pads P12, P13, P14, P12', P13', and P14') located over and contacting respective vertical conductive rails (e.g., conductive rails V12, V13, V14, V12', V13', and V14'). Angle A in FIG. 62 can be the same as angle A described above with reference to FIG. 6D and FIG. 12. Although not shown in FIG. 62, other vertical conductive rails (among vertical conductive rails V0-V5, V6-V10, and V12-V16) and conductive pads of memory device 200 can have similar structure as the structure and materials shown in FIG. 62.

As shown in FIG. 62, conductive rails V12, V13, and V14 are adjacent materials 4612, 4613, and 4614, respectively. Materials 4612, 4613, and 4614 remain in the completed memory device 200. However, for simplicity, materials 4612, 4613, and 4614 are not shown in other figures (e.g., FIG. 6A and FIG. 6B) that show the structure of the completed memory device 200. Similarly, other materials among materials 1600-1605, 3606-3611, and 4612-4617 that are adjacent respective vertical conductive rails (e.g., among conductive rails V0-V4, V6-V10, and V12-16) are also not shown in other figures (e.g., FIG. 6A and FIG. 6B) of memory device 200.

FIG. 63 shows a portion of memory device 200 of FIG. 61 and FIG. 62 including dielectric structures 412 and 413. The portion on the left side (which includes dielectric structure 413) of memory device 200 FIG. 63 is also shown in FIG. 62. As shown in FIG. 63 material 6201 (formed in the processes associated with FIG. 62) fill dielectric structures 412 and 413.

Figure 64:
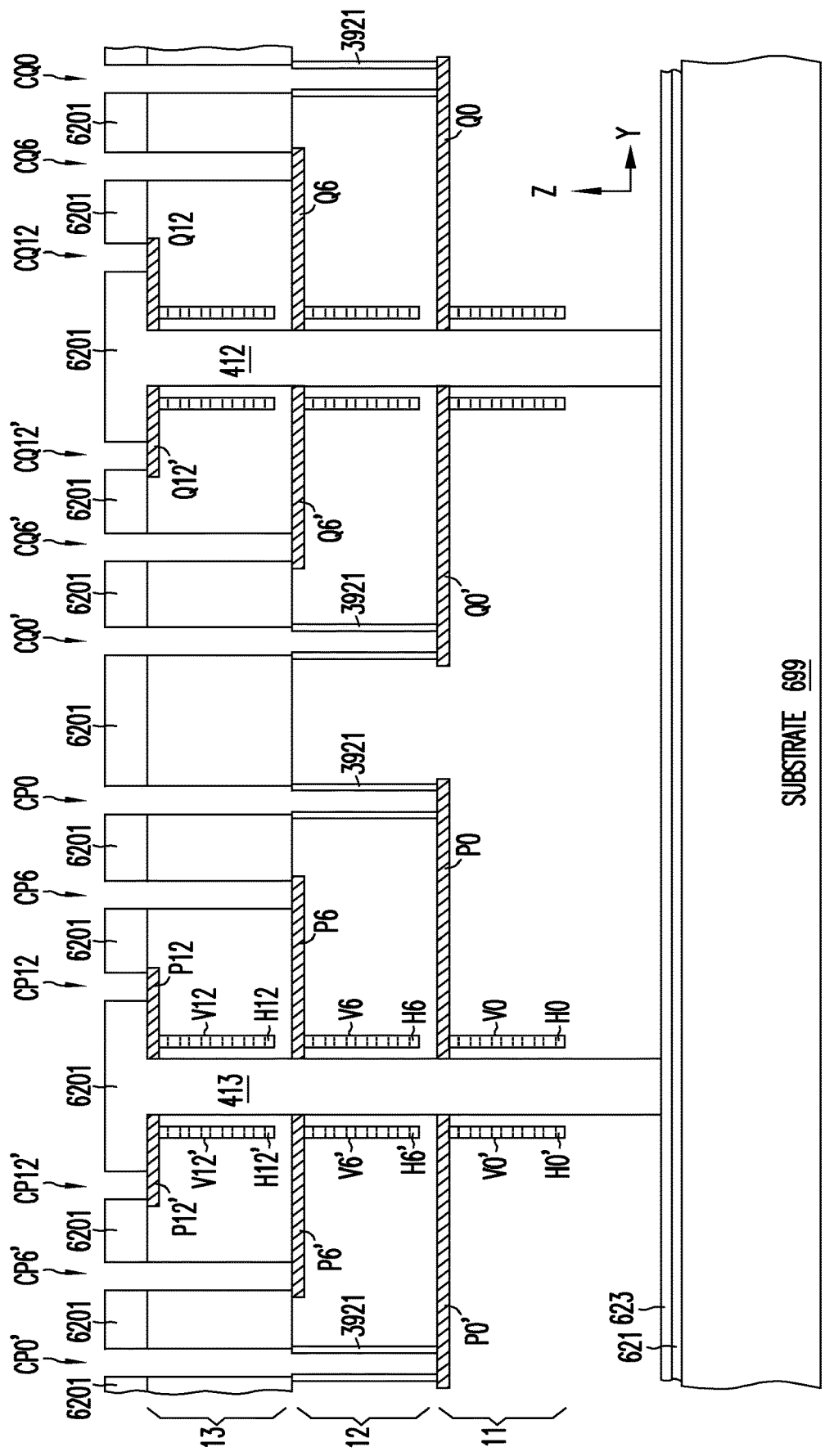

FIG. 64 shows memory device 200 after formation of contact structures (e.g., openings) CP0', CP6', CP12', CP12, CP6, CP0, CQ0', CQ6', CQ12', CQ12, CQ6, and CQ0. Forming these contact structures can include removing the materials at the locations of contact structures CP0', CP6', CP12', CP12, CP6, CP0, CQ0', CQ6', CQ12', CQ12, CQ6, and CQ0 to expose portions of conductive pads P0', P6', P12', P12, P6, P0, Q0', Q6', Q12', Q12, Q6, and Q0 at the locations of these contact structures. As shown in FIG. 64, removing the materials at contact structures CP0', CP6', CP12', CP12, CP6, CP0, CQ0', CQ6', CQ12', CQ12, CQ6, and CQ0 can also include removing (e.g., by punching through) portions (e.g., bottom portions) of liners 3921 to expose portions of conductive pads P0, P0', Q0, and Q0'.

FIG. 65 shows memory device 200 after conductive contacts C0', C6', C12', C12, C6, C0, C0*', C6*', C12*', C12*, C6*, and C0* are formed. A conductive material (e.g., metal) can fill contact structures CP0', CP6', CP12', CP12, CP6, CP0, CQ0', CQ6', CQ12', CQ12, CQ6, and CQ0 (FIG. 64) to form contacts C0', C6', C12', C12, C6, C0, C0*', C6*', C12*', C12*, C6*, and C0*, respectively. Other conductive contacts (e.g., C1-05, C7-C11, can C13-C17 in FIG. 6A) can also be formed in the processes associated with FIG. 65.

The process of forming memory device 200 can include additional processes after the processes associated with FIG. 65 are performed. For example, additional processes can include forming data lines (e.g., data lines 270₀-270₇ in FIG. 5) and other elements and interconnections to complete the processes of forming memory device 200.

The processes in the techniques described herein show an example of forming memory device 200 having three decks 311, 312, and 313 and six control gates in each deck. However, the processes in the techniques described herein can be scalable, such that number of decks in memory device 200 may be more than three and the number of control gates in each deck may be more than six. Thus, the memory device described herein can have a relatively high number of decks and control gates for a given device area. The large number of decks and the number of control gates in each deck can lead to relatively higher memory cell density for a given device area in the described memory device in comparison with some conventional memory devices.

FIG. 66 shows an apparatus in the form of a system (e.g., electronic system) 6600, according to some embodiments described herein. Part of system 6600 or the entire system 6600 can include, or be included in, a system-on-chip, a system on package, a solid state drive (SSD), a cellphone, a tablet, a computer, an electronic module in an automobile, or other types of electronic systems. As shown in FIG. 66, system 6600 can include a processor 6610, a memory device 6620, a memory controller 6630, a graphics controller 6640, an I/O controller 6650, a display 6652, a keyboard 6654, a pointing device 6656, at least one antenna 6658, a connector 6615, and a bus 6660 (e.g., conductive lines formed on a circuit board (not shown) of system 6600).

In some arrangements, system 6600 does not have to include a display. Thus, display 6652 can be omitted from system 6600. In some arrangements, system 6600 does not have to include any antenna. Thus, antenna 6658 can be omitted from system 6600.

Each of processor 6610, memory device 6620, memory controller 6630, graphics controller 6640, and I/O controller 6650 can include a die and can be part of an IC package.

Processor 6610 can include a general-purpose processor or an application-specific integrated circuit (ASIC). Processor 6610 can include a central processing unit (CPU).

Memory device 6620 can include a dynamic random-access memory (DRAM) device, a static random-access memory (SRAM) device, a flash memory device (e.g., NAND flash memory device), phase change memory, a combination of these memory devices, or other types of memory.

In an example, memory device 6620 can include memory device 100 or 200 described above with reference to FIG. 1 through FIG. 65. Thus, memory device 6620 can include the structure of the memory devices (e.g., memory device 100 or 200) and the processes of forming memory device 6620 can include the processes described above (e.g., the processes associated with FIG. 12 through FIG. 65).

Display 6652 can include a liquid crystal display (LCD), a touchscreen (e.g., capacitive or resistive touchscreen), or another type of display. Pointing device 6656 can include a mouse, a stylus, or another type of pointing device.

I/O controller 6650 can include a communication module for wired or wireless communication (e.g., communication through one or more antennas 6658). Such wireless communication may include communication in accordance with WiFi communication technique, Long Term Evolution Advanced (LTE-A) communication technique, or other communication techniques.

I/O controller 6650 can also include a module to allow system 6600 to communicate with other devices or systems in accordance with one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 6615 can be arranged (e.g., can include terminals, such as pins) to allow system 6600 to be coupled to an external device (or system). This may allow system 6600 to communicate (e.g., exchange information) with such a device (or system) through connector 6615. Connector 6615 may be coupled to I/O controller 6650 through a connection 6616 (e.g., a bus).

Connector 6615, connection 6616, and at least a portion of bus 6660 can include elements (e.g., conductive terminals, conductive lines, or other conductive elements) that conform with at least one of USB, DP, HDMI, Thunderbolt, PCIe, Ethernet, and other specifications.

FIG. 66 shows the elements (e.g., devices and controllers) of system 6600 arranged separately from each other as an example. In some arrangements, two or more elements of system 6600 can be located on the same IC package, same subsystem, or same device. For example, memory device 6620 and memory controller 6630 can be included in the same SSD or same memory sub-system of system 6600.

The illustrations of apparatuses (e.g., memory devices 100 and 200, and system 6600) and methods (e.g., method of forming memory device 200) are intended to provide a general understanding of the structure of various embodiments and are not intended to provide a complete description of all the elements and features of apparatuses that might make use of the structures described herein. An apparatus herein refers to, for example, either a device (e.g., memory device 100 or 200) or a system (e.g., system 6600).

Any of the components described above with reference to FIG. 1 through FIG. 66 can be implemented in a number of ways, including simulation via software. Thus, apparatuses (e.g., memory devices 100 and 200, and system 6600) or part of each of the memory devices and system described above, may all be characterized as "modules" (or "module") herein. Such modules may include hardware circuitry, single- and/ or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100 and 200) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 66 include apparatuses and methods of operating the apparatuses. One of the apparatuses includes a first deck located over a substrate, and a second deck located over the first deck, and pillars extending through the first and second decks. The first deck includes first memory cells, first control gates associated with the first memory cells, and first conductive paths coupled to the first control gates. The first conductive paths include first conductive pads located on a first level of the apparatus over the substrate. The second deck includes second memory cells, second control gates associated with the second memory cells, and second conductive paths coupled to the second control gates. The second conductive paths include second conductive pads located on a second level of the apparatus over the first level. The first and second conductive pads having lengths in a direction perpendicular to a direction from the first deck to the second deck. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
   forming first dielectric materials at first locations and second dielectric materials at second locations and interleaved with the first dielectric materials over a substrate, the first dielectric materials formed to include first portions and first additional portions perpendicular to the first portions;
   forming third dielectric materials at third locations and fourth dielectric materials at fourth locations and interleaved with the third dielectric materials, the third and fourth dielectric materials formed over the first and second dielectric materials, the third dielectric materials formed to include third portions and third additional portions perpendicular to the third portions;
   forming pillars through a part of the first portions of the first dielectric materials, a part of the second dielectric materials, a part of the third portions of the third dielectric materials, and a part of the fourth dielectric materials;
   forming first memory cells at respective first portions along lengths of the pillars, and second memory cells at respective second portions along the lengths of the pillars;
   removing the first portions and the first additional portions of the first dielectric materials at the first locations to form voids at the first locations;
   removing the third portions and the third additional portions of the third dielectric materials at the third locations to form voids at the third locations;
   forming a fourth material in the voids at the first locations and the voids at the third locations, wherein:
      a first portion of the fourth material at a first portion of the first locations forms first control gates associated with the first memory cells;
      a second portion of the fourth material at a second portion of the first locations forms first conductive paths coupled to the first control gates;
      a third portion of the fourth material at a first portion of the third locations forms second control gates associated with the second memory cells;
      a fourth portion of the fourth material at a second portion of the third locations forms second conductive paths coupled to the second control gates;
   forming first pad structures at first additional locations before the third and fourth dielectric materials are formed, wherein each of the pad structures contacts a respective portion of the first additional portions of the first dielectric materials;
   forming second pad structures at second additional locations after the third and fourth dielectric materials are formed, wherein each of the second pad structures contacts a separate portion of the third additional portions of the third dielectric materials;
   replacing a material of the first pad structures at the first additional locations and a material of the second pad structures at the second additional locations with a conductive material to form first conductive pads at the first additional locations and second conductive pads at the second additional locations; and
   forming first conductive contacts coupled to the first conductive pads, and second conductive contacts coupled to the second conductive pads, wherein:
      the first conductive contacts and the first conductive pads are parts of the first conductive paths; and
      the second conductive contacts and the second conductive pads are parts of the second conductive paths.

2. The method of claim 1, wherein the first and third dielectric materials include silicon nitride, and the second and fourth dielectric materials include silicon oxide.

3. The method of claim 2, wherein the fourth material includes metal.

4. The method of claim 1, wherein the conductive material is the same as the fourth material.

5. The method of claim 1, further comprising:
   forming fifth dielectric materials at fifth locations and sixth dielectric materials at sixth locations and interleaved with the fifth dielectric materials, the fifth dielectric materials formed to include fifth portions and fifth additional portions perpendicular to the fifth portions, wherein the pillars are also formed through a part of the fifth portions of the fifth dielectric materials and a part of the sixth dielectric materials;
   forming third memory cells at respective third portions along the lengths of the pillars;
   removing the fifth portions and fifth additional portions of the fifth dielectric materials at the fifth locations to form voids at the fifth locations, wherein:
      the fourth material is also formed in the voids at the fifth locations;
      a fifth portion of the fourth material at a first portion of the fifth locations forms third control gates associated with the third memory cells; and a sixth portion of the fourth material at a second portion of the fifth locations forms third conductive paths coupled to the third control gates.

6. A method comprising:
forming a first dielectric structure including walls extending outwardly from a substrate, the walls of the first dielectric structure having a zigzag pattern;
forming first dielectric materials and second dielectric materials interleaved with the first dielectric materials over the first dielectric structure, such that a first portion of the first and second dielectric materials is parallel to the substrate and a second portion the first and second dielectric materials is perpendicular to the first portion of the first and second dielectric materials and conformal to the walls of first dielectric structure;
removing a part of the second portion of the first and second dielectric materials over the first dielectric structure to expose a remaining part of the second portion of the first dielectric materials;
forming first pad structures, such that each of the first pad structure contacts a respective portion of the first dielectric materials in the remaining part of the second portion of the first dielectric materials;
forming an additional dielectric material over the first pad structures and over the first portion of the first and second dielectric materials;
forming a second dielectric structure over the additional dielectric material, the second dielectric structure including portions having walls extending outwardly from the substrate, the walls of the second dielectric structure having a zigzag pattern;
forming third dielectric materials and fourth dielectric materials interleaved with the third dielectric materials over the additional dielectric material, such that a first portion of the third and fourth dielectric materials is parallel to the substrate and a second portion of the third and fourth dielectric materials is perpendicular to the first portion of the third and fourth dielectric materials and conformal to the walls of second dielectric structure;
removing a part of the second portion of the third and fourth dielectric materials over the second dielectric structure to expose a remaining part of the second portion of the third dielectric materials;
forming second pad structures, such that each of the second pad structures contacts a respective portion of the third dielectric materials in the remaining part of the second portion of the third dielectric materials;
forming pillars through the first portion of the first and second dielectric materials and the first portion of the third and fourth dielectric materials;
forming first memory cells along respective first portions of the pillars and second memory cells along respective second portions of the pillars;
replacing the first portion of the first dielectric materials at first locations and the remaining part of the second portion of the first dielectric materials at second locations with a first portion of a conductive material to form first control gates at the first locations and first conductive paths at the second locations, wherein the first conductive paths are coupled to the first control gates, and the first control gates are adjacent respective memory cells of the first memory cells; and
replacing the first portion of the third dielectric materials at third locations and the remaining part of the second portion of the third dielectric materials at fourth locations with a second portion of the conductive material to form second control gates at the third locations and second conductive paths at the fourth locations, wherein the second conductive paths are coupled to the second control gates, and the second control gates are adjacent respective memory cells of the second memory cells.

7. The method of claim 6, further comprising:
replacing a material of the first pad structures with a third portion of the conductive material to form first conductive pads at locations of the first pad structures, wherein the first conductive pads are part of the first conductive paths; and
replacing a material of the second pad structures with a fourth portion of the conductive material to form second conductive pads at locations of the second pad structures, wherein the second conductive pads are part of the second conductive paths.

8. The method of claim 7, further comprising:
forming first conductive contacts coupled to the first conductive pads, wherein the first conductive contacts have lengths parallel to the lengths of the pillars and are part of the first conductive paths; and
forming second conductive contacts coupled to the second conductive pads, wherein the second conductive contacts have lengths parallel to the lengths of the pillars and are part of the second conductive paths.

9. A method comprising:
forming a first deck of a memory device, the first deck including first memory cells and first control gates associated with the first memory cells;
forming a second deck located over the first deck, the second deck including second memory cells and second control gates associated with the second memory cells;
forming pillars extending through the first control gates and the second control gates;
forming first conductive paths coupled to the first control gates, the first conductive paths including first conductive pads located on a first level of the memory device, each of the first conductive pads having a length in a direction perpendicular to a direction from the first deck to the second deck, wherein forming the first conductive paths comprises:
forming first conductive contacts coupled to the first conductive pads, each of the first conductive contacts having a first length in the direction from the first deck to the second deck; and
forming first conductive connections coupled to the first conductive contacts; and
forming second conductive paths coupled to the second control gates, the second conductive paths including second conductive pads located on a second level of the memory device over the first level, each of the second conductive pads having a length in the direction perpendicular to the direction from the first deck to the second deck, wherein forming the second conductive paths comprises:
forming second conductive contacts coupled to the second conductive pads, each of the second conductive contacts having a second length in the direction from the first deck to the second deck, wherein the first length is greater than the second length; and
forming second conductive connections coupled to the second conductive contacts, wherein the first and second conductive connections are located on a level over the second level of the memory device.

10. The method of claim 9, wherein the length of each of the first conductive pads is greater than the length of each of the second conductive pads.

11. The method of claim 9, wherein the first conductive pads have a same length.

12. The method of claim 9, wherein the second conductive pads have a same length.

13. The method of claim 9, further comprising:
- forming a third deck located over the second deck, the third deck including third memory cells and third control gates associated with the third memory cells; and
- forming third conductive paths coupled to the third control gates, the third conductive paths including third conductive pads located on a third level of the memory device over the second level, each of the third conductive pads having a length in the direction perpendicular to a direction from the second deck to the third deck.

14. The method of claim 13, wherein the length of each of the first conductive pads is greater than the length of each of the second conductive pads, and the length of each of the second conductive pads is greater than the length of each of the third conductive pads.

15. The method of claim 13, wherein:
- forming the first conductive paths includes forming first conductive contacts coupled to the first conductive pads, each of the first conductive contacts having a first length in the direction from the first deck to the second deck;
- forming the second conductive paths includes forming second conductive contacts coupled to the second conductive pads, each of the second conductive contacts having a second length in the direction from the first deck to the second deck, wherein the first length is greater than the second length; and
- forming the third conductive paths includes forming third conductive contacts coupled to the third conductive pads, each of the third conductive contacts having a third length in a direction from the first deck to the third deck, wherein the second length is greater than the third length.

16. The method of claim 9, wherein the first and second decks are formed over a substrate of the memory device, the substrate includes circuitry, and wherein:
- at least one conductive path of the first conductive paths is formed to couple to the circuitry; and
- at least one conductive path of the second conductive paths is formed to couple to the circuitry.

17. The method of claim 16, wherein the circuitry includes at least one transistor coupled to the at least one conductive path of the first conductive paths.

* * * * *